US012402442B2

United States Patent
Bae et al.

(10) Patent No.: US 12,402,442 B2
(45) Date of Patent: Aug. 26, 2025

(54) DISPLAY DEVICE AND METHOD OF MANUFACTURING DISPLAY DEVICE

(71) Applicant: Samsung Display Co., Ltd., Yongin-si (KR)

(72) Inventors: Sung Geun Bae, Yongin-si (KR); Jang Soon Park, Yongin-si (KR); Jeong Hyun Lee, Yongin-si (KR); Da Sol Jeong, Yongin-si (KR); Won Hyeong Heo, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 636 days.

(21) Appl. No.: 17/454,419

(22) Filed: Nov. 10, 2021

(65) Prior Publication Data

US 2022/0344540 A1 Oct. 27, 2022

(30) Foreign Application Priority Data

Apr. 22, 2021 (KR) .................. 10-2021-0052670

(51) Int. Cl.
*H10H 20/831* (2025.01)
*H01L 21/68* (2006.01)
(Continued)

(52) U.S. Cl.
CPC .......... *H10H 20/831* (2025.01); *H01L 21/68* (2013.01); *H01L 25/0753* (2013.01);
(Continued)

(58) Field of Classification Search
CPC ......... H01L 27/15; H01L 33/08; H01L 33/10; H01L 2224/95133; G09G 2300/0426
See application file for complete search history.

(56) References Cited

U.S. PATENT DOCUMENTS 8,803,172 B2    8/2014 Kim et al.
9,935,161 B2    4/2018 Kim et al.
(Continued)

FOREIGN PATENT DOCUMENTS

CN    107452775 A    12/2017
CN    111354858 A    6/2020
(Continued)

OTHER PUBLICATIONS

"Compare Aluminium vs Molybdenum| Compare Properties." Web. archive.org, Oct. 16, 2017, web.archive.org/web/20171016063639/ metals.comparenature.com/en/aluminium-vs-molybdenum/comparison-17-34-0. Accessed Mar. 15, 2024. (Year: 2017).*
(Continued)

*Primary Examiner* — Andres Munoz
*Assistant Examiner* — Mario Andres Autore, Jr.
(74) *Attorney, Agent, or Firm* — Womble Bond Dickinson (US) LLP

(57) ABSTRACT

A display device includes: a first light emitting element located between the first and second patterns; a first alignment electrode located on the first pattern, the first alignment electrode having a first inclined surface opposing the first light emitting element; a first connection electrode at a same layer as the first alignment electrode; and first and second electrodes electrically connected to respective end portions of the first light emitting element. Each of the first alignment electrode and the first connection electrode includes first and second electrode layers that are sequentially stacked. A contact hole exposing the first electrode layer of the first connection electrode is formed in the second electrode layer of the first connection electrode. The first electrode is in contact with the first electrode layer of the first connection electrode and a side surface of the second electrode layer of the first connection electrode through the contact hole.

20 Claims, 41 Drawing Sheets

(51) Int. Cl.
*H01L 25/075* (2006.01)
*H10H 20/01* (2025.01)
*H10H 20/832* (2025.01)

(52) U.S. Cl.
CPC .......... *H10H 20/01* (2025.01); *H10H 20/835* (2025.01); *H10H 20/032* (2025.01)

(56) References Cited

U.S. PATENT DOCUMENTS

| | | | |
|---|---|---|---|
| 11,398,619 B2 | 7/2022 | Youn et al. | |
| 11,749,783 B2 | 9/2023 | Basrur et al. | |
| 12,027,508 B2 | 7/2024 | Yoo et al. | |
| 2011/0254043 A1* | 10/2011 | Negishi | H10H 20/819 |
| | | | 438/22 |
| 2014/0239318 A1* | 8/2014 | Oyu | H10H 20/857 |
| | | | 257/98 |
| 2016/0013170 A1 | 1/2016 | Sakariya et al. | |
| 2018/0068986 A1* | 3/2018 | Yoo | H10H 20/857 |
| 2018/0090539 A1* | 3/2018 | Son | H10H 20/84 |
| 2018/0358339 A1* | 12/2018 | Iguchi | G09G 3/32 |
| 2020/0005703 A1* | 1/2020 | Kim | H10K 59/131 |
| 2020/0013766 A1* | 1/2020 | Kim | H01L 25/167 |
| 2020/0152835 A1* | 5/2020 | Ko | H01L 33/38 |
| 2020/0273397 A1* | 8/2020 | Jeong | H01L 33/62 |
| 2021/0111323 A1* | 4/2021 | Kim | H10K 59/122 |
| 2021/0242380 A1* | 8/2021 | Kim | H01L 33/44 |
| 2021/0296550 A1* | 9/2021 | Li | G09G 3/32 |
| 2021/0351171 A1* | 11/2021 | Yoo | H01L 33/44 |
| 2021/0384252 A1* | 12/2021 | Lee | H01L 27/156 |
| 2022/0052032 A1 | 2/2022 | Li et al. | |
| 2022/0069004 A1 | 3/2022 | Kang et al. | |
| 2022/0077228 A1 | 3/2022 | Do et al. | |
| 2022/0149254 A1* | 5/2022 | Schuele | H01L 25/0753 |
| 2022/0238559 A1* | 7/2022 | Lee | H01L 25/167 |
| 2022/0254830 A1* | 8/2022 | Kim | H01L 33/24 |
| 2022/0310881 A1* | 9/2022 | Bae | H01L 25/0753 |
| 2022/0320377 A1* | 10/2022 | Park | H01L 33/382 |
| 2022/0336709 A1* | 10/2022 | Lee | H01L 25/167 |

FOREIGN PATENT DOCUMENTS

| | | | |
|---|---|---|---|
| JP | 2010-199554 A | | 9/2010 |
| KR | 20190124359 A | * | 11/2019 |
| KR | 10-2020-0013190 A | | 2/2020 |
| KR | 10-2020-0034904 A | | 4/2020 |
| KR | 10-2020-0037906 A | | 4/2020 |
| KR | 20200037911 A | * | 4/2020 |
| KR | 10-2020-0070493 A | | 6/2020 |
| KR | 10-2020-0086790 A | | 7/2020 |
| KR | 10-2020-0088962 A | | 7/2020 |
| KR | 10-2022-0135287 | | 10/2022 |

OTHER PUBLICATIONS

"Conductivity and Resistivity Values for Aluminum & Alloys." Mar. 2002. (Year: 2002).*

"Technical Data for the Element Molybdenum in the Periodic Table." Web.archive.org, Feb. 1, 2008, web.archive.org/web/20080201013431/periodictable.com/Elements/042/data.html. Accessed Mar. 15, 2024. (Year: 2008).*

* cited by examiner

ALE3: CMTL3, RMTL3

ALEP: CMTLP, RMTLP

ALE3_1: CMTL3_1, RMTL3_1

ALEP_1: CMTLP_1, RMTLP_1

ALEP_2: CMTLP_1

ALE3_1 CMTL3_1, RMTL3_1

ALEP_1: CMTLP_1, RMTLP_1

DISPLAY DEVICE AND METHOD OF MANUFACTURING DISPLAY DEVICE

CROSS-REFERENCE TO RELATED APPLICATION

This application claims priority to and the benefit of Korean Patent Application No. 10-2021-0052670 filed on Apr. 22, 2021, in the Korean Intellectual Property Office, the entire disclosure of which is incorporated by reference herein.

BACKGROUND

1. Field

The present disclosure generally relates to a display device and a method of manufacturing a display device.

2. Description of the Related Art

Recently, interest in information displays has been increased. Accordingly, research and development of display devices have been continuously conducted.

SUMMARY

One or more embodiments of the present disclosure provide a display device in which contact resistance of the electrodes and the resistive-capacitive (RC) delay may be reduced.

In accordance with one or more embodiments of the present disclosure, there is provided a display device including: an emission area and a non-emission area around the emission area; a first pattern and a second pattern spaced from each other in the emission area; a first light emitting element located between the first pattern and the second pattern; a first alignment electrode located on the first pattern, the first alignment electrode having a first inclined surface opposing a first end portion of the first light emitting element; a first connection electrode at a same layer as the first alignment electrode; a first electrode electrically connected to the first end portion of the first light emitting element; a second electrode electrically connected to a second end portion of the first light emitting element; and a bank located at the non-emission area, the bank defining the emission area, wherein each of the first alignment electrode and the first connection electrode includes a first electrode layer and a second electrode layer that are sequentially stacked, wherein a contact hole exposing the first electrode layer is in the second electrode layer of the first connection electrode, and wherein the first electrode is in contact with the first electrode layer of the first connection electrode and a side surface of the second electrode layer of the first connection electrode through the contact hole.

The first electrode may be electrically connected to a transistor or a power line through the first connection electrode.

A reflectivity of the first electrode layer may be higher than a reflectivity of the second electrode layer. An electrical conductivity of the second electrode layer may be higher than an electrical conductivity of the first electrode layer.

The first electrode layer may include aluminum, and the second electrode layer may include molybdenum.

At the first inclined surface of the first alignment electrode, the first electrode layer may be exposed by the second electrode layer.

The display device may further include a first insulating layer between the first alignment electrode and the first electrode at a location overlapping with the first light emitting element in a thickness direction of the display device. On the first pattern, a side surface of the first insulating layer may be located at a same plane as a side surface of the second electrode layer of the first alignment electrode.

The display device may further include a second alignment electrode located on the second pattern, the second alignment electrode having a second inclined surface opposing the second end portion of the first light emitting element.

The display device may further include a separation area spaced from the emission area with the non-emission area interposed therebetween. The separation area may be defined by the bank. The first connection electrode may be located in the separation area.

The second electrode may be disposed at a layer different from that of the first electrode with an insulating layer interposed therebetween.

The display device may further include: a second light emitting element located between the first pattern and the second pattern; a third electrode located between the first electrode and the second electrode, the third electrode being electrically connected between the first and second electrodes through the first and second light emitting elements; and a third alignment electrode overlapping with one area of the second pattern.

The display device may further include: a third pattern opposing the first pattern with the second pattern interposed therebetween; a fourth alignment electrode located on the third pattern; a third light emitting element and a fourth light emitting element, each of the third light emitting element and the fourth light emitting element being located between the second pattern and the third pattern; a fourth electrode electrically connected between the second and third electrodes; and a fifth electrode electrically connected between the second and fourth electrodes.

The display device may further include: a display area and a non-display area around the display area; and a pad located in the non-display area. The display area may include the emission area and the non-emission area. The pad may include a third connection electrode formed through a same process as the first alignment electrode and a pad electrode formed through a same process as the first electrode. An opening exposing a first electrode layer of the third connection electrode may be located at a second electrode layer of the third connection electrode. The pad electrode may be in contact with a first electrode layer of the third connection electrode and a side surface of a second electrode layer of the third connection electrode through the opening.

A reflectivity of the second electrode layer may be higher than a reflectivity of the first electrode layer. An electrical conductivity of the first electrode layer may be higher than an electrical conductivity of the second electrode layer.

The second electrode layer may include aluminum, and the first electrode layer may include molybdenum.

In accordance with one or more embodiments of the present disclosure, there is provided a method of manufacturing a display device, the method including: forming a first pattern and a second pattern on a base layer; forming a first alignment electrode overlapping with the first pattern, a second alignment electrode overlapping with the second pattern, and a first connection electrode, wherein each of the first alignment electrode, the second alignment electrode, and the first connection electrode includes a first electrode layer and a second electrode layer formed on the first electrode layer; forming a first insulating layer over the first alignment electrode, the second alignment electrode, and the first connection electrode; aligning a first light emitting element on the first insulating layer between the first pattern and the second pattern; forming a second insulating pattern partially overlapping with the first light emitting element; forming a first electrode electrically connected to a first end portion of the first light emitting element; and forming a second electrode electrically connected to a second end portion of the first light emitting element, wherein the forming of the second insulating pattern includes: forming a second insulating layer; and forming the second insulating pattern and a contact hole of the second electrode layer by partially etching the second insulating layer and the second electrode layer of the first connection electrode, and wherein the first electrode is in contact with the first electrode layer of the first connection electrode and a side surface of the second electrode layer of the first connection electrode through the contact hole.

A reflectivity of the first electrode layer may be higher than a reflectivity of the second electrode layer. An electrical conductivity of the second electrode layer may be higher than an electrical conductivity of the first electrode layer.

The first electrode layer may include aluminum, and the second electrode layer may include molybdenum.

The forming of the second insulating pattern may include: forming the second insulating layer covering the first light emitting element; and collectively etching the first insulating layer, the second insulating layer, and the second electrode layer of the first alignment electrode.

At a first inclined surface of the first alignment electrode opposing the first end portion of the first light emitting element, the first electrode layer may be exposed by the second electrode layer.

In accordance with one or more embodiments of the present disclosure, there is provided a method of manufacturing a display device, the method including: forming a first pattern and a second pattern on a base layer; forming a first alignment electrode overlapping with the first pattern, a second alignment electrode overlapping with the second pattern, and a first connection electrode, wherein each of the first alignment electrode, the second alignment electrode, and the first connection electrode includes a first electrode layer and a second electrode layer on the first electrode layer; forming a first insulating pattern between the first alignment electrode and the second alignment electrode; aligning a first light emitting element on the first insulating pattern between the first pattern and the second pattern; forming a second insulating pattern partially overlapping with the first light emitting element; forming a second electrode electrically connected to a second end portion of the first light emitting element; and forming a first electrode electrically connected to a first end portion of the first light emitting element, wherein the forming of the second electrode includes: forming an electrode layer; and forming a contact hole of the second electrode and the second electrode layer by partially etching the electrode layer and the second electrode layer of the first connection electrode, and wherein the first electrode is in contact with the first electrode layer of the first connection electrode and a side surface of the second electrode layer of the first connection electrode through the contact hole.

BRIEF DESCRIPTION OF THE DRAWINGS

One or more embodiments will now be described more fully hereinafter with reference to the accompanying drawings; however, they may be embodied in different forms and should not be construed as limited to one or more embodiments set forth herein. Rather, these embodiments are provided so that the present disclosure will be thorough and complete, and will fully convey the scope of the embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

Figure 1A:
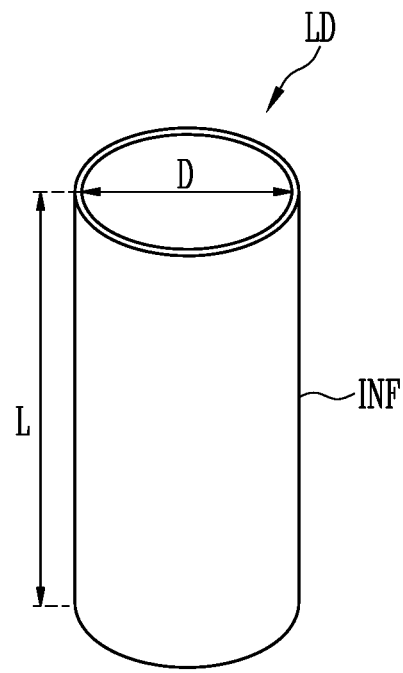
FIG. 1A is a perspective view illustrating a light emitting element in accordance with one or more embodiments of the present disclosure.

While only some embodiments are illustrated in detail, the present disclosure is not limited thereto, and various changes and different shapes may be applied to the illustrated embodiments as those of ordinary skill in the art would appreciate. As used herein, the singular forms are intended to include the plural forms as well, unless the context clearly indicates otherwise.

The present disclosure is not limited to embodiments disclosed below, and may be implemented in various forms. Each embodiment disclosed below may be independently embodied or be combined with at least another embodiment prior to being embodied.

In the following embodiments and the attached drawings, elements not directly related to the present disclosure are omitted from depiction, and dimensional relationships among individual elements in the attached drawings are illustrated only for ease of understanding but not to limit the actual scale. It should note that in giving reference numerals to elements of each drawing, like reference numerals refer to like elements even though like elements are shown in different drawings.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed herein could be termed a second element, component, region, layer or section, without departing from the scope of the present disclosure.

Spatially relative terms, such as "beneath", "below", "lower", "under", "above", "upper" and the like, may be used herein for ease of description to describe one element or feature's relationship to another element(s) or feature(s) as illustrated in the figures. It will be understood that such spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the present disclosure. As used herein, the terms "substantially," "about," and similar terms are used as terms of approximation and not as terms of degree, and are intended to account for the inherent deviations in measured or calculated values that would be recognized by those of ordinary skill in the art.

As used herein, the singular forms "a" and "an" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the present disclosure refers to "one or more embodiments of the present disclosure". Also, the term "exemplary" is intended to refer to an example or illustration. As used herein, the terms "use," "using," and "used" may be considered synonymous with the terms "utilize," "utilizing," and "utilized," respectively.

It will be understood that when an element or layer is referred to as being "on", "connected to", "coupled to", or "adjacent to" another element or layer, it may be directly on, connected to, coupled to, or adjacent to the other element or layer, or one or more intervening elements or layers may be present. In contrast, when an element or layer is referred to as being "directly on", "directly connected to", "directly coupled to", or "immediately adjacent to" another element or layer, there are no intervening elements or layers present.

Figure 1B:
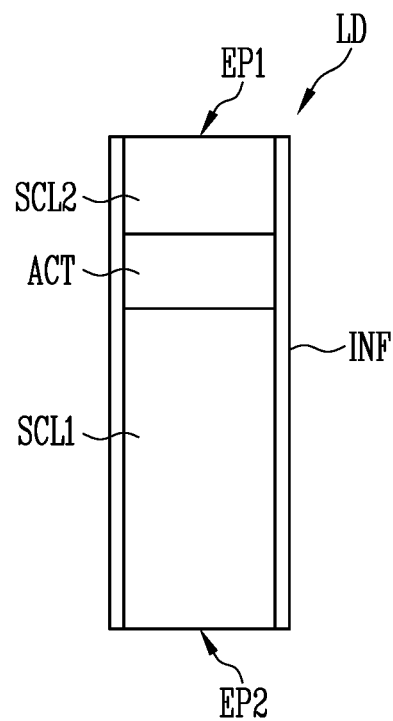
FIGS. 1B-1D are sectional views illustrating the light emitting element shown in FIG. 1A.
Figure 1C:
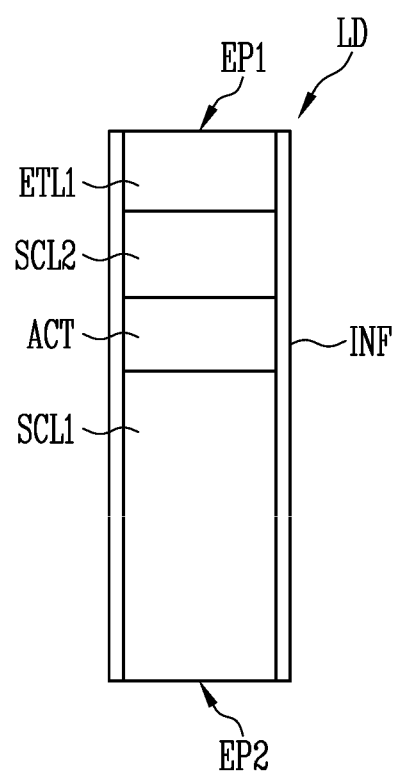
Figure 1D:
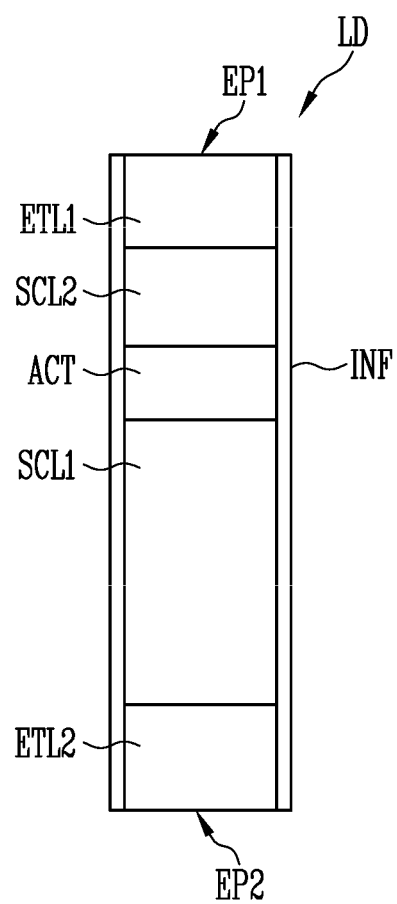

FIG. 1A is a perspective view illustrating a light emitting element in accordance with one or more embodiments of the present disclosure. FIGS. 1B-1D are sectional views illustrating the light emitting element shown in FIG. 1A. For example, FIGS. 1B-1D illustrate different embodiments of a configuration of the light emitting element LD shown in FIG. 1A. Although a rod type light emitting element LD having a cylindrical shape is illustrated in FIGS. 1A-1D, the kinds (or types) and/or shapes of the light emitting element LD are not limited thereto.

Referring to FIGS. 1A-1D, the light emitting element LD includes a first semiconductor layer SCL1, a second semiconductor layer SCL2, and an active layer ACT interposed between the first and second semiconductor layers SCL1 and SCL2. In one or more embodiments, the light emitting element LD may include the first semiconductor layer SCL1, the active layer ACT, and the second semiconductor layer SCL2, which are sequentially stacked along a length L direction.

The light emitting element LD may be provided in a rod shape extending in one direction. When assuming that an extending direction of the light emitting element LD is the length L direction, the light emitting element LD may have a first end portion EP1 and a second end portion EP2 along the length L direction.

Any one of the first and second semiconductor layers SCL1 and SCL2 may be disposed at the first end portion EP1 of the light emitting element LD. In addition, the other one of the first and second semiconductor layers SCL1 and SCL2 may be disposed at the second end portion EP2 of the light emitting element LD. In one or more embodiments, the second semiconductor layer SCL2 may be disposed at the first end portion EP1 of the light emitting element LD, and the first semiconductor layer SCL1 may be disposed at the second end portion EP2 of the light emitting element LD.

In one or more embodiments, the light emitting element LD may be a rod type light emitting element (also referred to as a "rod type light emitting diode") manufactured in a rod shape through an etching process, etc. In the present disclosure, the term "rod shape" may include a rod-like shape or bar-like shape, which is long in the length L direction (i.e., its aspect ratio is greater than 1), such as a cylinder or a polyprism, and the shape of its section is not particularly limited. For example, a length L of the light emitting element LD may be greater than a diameter D (or a width of a cross-section) of the light emitting element LD.

The light emitting element LD may have a size small to a degree of micrometer scale or nanometer scale. In one or more embodiments, the light emitting element LD may have a diameter D and/or a length L in a range of micrometer scale or nanometer scales. However, the size of the light emitting element LD is not limited thereto. For example, the size of the light emitting element LD may be variously modified according to design conditions of various types of devices, e.g., a display device and the like, which use the light emitting element as a light source.

The first semiconductor layer SCL1 may be a first conductivity type semiconductor layer. For example, the first semiconductor layer SCL1 may include an N-type semiconductor layer. In one or more embodiments, the first semiconductor layer SCL1 may include any one semiconductor material among InAlGaN, GaN, AlGaN, InGaN, AlN, and InN, and include an N-type semiconductor layer doped with a first conductivity type dopant such as Si, Ge, or Sn. In addition, the first semiconductor layer SCL1 may be formed of various materials.

The active layer ACT is formed on the first semiconductor layer SCL1, and may be formed in a single-quantum well structure or a multi-quantum well structure. The position of the active layer ACT may be variously changed according to the kind (or type) of the light emitting element LD. The active layer ACT may emit light having a wavelength of 400 nm to 900 nm, and use a double hetero-structure.

A clad layer doped with a conductive dopant may be formed on the top and/or the bottom of the active layer ACT. In one or more embodiments, the clad layer may be formed as an AlGaN layer or InAlGaN layer. In one or more embodiments, a material such as AlGaN or AlInGaN may be used to form the active layer ACT. In addition, the active layer ACT may be formed of various materials.

The second semiconductor layer SCL2 is formed on the active layer ACT, and may include a semiconductor layer having a type different from that of the first semiconductor layer SCL1. For example, the second semiconductor layer SCL2 may include a P-type semiconductor layer. In one or more embodiments, the second semiconductor layer SCL2 may include at least one semiconductor material among InAlGaN, GaN, AlGaN, InGaN, AlN, and InN, and include a P-type semiconductor layer doped with a second conductivity type dopant such as Mg. In addition, the second semiconductor layer SCL2 may be formed of various materials.

In one or more embodiments, the first semiconductor layer SCL1 and the second semiconductor layer SCL2 may have different lengths (or thicknesses) in the length L direction of the light emitting element LD. In one or more embodiments, the first semiconductor layer SCL1 may have a length (or thickness) longer (or thicker) than that of the second semiconductor layer SCL2 along the length L direction of the light emitting element LD. Accordingly, the active layer ACT of the light emitting element LD may be located closer to the first end portion EP1 than the second end portion EP2.

When a voltage, which is a threshold voltage or higher, is applied between both ends of the light emitting element LD, the light emitting element LD emits light while electron-hole pairs are combined in the active layer ACT. The light emission of the light emitting element LD is controlled by using such a principle, so that the light emitting element LD can be used as a light source for various light emitting devices, including a pixel of a display device.

In one or more embodiments, the light emitting element LD may further include an additional component, in addition to the first semiconductor layer SCL1, the active layer ACT, and the second semiconductor SCL2. For example, the light emitting element LD may additionally include at least one phosphor layer, at least one active layer, at least one semiconductor layer, and/or at least one electrode layer, which are disposed at one ends of the first semiconductor layer SCL1, the active layer ACT, and/or the second semiconductor layer SCL2.

For example, the light emitting element LD may further include an electrode layer ETL1 disposed at one end of the second semiconductor layer SCL2 as shown in FIG. 1C. The electrode layer ETL1 may be located at the first end portion EP1 of the light emitting element LD.

In addition, the light emitting element LD may further include another electrode ETL2 disposed at one end of the first semiconductor layer SCL1 as shown in FIG. 1D. In one or more embodiments, the electrode layers ETL1 and ETL2 may be disposed at the first and second end portions EP1 and EP2 of the light emitting element LD.

The electrode layers ETL1 and ETL2 may be ohmic contact electrodes, but the present disclosure is not limited thereto. For example, the electrode layers ETL1 and ETL2 may be Schottky contact electrodes.

The electrode layers ETL1 and ETL2 may include a metal or metal oxide. In one or more embodiments, the electrode layers ETL1 and ETL2 may include one or mixture of chromium (Cr), titanium (Ti), aluminum (Al), gold (Au), nickel (Ni), any oxide or alloy thereof, and indium tin oxide (ITO). The electrode layers ETL1 and ETL2 may include the same material or different materials.

The electrode layers ETL1 and ETL2 may be substantially transparent or translucent. Accordingly, light generated in the light emitting element LD may be emitted to the outside of the light emitting element LD by being transmitted through the electrode layers ETL1 and ETL2. In one or more embodiments, when light generated in the light emitting element LD is not transmitted through the electrode layers ETL1 and ETL2 but emitted to the outside of the light emitting element LD through an area except both the end portions of the light emitting element LD, the electrode layers ETL1 and ETL2 may be opaque.

In one or more embodiments, the light emitting element LD may further include an insulative film INF provided on a surface (e.g., an outer peripheral or circumferential surface) of the light emitting element LD. The insulative film INF may be formed on the surface (e.g., an outer peripheral or circumferential surface) of the light emitting element LD to be around (or surround) an outer surface (e.g., an outer peripheral or circumferential surface) of at least the active layer ACT. In addition, the insulative film INF may be further around (or surround) one areas of the first and second semiconductor layers SCL1 and SCL2.

When the light emitting element LD includes the electrode layers ETL1 and ETL2, the insulative film INF may at least partially be around (or surround) outer surfaces (e.g., the outer peripheral or circumferential surfaces) of the electrode layers ETL1 and ETL2, or may not surround the outer surfaces (e.g., the outer peripheral or circumferential surface) of the electrode layers ETL1 and ETL2. That is, the insulative film INF may be selectively formed on surfaces of the electrode layers ETL1 and ETL2.

The insulative film INF may expose both the end portions of the light emitting element LD in the length L direction of the light emitting element LD. For example, the insulative film INF may expose at least one of the first and second semiconductor layers SCL1 and SCL2 and the electrode layers ETL1 and ETL2 at the first and second end portions EP1 and EP2 of the light emitting element LD. Alternatively, in one or more embodiments, the insulative film INF may not be provided in the light emitting element LD.

When the insulative film INF is provided to cover the surface (e.g., the outer peripheral or circumferential surface) of the light emitting element LD, for example, an outer surface (e.g., an outer peripheral or circumferential surface) of the active layer ACT, the insulative film INF may prevent the active layer ACT from being short-circuited with at least one electrode (e.g., an alignment electrode and/or a pixel electrode, which will be described later). Accordingly, the electrical stability of the light emitting element LD can be ensured.

The insulative film INF may include a transparent insulating material. For example, the insulative film INF may include at least one insulating material among $SiO_2$ or silicon oxide ($SiO_x$) which is not fixed thereto, $Si_3N_4$ or silicon nitride ($SiN_x$) which is not fixed thereto, $Al_2O_3$ or aluminum oxide ($Al_xO_y$) which is not fixed thereto, and $TiO_2$ or titanium dioxide ($TiO_x$), but the present disclosure is not limited thereto. That is, the material constituting the insulative film INF is not particularly limited.

When the insulative film INF is provided on the surface of the light emitting element LD, a surface defect of the light emitting element LD may be reduced or minimized, thereby improving the lifespan and efficiency of the light emitting element LD. Also, when the insulative film INF is formed in each light emitting element LD, the insulative film INF can prevent an unwanted short circuit occurring between a plurality of light emitting elements LD even when the plurality of light emitting elements LD are densely disposed.

In one or more embodiments of the present disclosure, the light emitting element LD may be manufactured through a surface treatment process. For example, when a plurality of light emitting elements LD are mixed in a liquid solution (or solvent) to be supplied to each emission area (e.g., an emission area of each pixel), each light emitting element LD may be surface-treated such that the light emitting elements LD are not unequally condensed in the solution but equally dispersed in the solution. In a non-restrictive embodiment related to this, the insulative film INF itself may be formed as a hydrophobic layer by using a hydrophobic material, or a hydrophobic layer made of a hydrophobic material may be additionally formed on the insulative film.

The insulative film INF may be configured as a single layer or a multi-layer. For example, the insulative film INF may be configured as a double layer.

The insulative film INF may be partially etched in at least one area, e.g., at least one of an upper area and a lower area thereof. The insulative film INF may have a rounded shape in the at least one area thereof, but the present disclosure is not limited thereto.

For example, in at least one of an upper area and a lower area of the insulative film INF, the insulative film INF may be partially or entirely removed. Accordingly, at least one of the first semiconductor layer SCL1, the second semiconductor layer SCL2, and the electrode layers ETL1 and ETL2 may be partially exposed.

The light emitting element LD may be used in various types of devices including a display device, which require a light source. For example, when a plurality of light emitting elements LD are disposed in each pixel of a display panel, the light emitting elements LD may be used for a light source of each pixel. However, the application field of the light emitting element LD is not limited to the above-described example. For example, the light emitting element LD may be used for other types of devices that require a light source, such as a lighting device.

Figure 2:
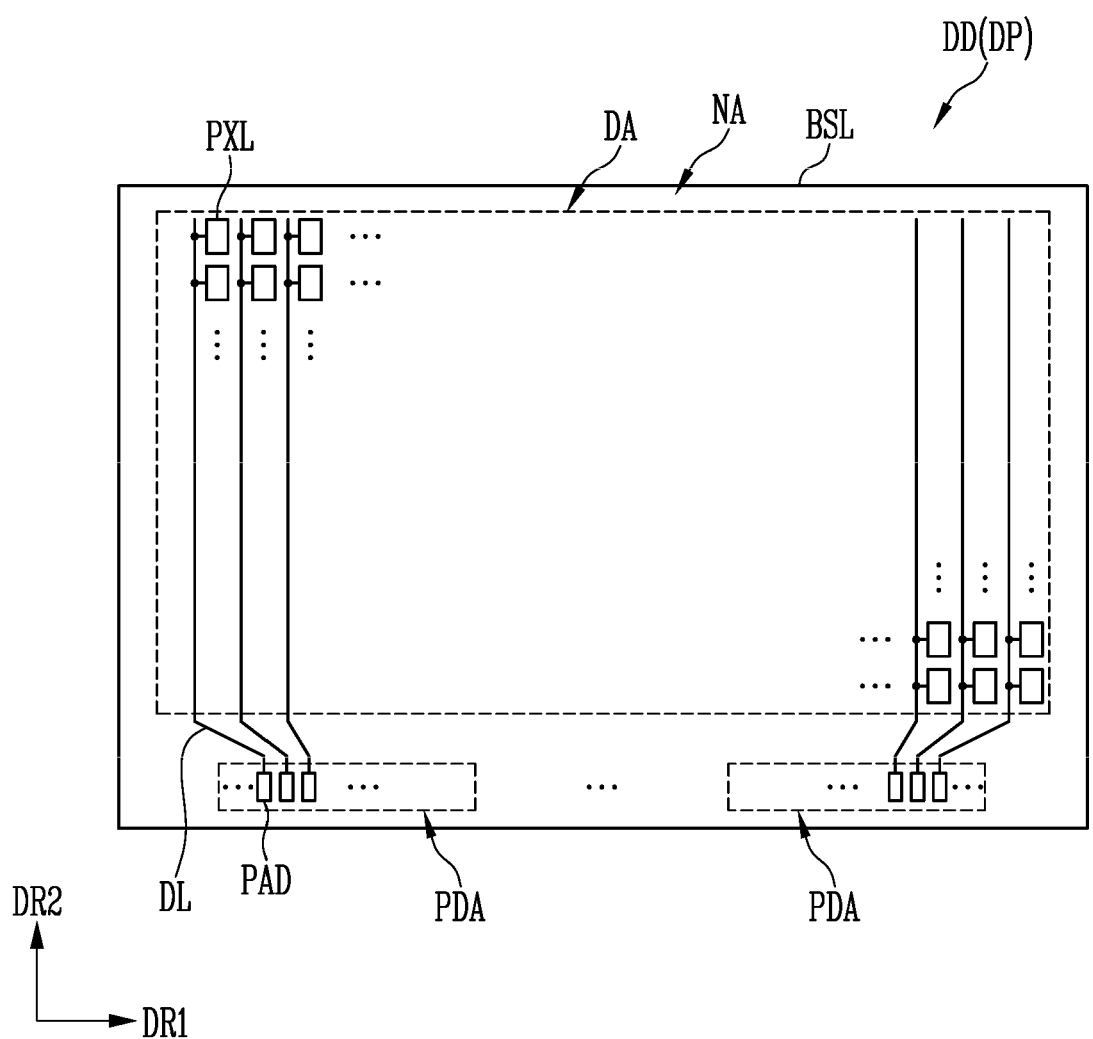
FIG. 2 is a plan view illustrating a display device in accordance with one or more embodiments of the present disclosure.

FIG. 2 is a plan view illustrating a display device in accordance with one or more embodiments of the present disclosure. In FIG. 2, a display device DD is illustrated as an example of an electronic device which can use, as a light source, the light emitting element LD described in the embodiments shown in FIGS. 1A-1D. For example, a structure of the display device DD will be illustrated based on a display panel DP. For example, each pixel PXL of the display panel DP may include at least one light emitting element LD.

For convenience, in FIG. 2, a structure of the display panel DP will be briefly illustrated based on a display area DA. However, in one or more embodiments, at least one driving circuit and lines, which are not shown in the drawing, may be further provided in the display panel PNL.

Referring to FIG. 2, the display panel DP in accordance with one or more embodiments of the present disclosure may include a base layer BSL and pixels PXL provided on the base layer BSL.

The display panel DP may have various shapes. In one or more embodiments, the display panel DP may be provided in a rectangular plate shape, but the present disclosure is not limited thereto. For example, the display panel DP may have a shape such as a circular shape or an elliptical shape. Also, the display panel DP may include an angular corner and/or a curved corner. For convenience, in FIG. 2, it is illustrated that the display panel DP has a rectangular plate shape. In addition, an extending direction (e.g., a lateral direction) of long sides of the display panel DP is designated as a first direction DR1, and an extending direction (e.g., a longitudinal direction) of short sides of the display panel DP is designated as a second direction DR2.

The display panel DP and the base layer BSL for forming the same may include the display area DA for displaying an image and a non-display area NA except the display area DA. The display area DA may constitute a screen or an area on which an image is displayed, and the non-display area NA may be the other area of the display panel DP except the display area DA. In one or more embodiments, the non-display area NA may be around (or surround) an outer periphery of the display area DA.

The pixels PXL may be disposed in the display area DA on the base layer BSL. In one or more embodiments, the display area DA may include a plurality of pixel areas in which the respective pixels PXL are disposed.

The non-display area NA may be disposed at the periphery of the display area DA. Various lines, pads, and/or a built-in circuit, which are connected to the pixels PXL of the display area DA, may be disposed in the non-display area NA. The non-display area NA may include a pad area PDA, and pads PAD may be disposed in the pad area PDA. For example, the pads PAD may be connected to a driving circuit, such as a source driver and/or a timing controller, which is mounted on a flexible circuit board (FCB). When the display panel DP is connected to a plurality of source drivers, pad areas PDA may respectively correspond to the source drivers.

The pixel PXL is connected to the pad PAD through a data line DL, and may receive a data signal from the source driver. When a built-in circuit (e.g., a gate driver) is provided in the display panel DP, the built-in circuit may be connected to the pad PAD. In FIG. 2, it is illustrated that the pad PAD (or the pad area PDA) is disposed at only a lower side of the display panel DP, but the present disclosure is not limited thereto. For example, the pads PAD may be disposed at each of upper and lower sides of the display panel DP.

In description of embodiments of the present disclosure, the term "connection (or coupling)" may inclusively mean physical and/or electrical connection (or coupling). Also, the term "connection (or coupling)" may inclusively mean direct or indirect connection (or coupling), and integral or non-integral connection (or coupling).

In one or more embodiments, at least two kinds of pixels PXL emitting light of different colors may be disposed in the display area DA. In addition, each pixel unit configured with pixels PXL of different colors may be disposed adjacent to each other.

In one or more embodiments, each pixel PXL may be set as a pixel of a desired color (e.g., a predetermined color), and may include a light emitting element LD that generates light of the desired color (e.g., a predetermined color). In one or more embodiments, at least some pixels PXL may include a light emitting element LD that generates light of a first color, and a light conversion layer that converts light of the first color into light of a second color may be disposed at an upper portion of the pixel PXL. Accordingly, the light of the second color may be generated by using the at least some pixels PXL.

The pixel PXL may include at least one light source driven by a suitable control signal (e.g., a predetermined control signal) (e.g., a scan signal and/or a data signal) and/or a power source (e.g., a predetermined power source) (e.g., a first power source and/or a second power source). In one or more embodiments, the light source may include at least one light emitting element LD in accordance with the embodiments shown in FIGS. 1A-1D, e.g., at least one rod type light emitting element LD having a size small to a degree of nanometer scale or micrometer scale. In addition, various types of light emitting elements LD may be used as the light source of the pixel PXL. For example, in one or more embodiments, a light source of each pixel PXL may be configured by using a light emitting element LD having a core-shell structure.

Also, the pixel PXL may have a structure in accordance with at least one or more embodiments among various embodiments which will be described below. For example, each pixel PXL may have a structure to which any one embodiment among embodiments which will be described is applied, or have a structure to which a combination of at least two embodiments are applied.

In one or more embodiments, the pixel PXL may be configured as an active pixel, but the present disclosure is not limited thereto. For example, the pixel PXL may be configured as a pixel of a passive or active light emitting display device using various structures and/or driving methods.

Figure 3A:
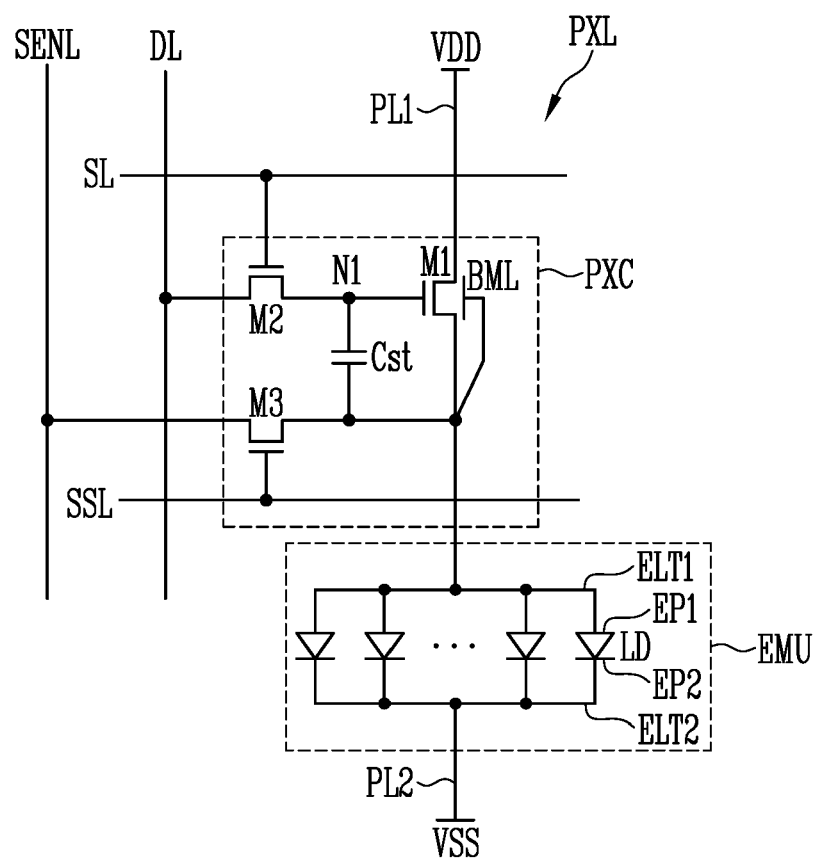
FIGS. 3A-3C are circuit diagrams illustrating a pixel included in the display device shown in FIG. 2.
Figure 3B:
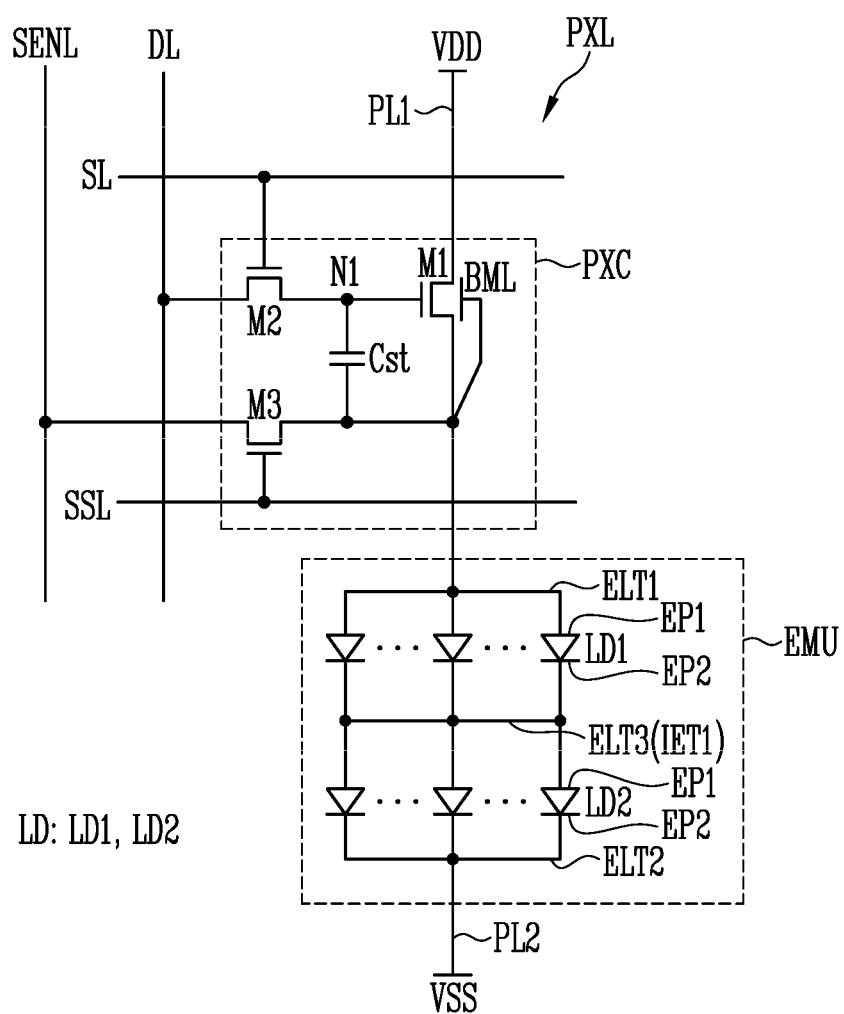
Figure 3C:
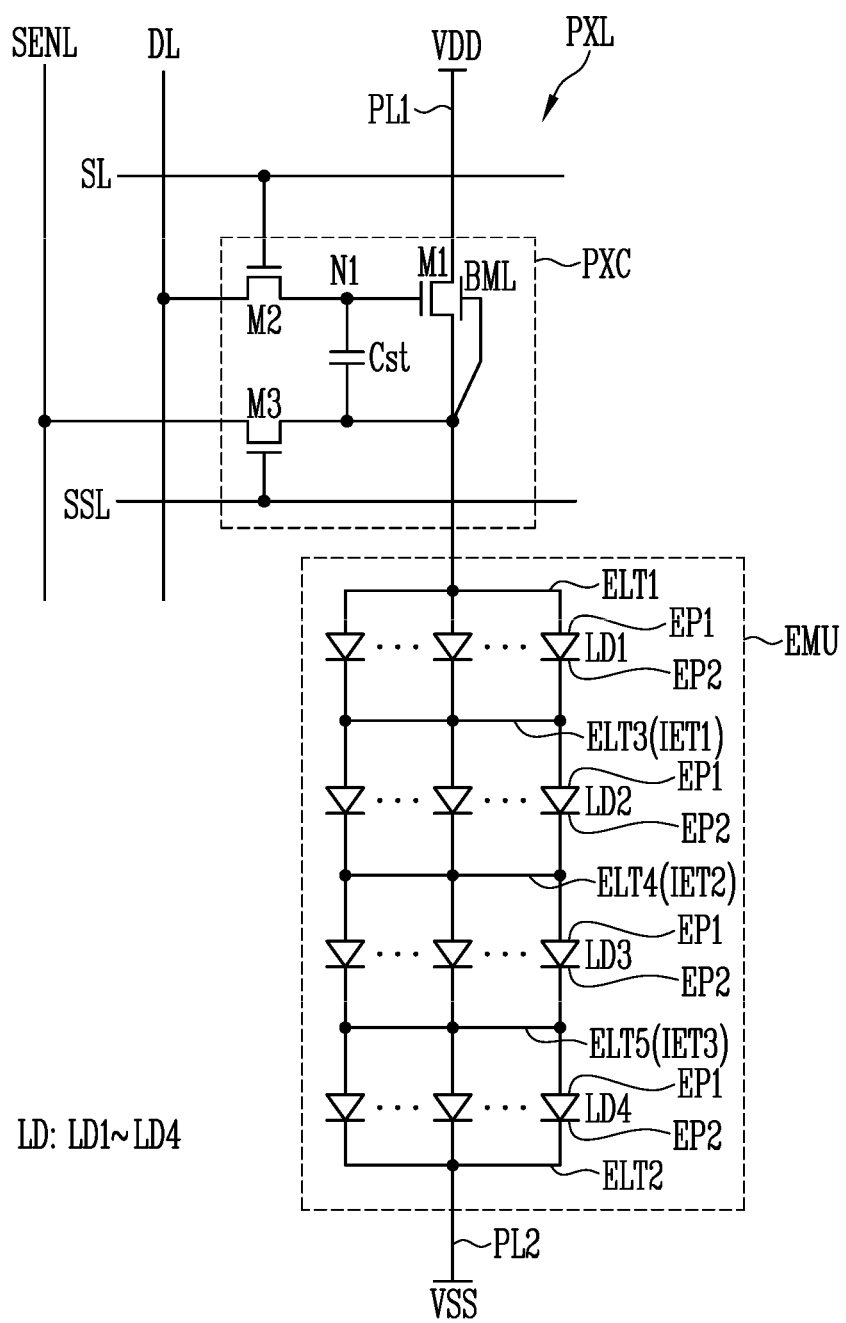

FIGS. 3A-3C are circuit diagrams illustrating a pixel PXL included in the display device DD shown in FIG. 2. For example, FIGS. 3A-3C illustrate one or more embodiments of a pixel PXL that can be applied to an active display device, and illustrate different embodiments in relation to a structure of a light emitting unit EMU.

In one or more embodiments, each of pixels PXL shown in FIGS. 3A-3C may be any one of the pixels PXL disposed in the display area DA shown in FIG. 2. In addition, the pixels PXL disposed in the display area DA may have structures substantially identical or similar to each other.

Referring to FIGS. 3A-3C, the pixel PXL may include a light emitting unit EMU for generating light with a luminance corresponding to a data signal. Also, the pixel PXL may selectively further include a pixel circuit PXC for driving the light emitting unit EMU.

The pixel circuit PXC may be electrically connected between a first power source VDD and the light emitting unit EM. Also, the pixel circuit PXC may be electrically connected to a scan line SL and a data line DL of the corresponding pixel PXL, to control an operation of the light emitting unit EMU, corresponding to a scan signal and a data signal, which are respectively supplied from the scan line SL and the data line DL. Also, the pixel circuit PXC may be selectively further connected to a sensing signal line SSL and a sensing line SENL.

The pixel circuit PXC may include at least one transistor and a capacitor. For example, the pixel circuit PXC may include a first transistor M1, a second transistor M2, a third transistor M3, and a storage capacitor Cst.

The first transistor M1 is electrically connected between the first power source VDD and a first pixel electrode ELT1 of the light emitting unit EMU. In addition, a gate electrode of the first transistor M1 is electrically connected to a first node N1. The first transistor M1 controls a driving current supplied to the light emitting unit EMU, corresponding to a voltage at the first node N1. That is, the first transistor M1 may be a driving transistor for controlling the driving current of the pixel PXL.

In one or more embodiments, the first transistor M1 may selectively include a lower metal layer BML (also referred to as a "lower electrode," a "back gate electrode," or a "lower light blocking layer"). The gate electrode and the lower metal layer BML of the first transistor M1 may overlap with each other with an insulating layer interposed therebetween. In one or more embodiments, the lower metal layer BML may be electrically connected to one electrode, e.g., a source or drain electrode of the first transistor M1.

When the first transistor M1 includes the lower metal layer BML, there may be applied a back-biasing technique (or sync technique) for moving a threshold voltage of the first transistor M1 in a negative direction or positive direction by applying a back-biasing voltage to the lower metal layer BML of the first transistor M1 in driving of the pixel PXL. In one or more embodiments, a source-sync technique is applied by connecting the lower metal layer BML to a source electrode of the first transistor M1, so that the threshold voltage of the first transistor M1 can be moved in the negative direction or positive direction. In addition, when the lower metal layer BML is disposed on the bottom of a semiconductor pattern constituting a channel of the first transistor M1, the lower metal layer BML severs as a light blocking pattern, thereby stabilizing operational characteristics of the first transistor M1. However, the function and/or application method of the lower metal layer BML are/is not limited thereto.

The second transistor M2 is electrically connected between the data line DL and the first node N1. In addition, a gate electrode of the second transistor M2 is electrically connected to the scan line SL. The second transistor M2 is turned on when a scan signal having a gate-on voltage (e.g., a high level voltage) is supplied from the scan line SL, to electrically connect the data line DL and the first node N1 to each other.

A data signal of a corresponding frame is supplied to the data line DL for each frame period. The data signal is transferred to the first node N1 through the turned-on second transistor M2 during a period in which the scan signal having the gate-on voltage is supplied. That is, the second transistor M2 may be a switching transistor for transferring each data signal to the inside of the pixel PXL.

One electrode of a storage capacitor Cst is electrically connected to the first node N1, and the other electrode of the storage capacitor Cst is electrically connected to a second electrode (e.g., a source electrode) of the first transistor M1. The storage capacitor Cst charges to a voltage (or holds a charge) corresponding to the data signal supplied to the first node N1 during each frame period.

The third transistor M3 is electrically connected between the first pixel electrode ELT1 of the light emitting unit EMU (or the second electrode of the first transistor M1) and the sensing line SENL. In addition, a gate electrode of the third transistor M3 is electrically connected to the sensing signal line SSL. The third transistor M3 may transfer a voltage value applied to the first pixel electrode ELT1 to the sensing line SENL according to a sensing signal supplied to the sensing signal line SSL. The voltage value transferred through the sensing line SENL may be provided to an external circuit (e.g., a timing controller), and the external circuit may extract characteristic information (e.g., the threshold voltage of the first transistor M1, etc.), based on the provided voltage value. The extracted characteristic information may be used to convert image data such that a characteristic deviation between the pixels PXL is compensated.

Although a case where the transistors included in the pixel circuit PXC are all implemented with an N-type transistor has been illustrated in FIGS. 3A-3C, the present disclosure is not limited thereto. That is, at least one of the first, second, and third transistors M1, M2, and M3 may be changed to a P-type transistor.

In addition, the structure and driving method of the pixel PXL may be variously changed. For example, the pixel circuit PXC may be configured as a pixel circuit having various structures and/or various driving methods, in addition to the embodiments shown in FIGS. 3A-3C.

In one or more embodiments, the pixel circuit PXC may not include the third transistor M3. Also, the pixel circuit PXC may further include other circuit elements such as a compensation transistor for compensating for the threshold voltage of the first transistor M1, etc., an initialization transistor for initializing a voltage of the first node N1 and/or the first pixel electrode ELT1 of the light emitting unit EMU, an emission control transistor for controlling a period in which a driving current is supplied to the light emitting unit EMU, and/or a boosting capacitor for boosting the voltage of the first node N1.

In one or more embodiments, when the pixel PXL is a pixel of a passive light emitting display device, the pixel circuit PXC may be omitted. The light emitting unit EMU may be directly connected to the scan line SL, the data line DL, a first power line PL1, a second power line PL2, and/or another signal line or power line.

The light emitting unit EMU may include at least one light emitting element LD, e.g., a plurality of light emitting elements LD electrically connected between the first power source VDD and a second power source VSS.

For example, the light emitting unit EMU may include the first pixel electrode ELT1 (also referred to as a "first electrode" or a "first contact electrode") electrically connected to the first power source VDD through the pixel circuit PXC and the first power line PL1, a second pixel electrode ELT2 (also referred to as a "second electrode" or a "second contact electrode") electrically connected to the second power source VSS through the second power line PL2, and a plurality of light emitting elements LD electrically connected between the first and second pixel electrodes ELT1 and ELT2.

The first power source VDD and the second power source VSS may have different potentials such that the light emitting elements LD can emit light. In one or more embodiments, the first power source VDD may be set as a high-potential power source, and the second power source VSS may be set as a low-potential power source.

In one or more embodiments, the light emitting unit EMU may include a plurality of light emitting elements LD connected in parallel to each other in the same direction between the first pixel electrode ELT1 and the second pixel electrode ELT2 as illustrated in the embodiment shown in FIG. 3A. For example, each light emitting element LD may include a first end portion EP1 (e.g., a P-type end portion) electrically connected to the first power source VDD through the first pixel electrode ELT1, the pixel circuit PXC, and the first power line PL1, and a second end portion (e.g., an N-type end portion) electrically connected to the second power source VSS through the second pixel electrode ELT2 and the second power line PL2. That is, the light emitting elements LD may be connected in parallel in a forward direction between the first and second pixel electrodes ELT1 and ELT2.

The light emitting elements LD connected in the forward direction between the first power source VDD and the second power source VSS may constitute effective light sources, respectively. These effective light sources may constitute the light emitting unit EMU of the pixel PXL.

First end portions EP1 of the light emitting elements LD may be commonly connected to the pixel circuit PXC through one electrode (e.g., the first pixel electrode ELT1) of the light emitting unit EMU, and be electrically connected to the first power source VDD through the pixel circuit PXC and the first power line PL1. In addition, second end portions EP2 of the light emitting elements LD may be commonly connected to the second power source VSS through another electrode (e.g., the second pixel electrode ELT2) of the light emitting unit EMU and the second power line PL2.

Although an embodiment in which the pixel PXL includes the light emitting unit EMU having a parallel structure is illustrated in FIG. 3A, the present disclosure is not limited thereto. For example, the pixel PXL may include the light emitting unit EMU having a serial structure or a series/parallel structure. In one or more embodiments, the light emitting unit EMU may include a plurality of light emitting element LD dividedly connected to a plurality of serial stages as illustrated in the embodiments shown in FIGS. 3B and 3C.

Referring to FIG. 3B, the light emitting unit EMU may include a first serial stage including at least one first light emitting element LD1 and a second serial stage including at least one second light emitting element LD2.

The first serial stage may include the first pixel electrode ELT1, a third pixel electrode ELT3 (also referred to as a "third electrode" or a "third contact electrode"), and at least one first light emitting element LD1 electrically connected between the first and third pixel electrodes ELT1 and ELT3.

Each first light emitting element LD1 may be connected in the forward direction between the first and third pixel electrodes ELT1 and ELT3. For example, a first end portion EP1 of the first light emitting element LD1 may be electrically connected to the first pixel electrode ELT1, and a second end portion EP2 of the first light emitting element LD1 may be electrically connected to the third pixel electrode ELT3. The third pixel electrode ELT3 may constitute a first intermediate electrode IET1 that connects the first serial stage and the second serial stage to each other.

The second serial stage may include the third pixel electrode ELT3, the second pixel electrode ELT2, and at least one second light emitting element LD2 electrically connected between the third and second pixel electrodes ELT3 and ELT2. Each second light emitting element LD2 may be connected in the forward direction between the third and second pixel electrodes ELT3 and ELT2. For example, a first end portion EP1 of the second light emitting element LD2 may be electrically connected to the third pixel electrode ELT3, and a second end portion EP2 of the second light emitting element LD2 may by electrically connected to the second pixel electrode ELT2.

The number of serial stages constituting each light emitting unit EMU may be variously changed in accordance with one or more embodiments. For example, the light emitting unit EMU may include a plurality of light emitting elements LD dividedly connected to four serial stages as illustrated in one or more embodiments shown in FIGS. 3A-3C.

Referring to FIG. 3C, the light emitting unit EMU may include a first serial stage including at least one first light emitting element LD1, a second serial stage including at least one second light emitting element LD2, a third serial stage including at least one third light emitting element LD3, and a fourth serial stage including at least one fourth light emitting element LD4.

The first serial stage may include the first pixel electrode ELT1, the third pixel electrode ELT3, and at least one first light emitting element LD1 electrically connected between the first and third pixel electrodes ELT1 and ELT3. Each first light emitting element LD1 may be connected in the forward direction between the first and third pixel electrodes ELT1 and ELT3. For example, a first end portion EP1 of the first light emitting element LD1 may be electrically connected to the first pixel electrode ELT1, and a second end portion EP2 of the first light emitting element LD1 may be electrically connected to the third pixel electrode ELT3.

The second serial stage may include the third pixel electrode ELT3, a fourth pixel electrode (also referred to as a "fourth electrode" or a "fourth contact electrode"), and at least one second light emitting element LD2 electrically connected between the third and fourth pixel electrodes ELT3 and ELT4. Each second light emitting element LD2 may be connected in the forward direction between the third and fourth pixel electrodes ELT3 and ELT4. For example, a first end portion EP1 of the second light emitting element LD2 may be electrically connected to the third pixel electrode ELT3, and a second end portion EP2 of the second light emitting element LD2 may be electrically connected to the fourth pixel electrode ELT4.

The third serial stage may include the fourth pixel electrode, a fifth pixel electrode (also referred to as a "fifth electrode" or a "fifth contact electrode"), and at least one third light emitting element LD3 electrically connected between the fourth and fifth pixel electrodes ELT4 and ELT5. Each third light emitting element LD3 may be connected in the forward direction between the fourth and fifth pixel electrodes ELT4 and ELT5. For example, a first end portion EP1 of the third light emitting element LD3 may be electrically connected to the fourth pixel electrode ELT4, and a second end portion EP2 of the third light emitting element LD3 may be electrically connected to the fifth pixel electrode ELT5.

The fourth serial stage may include the fifth pixel electrode, the second pixel electrode ELT2, and at least one fourth light emitting element LD4 electrically connected between the fifth and second pixel electrodes ELT5 and ELT2. Each fourth light emitting element LD4 may be connected in the forward direction between the fifth and second pixel electrodes ELT5 and ELT2. For example, a first end portion EP1 of the fourth light emitting element LD4 may be electrically connected to the fifth pixel electrode ELT5, and a second end portion EP2 of the fourth light emitting element LD4 may be electrically connected to the second pixel electrode ELT2.

That is, in the embodiments shown in FIGS. 3A-3C, the light emitting unit EMU may include at least one serial stage. Each serial stage may include a pair of pixel electrodes (e.g., two pixel electrodes) and at least one light emitting element LD connected in the forward direction between the pair of pixel electrodes. The number of serial stages constituting the light emitting unit EMU and the number of light emitting elements LD constituting each serial stage are not particularly limited. In one or more embodiments, numbers of light emitting elements LD constituting respective serial stages may be equal to or different from each other, and the number of the light emitting elements LD is not particularly limited.

A first electrode, e.g., the first pixel electrode ELT1 of the light emitting unit EMU may be an anode electrode of the light emitting unit EMU. A last electrode, e.g., the second pixel electrode ELT2 of the light emitting unit EMU may be a cathode electrode of the light emitting element EMU.

The other electrodes of the light emitting unit EMU, e.g., the third pixel electrode ELT3, the fourth pixel electrode ELT4, and/or the fifth pixel electrode ELT5, which are shown in FIGS. 3B and 3C, may constitute intermediate electrodes. For example, the third pixel electrode ELT3 may constitute the first intermediate electrode IET1, the fourth pixel electrode ELT4 may constitute a second intermediate electrode IET2, and the fifth pixel electrode ELT5 may constitute a third intermediate electrode IET3.

When light emitting elements LD are connected only in parallel as illustrated in the embodiment shown in FIG. 3A, the structure of the pixel PXL can be simplified. When light emitting elements LD are connected in a series structure or a series/parallel structure as illustrated in the embodiments shown in FIGS. 3B and 3C, power efficiency can be improved as compared with an embodiment (e.g., the embodiment shown in FIG. 3A) in which the same number of light emitting elements LD are connected only in parallel. In addition, in the pixel PXL in which the light emitting elements LD are connected in the series structure or the series/parallel structure, a desired luminance (e.g., a predetermined luminance) can be expressed through light emitting elements LD of the other serial stage. Hence, the probability that a dark spot failure will occur in the pixel PXL can be reduced.

Although embodiments in which light emitting elements LD are connected in a parallel structure or a series/parallel structure have been illustrated in FIGS. 3A-3C, the present disclosure is not limited thereto. For example, in one or more embodiments, the light emitting unit EMU may be configured by connecting light emitting elements LD only in series.

Each of the light emitting elements LD may include a first end portion EP1 (e.g., a P-type end portion) connected to the first power source VDD via at least one pixel electrode (e.g., the first pixel electrode ELT1), the pixel circuit PXC, and/or the first power line PL1, and a second end portion EP2 (e.g., an N-type end portion) connected to the second power source VSS via at least another electrode (e.g., the second pixel electrode ELT2) and the second power line PL2. That is, the light emitting elements LD may be connected in the forward direction between the first power source VDD and the second power source VSS. The light emitting elements LD connected in the forward direction may constitute effective light sources of the light emitting unit EMU.

When a driving current is supplied through the corresponding pixel circuit PXC, the light emitting elements LD may emit light with a luminance corresponding to the driving current. For example, during each frame period, the pixel circuit PXC may supply, to the light emitting unit EMU, a driving current corresponding to a grayscale value to be expressed in a corresponding frame. Accordingly, while the light emitting elements LD emit light with the luminance corresponding to the driving current, the light emitting unit EMU can express the luminance corresponding to the driving current.

In one or more embodiments, the light emitting unit EMU may further include at least one non-effective light source in addition to the light emitting elements LD constituting the respective effective light sources. In one or more embodiments, at least one non-effective light emitting element that is arranged in a reverse direction or has at least one floated end portion may be further connected to at least one serial stage. The non-effective light emitting element maintains an inactivated state even when a driving voltage is applied in the forward direction between pixel electrodes. Accordingly, the non-effective light emitting element can maintain a substantially non-emission state.

Figure 4:
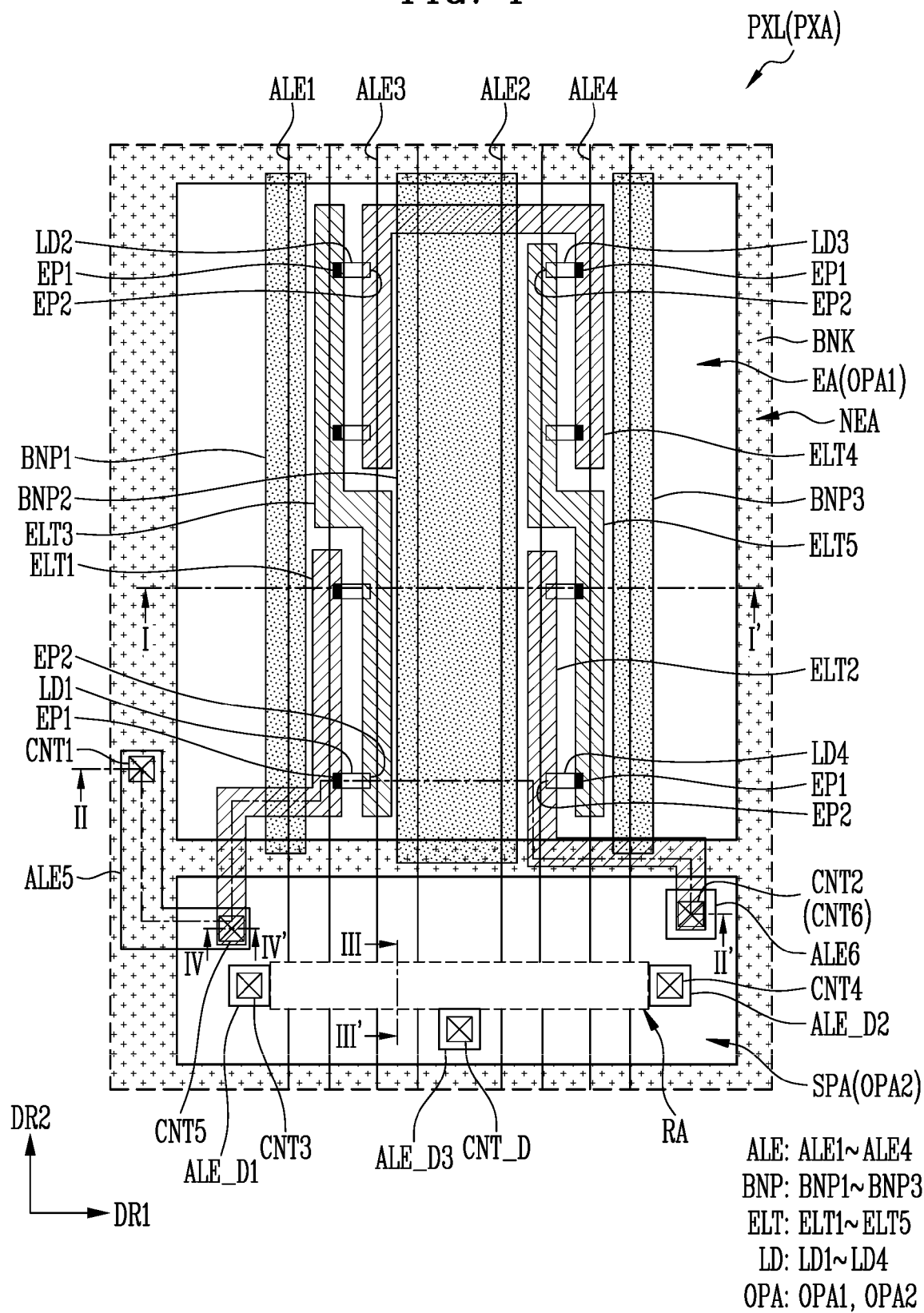
FIG. 4 is a plan view illustrating an embodiment of a pixel included in the display device shown in FIG. 2.

FIG. 4 is a plan view illustrating an embodiment of a pixel PXL included in the display device shown in FIG. 2. For example, FIG. 4 illustrates an embodiment of a pixel area PXA of a pixel PXL, based on a light emitting unit EMU of the pixel PXL, which includes four serial stages as illustrated in the embodiment shown in FIG. 3C.

Referring to FIGS. 2, 3C, and 4, the pixel PXL may include an emission area EA, a non-emission area NEA, and a separation area SPA. For example, a pixel area PXA in which each pixel PXL is provided may include an emission area EA in which light emitting elements LD are provided and/or disposed, a non-emission area NEA around (e.g., surrounding) the emission area EA, and a separation area SPA spaced from the emission area EA with the non-emission area NEA interposed therebetween.

The emission area EA may be an area which includes light emitting elements LD, to emit light. The non-emission area NEA may be an area in which a bank BNK that is around (e.g., surrounding) the emission area EA is provided. The emission area EA may be located in a first opening OPA1 of the bank BNK. The separation area SPA may be an area which is located in a second opening OPA2 of the bank BNK in the other pixel area PXA except the emission area EA, and has at least one alignment electrode ALE cut therein.

The pixel PXL may include pixel electrodes ELT provided in at least the emission area EA, light emitting elements LD electrically connected between the pixel electrodes ELT, alignment electrodes ALE provided at positions corresponding to the pixel electrodes ELT, and patterns BNP (or bank patterns) provided at the bottom of (or below) the alignment electrodes ALE overlap with corresponding at least one alignment electrode ALE. For example, the pixel PXL may include first to fifth pixel electrodes ELT1 to ELT5 provided in at least the emission area EA, first to fourth light emitting elements LD1 to LD4 electrically connected between the first to fifth pixel electrodes ELT1 to ELT5, first to fourth alignment electrodes ALE1 to ALE4 provided at the bottom of (or below) the first to fifth pixel electrodes ELT1 to ELT5, so that each of the first to fourth alignment electrodes ALE1 to ALE4 overlaps with at least one corresponding pixel electrode ELT, and first to third patterns BNP1 to BNP3 provided at the bottom of (or below) the first to fourth alignment electrodes ALE1 to ALE4, so that each of the first to third patterns BNP1 to BNP3 at least partially overlaps with corresponding at least one alignment electrode ALE. Also, the pixel PXL may further include a first connection electrode ALE5 (or fifth alignment electrode) electrically connecting the first pixel electrode ELT1 to the pixel circuit PXC (see FIG. 3C), and a second connection electrode ALE6 (or sixth alignment electrode) electrically connecting the second pixel electrode ELT2 to the second power line PL2 (see FIG. 3C). The first and second connection electrodes ALE5 and ALE6 may include the same material as the alignment electrodes ALE (e.g., ALE1 to ALE 4) through the same process as the alignment electrodes ALE. In one or more embodiments, the first connection electrode ALE5 may be integrally formed with the first alignment electrode ALE1 and may be a portion of the first alignment electrode ALE1. Similarly, the second connection electrode ALE6 may be integrally formed with the second alignment electrode ALE2 and may be a portion of the second alignment electrode ALE2.

The pixel may include at least one pair of pixel electrodes ELT, at least one pair of alignment electrodes ALE, and/or at least one pair of patterns BNP, and the number, shape, size, and arrangement structure of each of the pixel electrodes ELT, the alignment electrodes ALE, and/or the patterns BNP may be variously changed according to the structure of the pixel PXL (for example, the light emitting unit EMU described with reference to FIGS. 3A-3C).

In one or more embodiments, the patterns BNP, the alignment electrodes ALE, the light emitting elements LD, and the pixel electrodes ELT may be sequentially provided with respect to one surface of the base layer BSL (see FIG. 2), on which the pixel PXL is formed. In one or more embodiments, the alignment electrodes ALE, the patterns BNP, the light emitting elements LD, and the pixel electrodes ELT may be sequentially provided with respect to the one surface of the base layer BSL (see FIG. 2), on which the pixel PXL is formed. In addition, the positions and forming order of electrode patterns and/or insulating patterns, which constitute the pixel PXL, may be variously changed in accordance with one or more embodiments. A sectional structure of the pixel PXL will be described in detail later.

The patterns BNP may be provided in at least the emission area EA. The patterns BNP may be spaced from each other along a first direction DR1 in the emission area EA, and each of the patterns BNP may extend in a second direction DR2. In one or more embodiments, the first direction DR1 may be a lateral direction or row direction, and the second direction DR2 may be a longitudinal direction or column direction. However, the present disclosure is not limited thereto.

Each pattern BNP (also referred to as a "wall pattern" or a "protrusion pattern") may have a uniform width in the emission area EA. In one or more embodiments, each of the first, second, and third patterns BNP1, BNP2, and BNP3 may have a linear pattern shape having a constant width in the emission area EA, when viewed on a plane.

The patterns BNP may have widths equal to or different from each other. For example, the first and third patterns BNP1 and BNP3 may have the same width in at least the emission area EA, and may oppose (or face) each other with the second pattern BNP2 interposed therebetween. In one or more embodiments, the first and third patterns BNP1 and BNP3 may be symmetrical to each other with respect to the second pattern BNP2 in the emission area EA.

The patterns BNP may be arranged at a uniform distance in the emission area EA. For example, the first, second, and third patterns BNP1, BNP2, and BNP3 may be sequentially arranged at a constant distance corresponding to a first distance along the first direction DR1 in the emission area EA.

Each pattern BNP may partially overlap with at least one alignment electrode ALE in at least the emission area EA. For example, the first pattern BNP1 may be provided at the bottom of (or below) the first alignment electrode ALE1 to overlap with one area of the first alignment electrode ALE1, the second pattern BNP2 may be provided at the bottom of (or below) the second and third alignment electrodes ALE2 and ALE3 to overlap with one areas of the second and third alignment electrodes ALE2 and ALE3, and the third pattern BNP3 may be provided at the bottom of the fourth alignment electrode ALE4 to overlap with one area of the fourth alignment electrode ALE4.

When the patterns BNP are provided at the bottom of (or below) one area of each of the alignment electrodes ALE, the one area of each of the alignment electrodes ALE may protrude in an upper direction of the pixel PXL in an area in which the patterns BNP are formed. Accordingly, a wall structure may be formed at the periphery of the light emitting elements LD. For example, the wall structure may be formed in the emission area EA to oppose (or face) first and second end portions of the light emitting elements LD.

In one or more embodiments, when the patterns BNP and/or the alignment electrodes ALE include a reflective material, a reflective wall structure may be formed at the periphery of the light emitting elements LD. Accordingly, light emitted from the light emitting elements LD is further oriented (or directed) in the upper direction of the pixel PXL (e.g., a front direction of the display panel DP, which includes a predetermined viewing angle range), thereby improving the light efficiency of the pixel PXL.

In one or more embodiments, at least one pattern BNP may extend from the emission area EA to the non-emission area NEA. The at least one pattern BNP may overlap with an edge area of the bank BNK at a boundary between the non-emission area NEA and the separation area SPA, e.g., a lower end edge area and/or an upper end edge area with respect to the emission area EA. For example, the second pattern BNP2 may have a shape vertically symmetrical with respect to the emission area EA. However, the present disclosure is not limited thereto. For example, in one or more embodiments, the second pattern BNP2 may extend even to the separation area SPA. Similarly to the second pattern BNP2, the first pattern BNP1 and the third pattern BNP3 may extend from the emission area EA to the non-emission area NEA. In a manufacturing process of the pixel PXL, an electric field (and an electric-osmosis or alternating current electric-osmosis (ACEO) phenomenon according to the electric field) may be uniformly generated between the first, second, third, and fourth alignment electrodes ALE1, ALE2, ALE3, and ALE4 disposed on the first to third patterns BNP1, BNP2, and BNP3 in the emission area EA. For example, the electric field may be uniformly generated even at an edge of the emission area EA, which is adjacent to the non-emission area NEA, and the light emitting elements LD may be more uniformly disposed between the first, second, third, and fourth alignment electrodes ALE1, ALE2, ALE3, and ALE4.

The alignment electrodes ALE may be provided in at least the emission area EA. The alignment electrodes ALE may be spaced from each other along the first direction DR1 in the emission area EA, and each of the alignment electrodes ALE may extend in the second direction DR2. Also, the alignment electrodes ALE may extend to the separation area SPA via the non-emission area NEA from the emission area EA, and may be cut in the separation area SPA. For example, each of the first to fourth alignment electrodes ALE1 to ALE4 may extend from the emission area EA to the separation area SPA and may be cut in the separation area SPA (or a removal area RA in the separation area SPA), to be separated from alignment electrodes ALE of an adjacent pixel PXL. In one or more embodiments, at least one of the alignment electrodes ALE, e.g., the second alignment electrode ALE2 is not cut in the separation area SPA but may be integrally connected to a second alignment electrode ALE2 of an adjacent pixel PXL (e.g., an adjacent pixel PXL in the second direction DR2).

The first and second connection electrodes ALE5 and ALE6 may be provided in at least the separation area SPA, and may be spaced from the alignment electrodes ALE along the first direction DR1. For example, the first connection electrode ALE5 may extend from one left side point of the first alignment electrode ALE1 to the non-emission area NEA. The second connection electrode ALE6 may be disposed at a right side of the fourth alignment electrode ALE4.

The first and second connection electrodes ALE5 and ALE6 may be electrically connected to the pixel circuit PXC and/or a power line (e.g., a predetermined power line) through respective contact parts (or contact holes). For example, the first connection electrode ALE5 may be electrically connected to the pixel circuit PXC (see FIG. 3C) and/or the first power line PL1 (see FIG. 3C) through a first contact part CNT1 (e.g., see, FIG. 5B), and the second connection electrode ALE6 may be electrically connected to the second power line PL2 (see FIG. 3C) through a second contact part CNT2 (e.g., see, FIG. 5B). The first and second contact parts CNT1 and CNT2 may be formed in at least one insulating layer (e.g., a passivation layer PSV shown in FIG. 5B) covering the pixel circuit PXC (see FIG. 3C).

The first and second contact parts CNT1 and CNT2 may be formed in the separation area SPA or the non-emission area NEA. For example, the first contact part CNT1 may be formed in the non-emission area NEA, and the second contact part CNT2 may be formed in the separation area. The positions of the first and second contact parts CNT1 and CNT2 are not limited thereto, and may be variously changed corresponding to the arrangement of the pixel circuit PXC (or the first transistor M1 (see FIG. 3C), the first power line PL1, and the second power line PL2. The shapes of the first and second connection electrodes ALE5 and ALE6 may be variously changed according to the positions of the first and second contact parts CNT1 and CNT2.

In some embodiments, the first and second connection electrodes ALE5 and ALE6 may be connected to any one pixel electrode ELT through a contact part. For example, the first connection electrode ALE5 may be connected to the first pixel electrode ELT1 through a fifth contact part CNT5 (or first contact hole), and the second connection electrode ALE6 may be connected to the second pixel electrode ELT2 through a sixth contact part CNT6 (or second contact hole). The fifth contact part CNT5 and the sixth contact part CNT6 may be provided in the separation area SPA. For example, the fifth contact part CNT5 and the sixth contact part CNT6 may be formed in at least one insulating layer (e.g., a second insulating layer INS2 and the first insulating layer INS1 shown in FIG. 5B) covering the first and second connection electrodes ALE5 and ALE6 (and the alignment electrodes ALE). Also, although will be described later with reference to FIG. 5B, when the first and second connection electrodes ALE5 and ALE6 (and the alignment electrodes ALE (e.g., ALE1, ALE2, ALE3, and ALE4) have a multi-layered structure (e.g., a double-layered structure) including a plurality of electrode layers, the fifth contact part CNT5 and the sixth contact part CNT6 may be formed in one electrode layer among the plurality of electrode layers. In one or more embodiments, when the first and second connection electrodes ALE5 and ALE6 include a first electrode layer and a second electrode layer, which are sequentially stacked, the fifth contact part CNT5 and the sixth contact part CNT6 may be formed in the second electrode layer. The first pixel electrode ELT1 may be in contact with the first electrode layer (or a top surface of the first electrode layer, which is exposed by the fifth contact part CNT5) of the first connection electrode ALE5 and a side surface of the second electrode layer, and the second pixel electrode ELT2 may be in contact with the first electrode layer of the second connection electrode ALE6 and a side surface of the second electrode layer. Because contact areas between the first and second pixel electrode ELT1 and ELT2 and the first and second connection electrodes ALE5 and ALE6 relatively increase, contact resistances between the first and second pixel electrode ELT1 and ELT2 and the first and second connection electrodes ALE5 and ALE6 can decrease, and a failure caused by contact resistance (or signal attenuation caused by the contact resistance, resistance-capacitance delay) can be reduced or prevented. In addition, when one of the first and second electrode layers has a relatively high electrical conductivity (or conductivity), the contact resistance and the resistance-capacitance delay can be further reduced.

At least some of the alignment electrodes ALE may be connected to the pixel circuit PXC and/or a power line (e.g., a predetermined power line) through contact parts. For example, the first alignment electrode ALE1 may be connected to the first power line PL1 (see FIG. 3C) through a first dummy alignment electrode ALE_D1 and a third contact part CNT3, and the fourth alignment electrode ALE4 may be connected to the first power line PL1 through a second dummy alignment electrode ALE_D2 and a fourth contact part CNT4. The second alignment electrode ALE2 and the third alignment electrode ALE3 may be connected to the second power line PL2 (see FIG. 3C) through a third dummy alignment electrode ALE_D3 and a dummy contact part CNT_D. For example, each of the first to fourth alignment electrodes ALE1 to ALE4 may be cut in the separation area SPA (or the removal area RA in the separation area SPA), to be separated from the first and second power lines PL1 and PL2. That is, the first and second power lines PL1 and PL2 may be used to decrease line resistance in a process of aligning the light emitting elements LD between the alignment electrodes ALE, and connection between the alignment electrodes ALE and the first and second power lines PL1 and PL2 may be cut after the light emitting elements LD are arranged.

Each alignment electrode ALE may be located on one of the patterns BNP. For example, the first alignment electrode ALE1 may be located on one area of the first pattern BNP1, the second and third alignment electrodes ALE2 and ALE3 may be located on different areas of the second pattern BNP2, and the fourth alignment electrode ALE4 may be located on one area of the third pattern BNP3. In one or more embodiments, when the third alignment electrode ALE3 is located between the first and second alignment electrodes ALE1 and ALE2, the third alignment electrode ALE3 may be located on a left area of the second pattern BNP2, and the second alignment electrode ALE2 may be located on a right area of the second pattern BNP2. Although a case where the first alignment electrode ALE1 partially overlaps with the first pattern BNP1 and the fourth alignment electrode ALE4 partially overlaps with the third pattern BNP3 is illustrated in FIG. 4, the present disclosure is not limited thereto. For example, the first alignment electrode ALE1 may cover the first pattern BNP1, and the fourth alignment electrode ALE4 may cover the third pattern BNP3.

Each alignment electrode ALE may have a uniform width in the emission area EA. In one or more embodiments, each of the first, second, third, and fourth electrodes ALE1, ALE2, ALE3, and ALE4 may have a linear pattern shape having a constant width in the emission area EA, when viewed on a plane. The alignment electrodes ALE may have widths equal to or different from each other.

Also, each alignment electrode ALE may be continuously formed along the second direction DR2 in the emission area EA. For example, each alignment electrode ALE may extend in the second direction DR2 not to be cut in the emission area EA.

A pair of alignment electrodes ALE adjacent to each other may be supplied with different signals in a process of aligning the light emitting elements LD, and may be spaced from each other at a uniform distance in the emission area EA. In addition, when assuming that at least two pairs of alignment electrodes ALE are provided in the emission area EA, each pair of alignment electrodes ALE may be spaced from each other at the same distance.

For example, it will be assumed that the first alignment electrode ALE1, the third alignment electrode ALE3, the second alignment electrode ALE2, and the fourth alignment electrode ALE4 are sequentially arranged along the first direction DR1 in the emission area EA, the first and third alignment electrodes ALE1 and ALE3 form a pair to be supplied with different alignment signals, and the second and fourth alignment electrode ALE2 and ALE4 form a pair to be supplied with different alignment signals. In the emission area EA, the first and third alignment electrodes ALE1 and ALE3 may be spaced from each other at a constant distance corresponding to a second distance along the first direction DR1, and the second and fourth alignment electrodes ALE2 and ALE4 may also be spaced from each other at a constant distance corresponding to the second distance along the first direction DR1.

In one or more embodiments, the second and third alignment electrodes ALE2 and ALE3 may be supplied with the same signal in the process of aligning the light emitting elements LD during the process of manufacturing the pixel PXL. The second and third alignment electrodes ALE2 and ALE3 may be spaced from each other at a distance equal to or different from the second distance. Also, the second and third alignment electrodes ALE2 and ALE3 may be integrally or non-integrally connected to each other in the process of aligning the light emitting elements LD.

In one or more embodiments, each alignment electrode ALE may have or may not have a bending part in the non-emission area NEA and/or the separation area SPA, and the shape and/or size of each alignment electrode ALE in the other area except the emission area EA is not particularly limited. For example, the shapes and/or sizes of the alignment electrodes ALE may be variously changed in the non-emission area NEA and/or the separation area SPA.

Each of the light emitting elements LD may be disposed between a pair of patterns BNP, and may be connected between a pair of pixel electrodes ELT.

For example, each first light emitting element LD1 may be disposed between the first and second patterns BNP1 and BNP2 to be electrically connected between the first and third pixel electrodes ELT1 and ELT3, and each second light emitting element LD2 may be disposed between the first and second patterns BNP1 and BNP2 to be electrically connected between the third and fourth pixel electrodes ELT3 and ELT4. In one or more embodiments, each first light emitting element LD1 may be disposed in a lower end area in an area between the first and second patterns BNP1 and BNP2, and a first end portion EP1 and a second end portion EP2 of the first light emitting element LD1 may be respectively connected to the first pixel electrode ELT1 and the third pixel electrode ELT3. In addition, each second light emitting element LD2 may be disposed in an upper end area in the area between the first and second patterns BNP1 and BNP2, and a first end portion EP1 and a second end portion EP2 of the second light emitting element LD2 may be respectively connected to the third pixel electrode ELT3 and the fourth pixel electrode ELT4.

Similarly, each third light emitting element LD3 may be disposed between the second and third patterns BNP2 and BNP3 to be electrically connected between the fourth and fifth pixel electrodes ELT4 and ELT5, and each fourth light emitting element LD4 may be disposed between the second and third patterns BNP2 and BNP3 to be electrically connected between the second and fifth pixel electrodes ELT2 and ELT5. In one or more embodiments, each third light emitting element LD3 may be disposed in an upper end area in an area between the second and third patterns BNP2 and BNP3, and a first end portion EP1 and a second end portion EP2 of the third light emitting element LD3 may be respectively connected to the fourth pixel electrode ELT4 and the fifth pixel electrode ELT5. In addition, each fourth light emitting element LD4 may be disposed in a lower end area in the area between the second and third patterns BNP2 and BNP3, and a first end portion EP1 and a second end portion EP2 of the fourth light emitting element LD4 may be respectively connected to the fifth pixel electrode ELT5 and the second pixel electrode ELT2.

In one or more embodiments, the first light emitting elements LD1 may be located in a left lower end area of the emission area EA, and the second light emitting elements LD2 may be located in a left upper end area of the emission area EA. The third light emitting elements LD3 may be located in a right upper end area of the emission area EA, and the fourth light emitting elements LD4 may be located in a right lower end area of the emission area EA. However, the arrangement and/or connection structure of the light emitting elements LD may be variously changed according to the structure of the light emitting unit EMU and/or the number of serial stages.

The pixel electrodes ELT may be provided in at least the emission area EA, and each of the pixel electrodes ELT may be provided at a position corresponding to at least one alignment electrode ALE and at least one light emitting element LD. For example, each pixel electrode ELT may be formed on each alignment electrode ALE and each light emitting element LD to overlap with the alignment electrode ALE and the light emitting element LD. Therefore, each pixel electrode ELT may be electrically connected to at least the light emitting element LD. In one or more embodiments, each pixel electrode ELT may be connected to one end portion of at least one light emitting element LD in the emission area.

The first pixel electrode ELT1 may be formed on a first area (e.g., a lower end area) of the first alignment electrode ALE1 and first end portions EP1 of the first light emitting elements LD1, to be electrically connected to the first end portions EP1 of the first light emitting elements LD1. For example, the first pixel electrode ELT1 may be connected to the first end portions EP1 of the first light emitting elements LD1 in the emission area EA.

The second pixel electrode ELT2 may be formed on a first area (e.g., a lower end area) of the second alignment electrode ALE2 and second end portions EP2 of the fourth light emitting elements LD4, to be electrically connected to the second end portions EP2 of the fourth light emitting elements LD4. For example, the second pixel electrode ELT2 may be connected to the second end portions EP2 of the fourth light emitting elements LD4 in the emission area EA.

Also, the second pixel electrode ELT2 may be electrically connected to the first, second, and third light emitting elements LD1, LD2, and LD3 via at least another pixel electrode ELT and/or at least another light emitting element LD. In one or more embodiments, the second pixel electrode ELT2 may be electrically connected to second end portions EP2 of the first light emitting elements LD1 via the third pixel electrode ELT3, the second light emitting element LD2, the fourth pixel electrode ELT4, the third light emitting element LD3, the fifth pixel electrode ELT5, and the fourth light emitting element LD4.

The third pixel electrode ELT3 may be formed on a first area (e.g., a lower end area) of the third alignment electrode ALE3 and the second end portions EP2 of the first light emitting elements LD1, to be electrically connected to the second end portions EP2 of the first light emitting elements LD1. Also, the third pixel electrode ELT3 may be formed on a second area (e.g., an upper end area) of the first alignment electrode ALE1 and first end portions EP1 of the second light emitting elements LD2, to be electrically connected to the first end portions EP1 of the second light emitting elements LD2. For example, the third pixel electrode ELT3 may be connected to the second end portions EP2 of the first light emitting elements LD1 and the first end portions EP1 of the second light emitting elements LD2 in the emission area EA.

To this end, the third pixel electrode ELT3 may have a bent shape. For example, the third pixel electrode ELT3 may have a structure in which the third pixel electrode ELT3 is warped or curved at a boundary between an area in which at least one first light emitting element LD1 is arranged and an area in which at least one second light emitting element LD2 is arranged.

Also, the third pixel electrode ELT3 may be located between the first and second pixel electrodes ELT1 and ELT2, and may be electrically connected between the first and second pixel electrodes ELT1 and ELT2 through the light emitting elements LD. For example, the third pixel electrode ELT3 may be connected to the first pixel electrode ELT1 through at least one first light emitting element LD1, and may be connected to the second pixel electrode ELT2 through at least one second light emitting element LD2, the fourth pixel electrode ELT4, at least on third light emitting element LD3, the fifth pixel electrode ELT5, and at least one fourth light emitting element LD4.

The fourth pixel electrode ELT4 may be formed on a second area (e.g., an upper end area) of the third alignment electrode ALE3 and second end portions EP2 of the second light emitting elements LD2, to be electrically connected to the second end portions EP2 of the second light emitting elements LD2. Also, the fourth pixel electrode ELT4 may be formed on a second area (e.g., an upper end area) of the fourth alignment electrode ALE4 and first end portions EP1 of the third light emitting elements LD3, to be electrically connected to the first end portions EP1 of the third light emitting elements LD3. For example, the fourth pixel electrode ELT4 may be connected to the second end portions EP2 of the second light emitting elements LD2 and the first end portions EP1 of the third light emitting elements LD3 in the emission area EA.

To this end, the fourth pixel electrode ELT4 may have a bent shape. For example, the fourth pixel electrode ELT4 may have a structure in which the fourth pixel electrode ELT4 is warped or curved at a boundary between an area in which at least one second light emitting element LD2 is arranged and an area in which at least one third light emitting element LD3 is arranged or at the periphery thereof. In one or more embodiments, the fourth pixel electrode ELT4 does not extend to the non-emission area NEA, but may be formed in only the emission area EA. However, the present disclosure is not limited thereto.

Also, the fourth pixel electrode ELT4 may be electrically connected between the first and second pixel electrodes ELT1 and ELT2 through the light emitting elements LD. For example, the fourth pixel electrode ELT4 may be connected to the first pixel electrode ELT1 through at least one first light emitting element LD1, the third pixel electrode ELT3, and/or at least one second light emitting element LD2, and may be connected to the second pixel electrode ELT2 through at least one third light emitting element LD3, the fifth pixel electrode ELT5, and/or at least one fourth light emitting element LD4.

The fifth pixel electrode ELT5 may be formed on a second area (e.g., an upper end area) of the second alignment electrode ALE2 and second end portions EP2 of the third light emitting elements LD3, to be electrically connected to the second end portions EP2 of the third light emitting elements LD3. Also, the fifth pixel electrode ELT5 may be formed on a first area (e.g., a lower end area) of the fourth alignment electrode ALE4 and first end portions EP1 of the fourth light emitting elements LD4, to be electrically connected to the first end portions EP1 of the fourth light emitting elements LD4. For example, the fifth pixel electrode ELT5 may be connected to the second end portions EP2 of the third light emitting elements LD3 and the first end portions EP1 of the fourth light emitting elements LD4 in the emission area EA.

To this end, the fifth pixel electrode ELT5 may have a bent shape. For example, the fifth pixel electrode ELT5 may have a structure in which the fifth pixel electrode ELT5 is warped or curved at a boundary between an area in which at least one third light emitting element LD3 is arranged and an area in which at least one fourth light emitting element LD4 is arranged.

Also, the fifth pixel electrode ELT5 may be electrically connected between the first and second pixel electrodes ELT1 and ELT2 through the light emitting elements LD. For example, the fifth pixel electrode ELT5 may be connected to the first pixel electrode ELT1 through at least one first light emitting element LD1, the third pixel electrode ELT3, at least one second light emitting element LD2, the fourth pixel electrode ELT4, and/or at least one third light emitting element LD3, and may be connected to the second pixel electrode ELT2 through at least one fourth light emitting element LD4.

In one or more embodiments of the present disclosure, at least one pixel electrode ELT may extend to the separation area SPA via the non-emission area NEA from the emission area EA, and each of the pixel electrodes ELT may be connected to any one alignment electrode ALE through a corresponding contact part in the separation area SPA. For example, the first and second pixel electrodes ELT1 and ELT2 may extend from the emission area EA to the separation area SPA. In the separation area SPA, the first pixel electrode ELT1 may be connected to the first connection electrode ALE5 through the fifth contact part CNT5, and the second pixel electrode ELT2 may be connected to the second connection electrode ALE6 through the sixth contact part CNT6.

In the above-described manner, light emitting elements LD disposed between alignment electrodes ALE and/or patterns BNP corresponding thereto may be connected in a desired form by using the pixel electrodes ELT. For example, the first light emitting elements LD1, the second light emitting elements LD2, the third light emitting elements LD3, and the fourth light emitting elements LD4 may be sequentially connected in series by using the pixel electrodes ELT.

In order to increase the utilization of light emitting elements LD supplied to each emission area EA, the light emitting elements LD may be arranged such that a larger number (or ratio) of light emitting elements LD are arranged in a specific direction in each emission area EA by adjusting alignment signals for aligning the light emitting elements LD, by forming a magnetic field, or the like. A larger number of light emitting elements LD may be connected along a direction in which the light emitting elements LD are arranged, by using the pixel electrodes ELT. Accordingly, the utilization of the light emitting elements LD can be increased, and the light efficiency of the pixel PXL can be improved.

In one or more embodiments, each pixel electrode ELT is directly formed on first and second end portions EP1 or EP2 of adjacent light emitting elements LD, to be connected to the first and second end portions EP1 or EP2 of the light emitting elements LD.

In one or more embodiments, the pixel electrodes ELT and the first and second connection electrodes ALE5 and ALE6 may be connected to each other through each contact part at the outside of the emission area EA (e.g., the contact part is formed in the separation area SPA). The contact part is formed while avoiding the emission area EA in which the light emitting elements LD are supplied and arranged, so that a more uniform electric field is formed in the emission area EA in the process of aligning the light emitting elements LD. Accordingly, separation of the light emitting elements LD can be prevented.

The bank BNK may be provided in the non-emission area NEA to be around (or surround) the emission area EA and the separation area SPA. Also, the bank BNK may be provided between an outer portion of each pixel area PXA and/or adjacent pixel areas PXA to include a plurality of openings OPA corresponding to emission areas EA and separation areas SPA of pixels PXL. In one or more embodiments, in each pixel area PXA, the bank BNK may include a first opening OPA1 corresponding to the emission area EA and a second opening OPA2 corresponding to the separation area SPA.

The bank BNK may be a dam structure which defines each emission area EA to which light emitting elements LD are to be supplied, in a process of supplying the light emitting elements LD to each pixel PXL. For example, each emission area EA is partitioned by the bank BNK, so that a desired amount and/or a desired kind of light emitting element ink can be supplied to the emission area EA.

The bank BNK may include at least one light blocking material and/or at least one reflective material, and accordingly, light leakage between adjacent pixels PXL can be prevented. For example, the bank BNK may include at least one black matrix material and/or at least one color filter material. In one or more embodiments, the bank BNK may be formed as a black opaque pattern capable of blocking light from being transmitted therethrough. In one or more embodiments, a reflective layer or the like may be formed on a surface (e.g., a sidewall) of the bank BNK so as to improve the light efficiency of each pixel PXL.

The bank BNK may be formed in a layer different from that of the patterns BNP through a process separate from that of forming the patterns BNP. In one or more embodiments, the bank BNK may be formed on the top of an insulating layer (e.g., the first insulating layer INS1 or the second insulating layer INS2 shown in FIGS. 5A and 5B) provided on the patterns BNP and the alignment electrodes ALE.

The bank BNK may be provided at the same layer as the patterns BNP or may be provided in a layer different from that of the patterns BNP. When the bank BNK and the patterns BNP are sequentially formed, the positions and/or forming order of the bank BNK and the patterns BNP is not particularly limited. Also, the bank BNK may be integrally formed with the patterns BNP or may be formed separately from the patterns BNP.

In one or more embodiments, the patterns BNP may be first formed on the one surface of the base layer BSL. Subsequently, the alignment electrodes ALE and the bank BNK may be sequentially formed on the one surface of the base layer BSL, on which the patterns BNP are formed. In one or more embodiments, the alignment electrodes ALE may be first formed on the one surface of the base layer BSL. Subsequently, the patterns BNP and the bank BNK may be concurrently (or simultaneously) or sequentially formed on the one surface of the base layer BSL, on which the alignment electrodes ALE are formed. In one or more embodiments, the patterns BNP and the bank BNK may be first formed on the one surface of the base layer BSL. Subsequently, the alignment electrodes ALE may be formed on the one surface of the base layer BSL, on which the patterns BNP and the bank BNK are formed.

When the patterns BNP and the bank BNK are concurrently formed (e.g., simultaneously formed), the patterns BNP and the bank BNK may be formed to be connected to each other or not to be connected to each other. In one or more embodiments, the patterns BNP and the bank BNK may be integrally formed such that lower surfaces, etc. are connected to each other. Alternatively, although the patterns BNP and the bank BNK are concurrently formed (e.g., simultaneously formed), the patterns BNP and the bank BNK may be formed not to be connected to each other. In one or more embodiments, the patterns BNP and the bank BNK may be concurrently formed (e.g., simultaneously formed) at the same layer, and may be separated from each other while having patterns independent from each other.

Figure 5A:
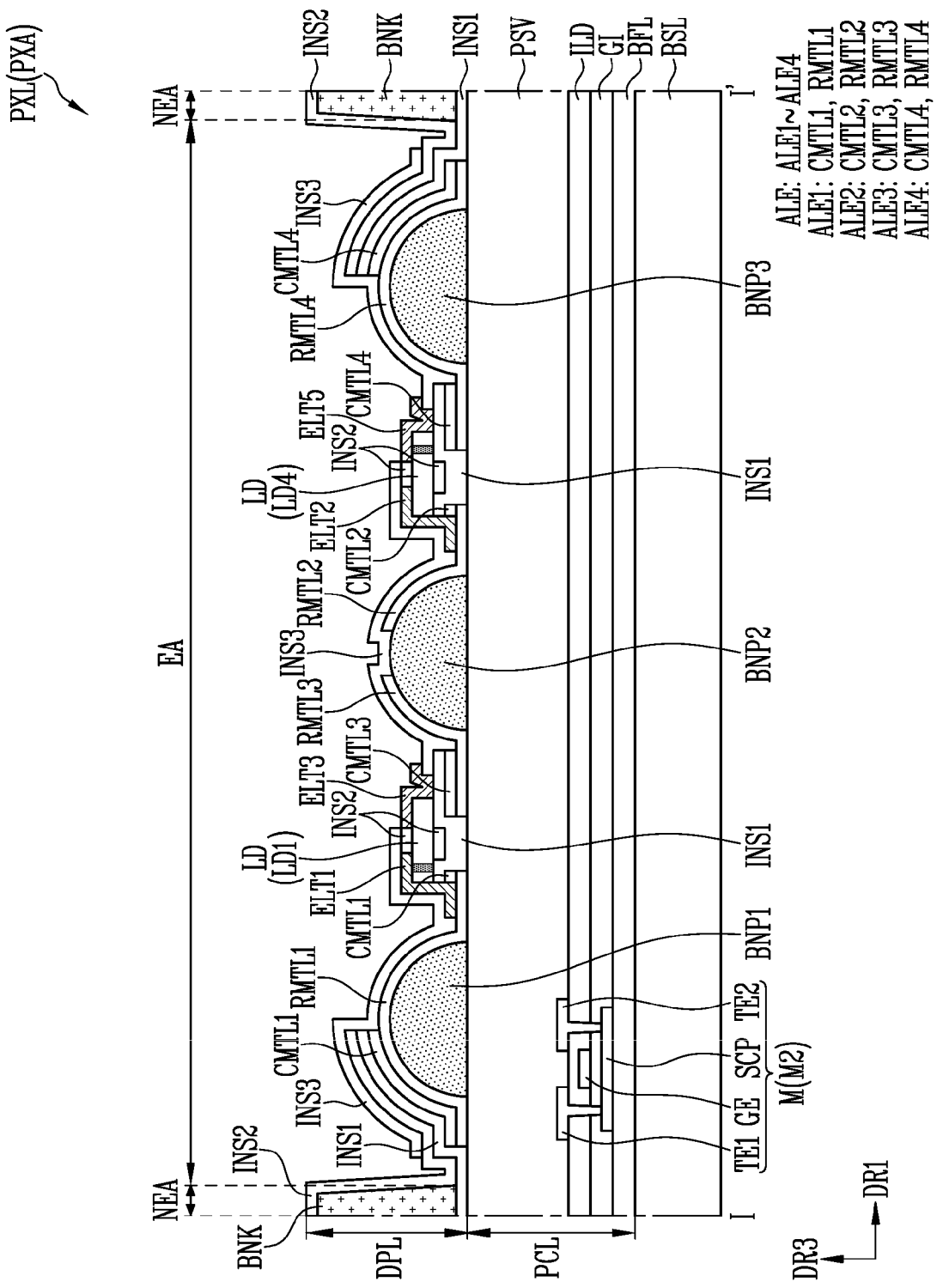
FIG. 5A is a sectional view illustrating one or more embodiments of the pixel taken along the line I-I' shown in FIG. 4.
Figure 5B:
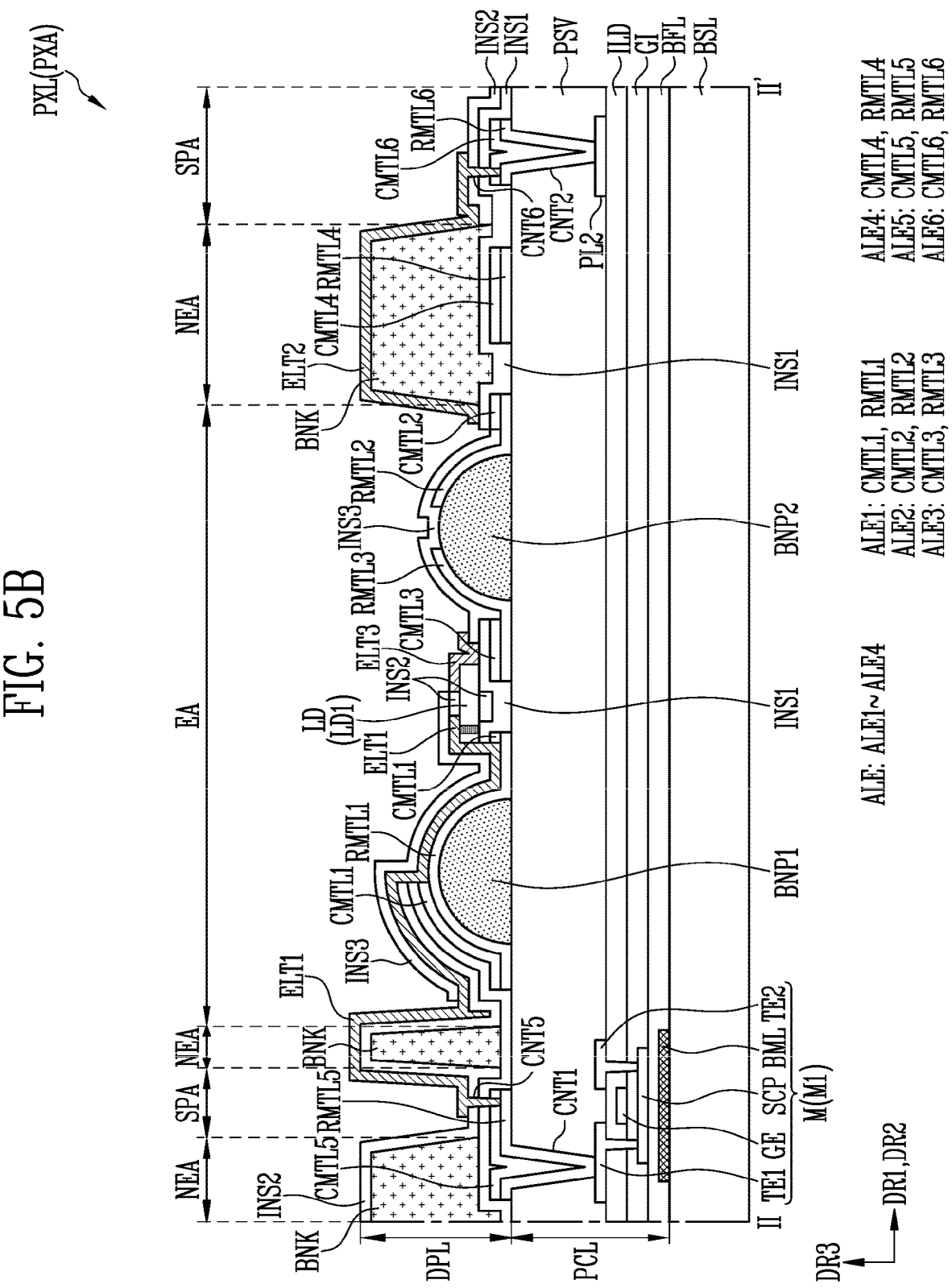
FIG. 5B is a sectional view illustrating one or more embodiments of the pixel taken along the line II-II' shown in FIG. 4.
Figure 5C:
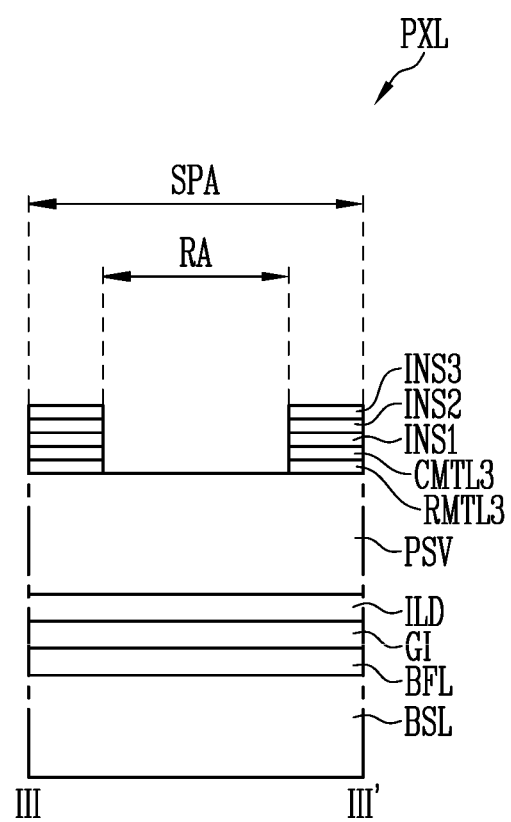
FIG. 5C is a sectional view illustrating one or more embodiments of the pixel taken along the line III-III' shown in FIG. 4.

FIG. 5A is a sectional view illustrating an embodiment of the pixel taken along the line I-I' shown in FIG. 4. In FIG. 5A, an arbitrary transistor M (e.g., the second transistor M2 shown in FIGS. 3A-3C) which does not include any bottom metal layer BML is illustrated as an example of circuit elements to be disposed in a pixel layer PCL. FIG. 5B is a sectional view illustrating an embodiment of the pixel taken along the line II-II' shown in FIG. 4. In FIG. 5B, a section of a pixel PXL including a contact part is illustrated. Also, in FIG. 5B, a transistor M (e.g., the first transistor M1 shown in FIGS. 3A-3C) which is connected to a first connection electrode ALE5 through a first contact part CNT1 and includes a bottom metal layer BML is illustrated as an example of circuit elements disposed in the circuit layer PCL, and a second power line PL2 connected to a second alignment electrode ALE2 through a second contact part CNT2 is illustrated as an example, to be disposed in the circuit layer PCL. FIG. 5C is a sectional view illustrating an embodiment of the pixel taken along the line III-III' shown in FIG. 4.

Referring to FIGS. 2, 3A-3C, 4, 5A, 5B, and 5C, the pixel PXL and the display device DD (see FIG. 2) having the same may include a circuit layer PCL (or pixel circuit layer) and a display layer DPL (or display element layer), which are disposed on one surface of a base layer BSL to overlap with each other in a thickness direction, for example, a third direction DR3 of the base layer BSL. For example, the display area DA may include the circuit layer PCL disposed on the one surface of the base layer BSL and the display layer DPL disposed on the circuit layer PCL. However, mutual positions of the circuit layer PCL and the display layer DPL on the base layer BSL may be changed in accordance with embodiments. When the circuit layer PCL and the display layer DPL overlap with each other in layers separate from each other, each layout space for forming the pixel circuit (see "PXC" shown in FIGS. 3A-3C) and the light emitting unit (see "EMU" shown in FIGS. 3A-3C) can be sufficiently secured on a plane.

Circuit elements (e.g., transistors M) constituting a pixel circuit PXC of a corresponding pixel PXL and various types of lines connected thereto may be disposed in each pixel area PXA of the circuit layer PCL. In addition, alignment electrodes ALE, light emitting elements LD, and/or pixel electrodes ELT, which constitute a light emitting unit EMU of a corresponding pixel PXL, may be disposed in each pixel area PXA of the display layer DPL.

The circuit layer PCL may include a plurality of insulating layers (or insulating films) in addition to the circuit elements and the lines. For example, the circuit layer PCL may include a buffer layer BFL, a gate insulating layer GI, an interlayer insulating layer ILD, and/or a passivation layer PSV, which are sequentially stacked on the one surface of the base layer BSL.

Also, the circuit layer PCL may selectively further include a first conductive layer including a bottom metal layer BML and the like, which are disposed under at least one transistor M (e.g., a first transistor M1).

In one or more embodiments, the first conductive layer may include a bottom metal layer BML that is disposed between the base layer BSL and the buffer layer BFL and overlaps with a gate electrode GE and/or a semiconductor pattern SCP of at least one transistor M (e.g., the first transistor M1) in the third direction DR3.

In one or more embodiments, the bottom metal layer BML may be connected to one electrode of a corresponding transistor M. In one or more embodiments, when the first transistor M1 includes the bottom metal layer BML, the bottom metal layer BML may be connected to a source electrode (or drain electrode) of the first transistor M1.

The buffer layer BFL may be disposed on the one surface of the base layer BSL, on which the first conductive layer is selectively formed. The buffer layer BFL may prevent an impurity from being diffused into each circuit element.

A semiconductor layer may be disposed on the buffer layer BFL. The semiconductor layer may include a semiconductor pattern SCP of each transistor M, and the like. The semiconductor pattern SCP may include a channel region overlapping with a gate electrode GE in the third direction DR3, and first and second conductive regions (e.g., source and drain regions) disposed at both sides of the channel region.

The gate insulating layer GI may be disposed on the semiconductor layer and the buffer layer BFL. In addition, a second conductive layer may be disposed on the gate insulating layer GI.

The second conductive layer may include a gate electrode GE of each transistor M. Also, the second conductive layer may further include one electrode of a storage capacitor Cst and/or a line (e.g., a predetermined line).

The interlayer insulating layer ILD may be disposed on the second conductive layer and the gate insulating layer GI. In addition, a third conductive layer may be disposed on the interlayer insulating layer ILD.

The third conductive layer may include first and second transistor electrodes TE1 and TE2 of each transistor M. The first and second transistor electrodes TE1 and TE2 may be source and drain electrodes. One of the first and second transistor electrodes TE1 and TE2, e.g., a first transistor electrode of the first transistor M1 may be directly connected to a first connection electrode ALE5 of each light emitting unit EMU through a first contact part CNT1.

Also, the third conductive layer may include a line (e.g., a predetermined line) (e.g., a second power line (see "PL2" shown in FIGS. 3A-3C) and/or a first power line (see "PL1" shown in FIGS. 3A-3C).

The second power line PL2 may be directly connected to a second connection electrode ALE6 of each light emitting unit EMU through a second contact part CNT2. Each of the first and second contact parts CNT1 and CNT2 may be configured as a via hole and/or a contact hole, formed in the passivation layer PSV.

In one or more embodiments, an additional interlayer insulating layer may be disposed on the third conductive layer, and a fourth conductive layer may be disposed on the additional interlayer insulating layer. A line (e.g., a predetermined line) may be disposed on the fourth conductive layer. In addition, a bridge pattern may be provided on the first conductive layer, and the first connection electrode ALE5 may be connected to the first transistor electrode TE1 (or second transistor electrode TE2) of the first transistor M1 through the first contact part CNT1 and the bridge pattern.

The positions of the first power line PL1 and/or the second power line PL2 may be variously changed in accordance with embodiments. In one or more embodiments, each of the first and second power lines PL1 and PL2 may be provided in the first conductive layer, the second conductive layer, or the third conductive layer. In addition, when the first power line PL1 and/or the second power line PL2 have a multi-layered structure, the first power line PL1 and/or the second power line PL2 may include multi-layered lines provided in at least two layers among the first to third conductive layers.

The passivation layer PSV may be provided on the third conductive layer. In one or more embodiments, the passivation layer PSV may include at least an organic insulating layer, and substantially planarize a surface of the circuit layer PCL. In one or more embodiments, the passivation layer PSV may be configured as a multi-layer including an inorganic insulating layer and an organic insulating layer. The display layer DPL may be disposed on the top of the passivation layer PSV.

The display layer DPL may include a light emitting unit (see "EMU" shown in FIGS. 3A-3C) of each pixel PXL. For example, the display layer DPL may include alignment electrodes ALE of each pixel PXL, first and second connection electrodes ALE5 and ALE6, light emitting elements LD disposed between the alignment electrodes ALE, and pixel electrodes ELT. In one or more embodiments, at least some pixel electrodes ELT may be connected to different alignment electrodes ALE through a contact part (or opening) formed in first and second insulating layers INS1 and INS2.

Also, the display layer DPL may include patterns BNP disposed at the bottom of (or below) the alignment electrodes ALE and a first insulating layer INS1 disposed on the top of the alignment electrodes ALE. In an example, the display layer DPL may include patterns BNP located on the bottom of one areas of the alignment electrodes ALE to allow the one area of each of the alignment electrodes ALE to protrude in an upper direction, and a first insulating layer INS1 disposed on the top of the alignment electrodes ALE to cover the alignment electrodes ALE at or in least the emission area EA. In addition, the display element DPL may further include at least one conductive layer and/or at least one insulating layer.

For example, the display layer DPL may include patterns BNP, alignment electrodes ALE, a first insulating layer INS1, light emitting elements LD, a second insulating layer INS2, first, second, and fourth pixel electrodes ELT1, ELT2, and ELT4, a third insulating layer INS3, and third and fifth pixel electrodes ELT3 and ELT5.

The patterns BNP may be disposed on the one surface of the base layer BSL, on which the circuit layer PCL is formed. For example, the patterns BNP may be provided on the top of the passivation layer PSV. The patterns BNP may protrude in a height or thickness direction of the pixel PXL (e.g., the third direction DR3) on the one surface of the base layer BSL. Accordingly, one areas of the alignment electrodes ALE disposed on the patterns BNP may protrude upwardly, and the alignment electrodes ALE may have inclined surfaces.

The patterns BNP may include an insulating material including at least one inorganic material and/or at least one organic material. In one or more embodiments, the patterns BNP may include at least one inorganic layer including various inorganic insulating materials such as silicon nitride ($SiN_x$), silicon oxide ($SiO_x$), and silicon oxynitride ($Si-O_xN_y$). Alternatively, the patterns BNP may include at least one organic layer including various organic insulating materials such as a photoresist material, and/or be configured with a single- or multi-layered insulator including a combination of organic/inorganic materials.

A reflective wall structure may be formed at the periphery of the light emitting elements LD by the patterns BNP and the alignment electrodes ALE disposed on the top thereof. In one or more embodiments, when the alignment electrodes ALE include a reflective electrode layer, light emitted through first and second end portions EP1 and EP2 of the light emitting elements LD may be reflected by the reflective electrode layer, to be output in an upper direction (e.g., an image display direction) of each pixel PXL.

The patterns BNP may have various shapes. In one or more embodiments, the patterns BNP may have a side surface having a curved shape or a section having a semicircular (or semi-elliptical) shape with respect to the base layer BSL as shown in FIGS. 5A and 5B. In one or more embodiments, the patterns BNP may have an inclined surface inclined at an angle of a desired range (e.g., a predetermined range) or a side surface having a stepped shape. Conductive layers (or electrodes) and/or insulating layers, which are disposed on the top of the patterns BNP, may have a surface profile corresponding to the patterns BNP.

The alignment electrodes ALE may be disposed on the top of the patterns BNP. The alignment electrodes ALE may be disposed to be spaced from each other in each emission area EA. In one or more embodiments, each alignment electrode ALE may have a separated pattern for each pixel PXL. For example, each of first to fourth alignment electrodes ALE1 to ALE4 may have an independent pattern of which both ends are cut in a separation area SPA (or a removal area RA shown in FIG. 5C) located at an outer portion of a corresponding pixel area PXA or between adjacent pixel areas PXA in the second direction DR2.

First and second connection electrodes ALE5 and ALE6 may be formed through the same process as the alignment electrodes ALE.

In one or more embodiments, each of the first and second connection electrodes ALE5 and ALE6 and the alignment electrodes ALE may have a multi-layered structure including a plurality of electrode layers. For example, each of the first and second connection electrodes ALE5 and ALE6 and the alignment electrodes ALE may include a first electrode layer and a second electrode layer. One of the first electrode layer and the second electrode layer may have a relatively high reflectivity, and the other one of the first electrode layer and the second electrode layer may have a relatively high electrical conductivity (or conductivity). That is, one of the first electrode layer and the second electrode layer may be made of a material having a constant reflectivity to allow light emitted from the light emitting elements LD to advance in the third direction DR3 (or an image display direction of the display device), and the other one of the first electrode layer and the second electrode layer may include a low-resistance material to decrease resistance (or contact resistance).

In one or more embodiments, first electrode layers RMTL1 to RMTL6 (or first conductive layers) may have a relatively high reflectivity, and second electrode layers CMTL1 to CMTL6 (or second conductive layers) may have a relatively high electrical conductivity.

In one or more embodiments, the first electrode layers RMTL1 to RMTL6 may include a metal such as silver (Ag), magnesium (Mg), aluminum (Al), platinum (Pt), palladium (Pd), gold (Au), nickel (Ni), neodymium (Nd), iridium (Ir), chromium (Cr), titanium (Ti), or any alloy thereof, and include a metal having a reflectivity higher than that of the second electrode layers CMTL1 to CMTL6. For example, the first electrode layers RMTL1 to RMTL6 may include aluminum (Al).

In one or more embodiments, the second electrode layers CMTL1 to CMTL6 may include a metal such as molybdenum (Mo), titanium (Ti), copper (Cu), aluminum (Al), silver (Ag), or any alloy thereof, and include a metal having an electrical conductivity higher than that of the first electrode layers RMTL1 to RMTL6. For example, the second electrode layers CMTL1 to CMTL6 may include molybdenum (Mo).

In one or more embodiments, a fifth contact part CNT5 exposing a first electrode layer RMTL5 of the first connection electrode ALE5 may be formed in a second contact layer CMTL5 of the first connection electrode ALE5. As shown in FIG. 5B, the first pixel electrode ELT1 may be in contact with a top surface of the first electrode layer RMTL5 of the first connection electrode ALE5 through the fifth contact part CNT5, and be in contact with a side surface of the second electrode layer CMTL5 of the first connection electrode ALE5. The contact resistance and resistance-capacitance between the first pixel electrode ELT1 and the first connection electrode ALE5 may decrease due to an increase in contact area between the first pixel electrode ELT1 and the first connection electrode ALE5 and a relatively high electrical conductivity of the second electrode layer CMTL5.

As compared with contact resistance (e.g., about 800 kΩ to about 1200 KΩ) of a connection electrode including only aluminum, contact resistance (e.g., about 51Ω) of the first connection electrode ALE5 including aluminum and molybdenum may decrease to a level of about $1/10^4$. In addition, as compared with contact resistance (e.g., about 420Ω) of a connection electrode including aluminum and indium zinc oxide (IZO), the contact resistance of the first connection electrode ALE5 may decrease to a level of about 1/8.

Similarly, a sixth contact part CNT6 exposing a first electrode layer RMTL6 of the second connection electrode ALE6 may be formed in a second electrode layer CMTL6 of the second connection electrode ALE6. As shown in FIG. 5B, the second pixel electrode ELT2 may be in contact with a top surface of the first electrode layer RMTL6 of the second connection electrode ALE6 through the sixth contact part CNT6, and may be in contact with a side surface of the second electrode layer CMTL6 of the second connection electrode ALE6.

In one or more embodiments, a first electrode layer may be exposed by a second electrode at an inclined surface of each of alignment electrodes ALE opposing (or facing) the light emitting elements LD. That is, only the second electrode layer may be selectively removed (e.g., etched) at the inclined surface of each of the alignment electrodes ALE opposing (or facing) the light emitting elements LD.

As shown in FIG. 5A, at an inclined surface of the first alignment electrode ALE1 opposing (or facing) the light emitting elements LD, only a first electrode RMTL1 of the first alignment electrode ALE1 may be disposed, and a second electrode layer CMTL1 of the first alignment electrode ALE1 may not be disposed. Light emitted from the light emitting elements LD may be reflected in the third direction DR3 by the first electrode RMTL1 of the first alignment electrode ALE1, which has a relatively high reflectivity, and the light emission rate of the pixel may be maintained. That is, when the second electrode layer CMTL1 of the first alignment electrode ALE1 is disposed at the inclined surface of the first alignment electrode ALE1, the light emission rate of the pixel is lowered, and therefore, the second electrode layer CMTL1 of the first alignment electrode ALE1 may not be disposed at the inclined surface of the first alignment electrode ALE1.

Similarly, at an inclined surface of the second alignment electrode ALE2 opposing (or facing) the light emitting elements LD, only a first electrode RMTL2 of the second alignment electrode ALE2 may be disposed, and a second electrode layer CMTL2 of the second alignment electrode ALE2 may not be disposed. At an inclined surface of the third alignment electrode ALE3 opposing (or facing) the light emitting elements LD, only a first electrode RMTL3 of the third alignment electrode ALE3 may be disposed, and a second electrode layer CMTL3 of the third alignment electrode ALE3 may not be disposed. At an inclined surface of the fourth alignment electrode ALE4 opposing (or facing) the light emitting elements LD, only a first electrode RMTL4 of the fourth alignment electrode ALE4 may be disposed, and a second electrode layer CMTL4 of the fourth alignment electrode ALE4 may not be disposed.

The first insulating layer INS1 (or first insulating pattern) may be disposed on one area of each of the first and second connection electrodes ALE5 and ALE6 and the alignment electrodes ALE. For example, the first insulating layer INS1 may be formed to cover the first and second connection electrodes ALE5 and ALE6. Also, the first insulating layer INS1 may be formed to cover one area of each of the alignment electrodes ALE, and include an opening exposing another area of each of the alignment electrodes ALE. As shown in FIG. 5A, the first insulating layer INS may expose inclined surfaces of alignment electrodes ALE opposing (or facing) the light emitting elements LD.

In one or more embodiments, the first insulating layer INS1 may be primarily formed to entirely cover the first and second connection electrodes ALE5 and ALE6 and the alignment electrodes ALE. The first insulating layer INS1 may prevent damage of the alignment electrodes ALE or extraction of metal in a subsequent process. After the light emitting elements LD are supplied and arranged on the first insulating layer INS1, the first insulating layer INS1 may be partially opened to expose the alignment electrodes ALE. The first insulating layer INS1 may have the fifth and sixth contact parts CNT5 and CNT6 exposing one areas of the first and second connection electrodes ALE5 and ALE6.

However, the present disclosure is not limited thereto, and the first insulating layer INS1 may be patterned in the form of an individual pattern locally disposed on the bottom of the light emitting elements LD, after the light emitting elements LD are completely supplied and arranged.

Also, the first insulating layer INS1 may be disposed at the bottom of (or below) the light emitting elements LD, to stably support the light emitting elements LD.

In one or more embodiments, on the patterns BNP, a side surface of the first insulating layer INS1 may be located at the same line (or the same plane) as that of a second electrode layer of the alignment electrodes ALE. For example, on a first pattern BNP1, a side surface of the first insulating layer INS1 may be located on the same line (or the same plane) as that of a second electrode layer CMTL2 of the first alignment electrode ALE1. Although will be described later with reference to FIG. 7C, a second electrode layer of the alignment electrodes ALE and the first insulating layer INS1 may be collectively patterned (or collectively etched) so as to simplify a manufacturing process. The side surface of the second electrode layer of the alignment electrodes ALE and the side surface of the first insulating layer INS can accord with each other or be aligned with each other.

The first insulating layer INS1 may include at least one inorganic insulating material and/or at least one organic insulating material. For example, the first insulating layer INS1 may include various kinds (or types) of organic/inorganic insulating materials currently known in the art, including silicon nitride ($SiN_x$), and the material constituting the first insulating layer INS1 is not particularly limited.

A bank BNK may be disposed on the one surface of the base layer BSL including the first insulating layer INS1. For example, the bank BNK may be provided in the non-emission area NEA to be around (or surrounding) the emission area EA and the separation area SPA.

The bank may be provided not to overlap with the fifth and sixth contact parts CNT5 and CNT6. After the bank BNK is formed, the first and second connection electrodes ALE5 and ALE6 can be easily connected to the first and second pixel electrodes ELT1 and ELT2.

The bank BNK may include an insulating material including at least one inorganic material and/or at least one organic material. In one or more embodiments, the bank BNK may include a light blocking material or a color filter material, so that the occurrence of light leakage between adjacent pixels PXL can be prevented. Also, the bank BNK may include at least one material among the materials constituting the patterns BNP or include a material different from that of the patterns BNP.

In one or more embodiments, the bank BNK may have a hydrophobic surface. For example, the bank BNK itself is formed as a hydrophobic pattern by using a hydrophobic material, or a hydrophobic film made of a hydrophobic material is formed on the bank BNK, so that bank BNK can be formed to have a hydrophobic surface. In one or more embodiments, the bank BNK may be formed by using a hydrophobic organic insulating material having a large contact angle, such as polyacrylate. In a process of supplying light emitting elements LD, light emitting element ink including the light emitting element LD can be prevented from overflowing to the periphery of the emission area EA, and the supply area of the light emitting element ink can be easily controlled.

Light emitting elements LD may be supplied and arranged in each emission area EA. In one or more embodiments, a plurality of light emitting elements LD may be supplied to the emission area of each pixel PXL through an inkjet process, a slit coating process or other various processes, and an alignment signal (e.g., a predetermined alignment signal) (or alignment voltage) may be applied to each of alignment electrodes ALE (or alignment lines before being separated into the alignment electrodes ALE), thereby aligning the light emitting elements LD between the alignment electrodes ALE. In one or more embodiments, the light emitting elements LD may be disposed in an area between a pair of patterns BNP located at the bottom of (or below) a pair of alignment electrodes ALE supplied with different alignment signals (e.g., an area between the first and second patterns BNP1 and BNP2, and an area between the second and third patterns BNP2 and BNP3.

In one or more embodiments, at least some of the light emitting elements LD may extend along a lateral direction (or the first direction DR1), an oblique direction (e.g., a direction between the first direction DR1 and the second direction DR2), or the like between a pair of adjacent alignment electrodes ALE such that both end portions (i.e., first and second end portions EP1 and EP2 (see FIG. 4)) in a length direction thereof overlaps or does not overlap with the pair of alignment electrodes ALE. In addition, both end portions of the light emitting elements LD may be connected to the respective pixel electrodes ELT. Further, the light emitting elements LD may be arranged along the second direction DR2 between a pair of adjacent alignment electrodes ALE.

The second insulating layer INS2 (or second insulating pattern) may be disposed on one area of each of the light emitting elements LD. The second insulating layer INS2 may be locally disposed on one area of each of the light emitting elements LD to expose both end portions of each of the light emitting elements LD. For example, the second insulating layer INS2 may be locally disposed on one area of a first light emitting element LD1 to expose both end portions of the first light emitting element LD1, and may be locally disposed on one area of a fourth light emitting element LD4 to expose both end portions of the fourth light emitting element LD4. Both end portions of light emitting elements LD, which are not covered by the second insulating layer INS2, may be connected to the respective pixel electrodes ELT. When the second insulating layer INS2 is formed on light emitting elements LD after the light emitting elements LD are completely arranged, the light emitting elements LD can be stably fixed.

When a separation space exists between the first insulating layer INS1 and the light emitting elements LD before the second insulating layer INS2 is formed, the space may be filled by the second insulating layer INS2. Accordingly, the light emitting elements LD can be more stably supported.

The second insulating layer INS2 may include at least one inorganic insulating material and/or at least one organic insulating material. For example, the second insulating layer INS2 may include various kinds (or types) of organic/inorganic insulating materials currently known in the art, including silicon nitride ($SiN_x$), and the material constituting the second insulating layer INS2 is not particularly limited.

The first pixel electrode ELT1 may be disposed on a first end portion of the first light emitting element LD1 and the first connection electrode ALE5. The first pixel electrode ELT1 may be in contact with the first end portion of the first light emitting element LD1, and may be in contact with the first connection electrode ALE5 through the fifth contact part CNT5. That is, the first pixel electrode ELT1 may electrically connect the first end portion of the first light emitting element LD1 and the first connection electrode ALE5 to each other.

Also, the first pixel electrode ELT1 may be in contact with the first electrode layer RMTL1 of the first alignment electrode ALE1. As shown in FIGS. 5A and 5B, the first pixel electrode ELT1 may be in contact with the first electrode layer RMTL1 of the first alignment electrode ALE1 at the inclined surface of the first alignment electrode ALE1 or in an area adjacent thereto.

Although a case where the first pixel electrode ELT1 does not overlap with the second insulating layer INS2 has been illustrated in FIG. 5A, the present disclosure is not limited thereto, and the first pixel electrode ELT1 may also be disposed on one area of the second insulating layer INS2.

The second pixel electrode ELT2 may be disposed on a second end portion of the fourth light emitting element LD4 and the second connection electrode ALE6. The second pixel electrode ELT2 may be in contact with the second end portion of the fourth light emitting element LD4, and may be in contact with the second connection electrode ALE6 through the sixth contact part CNT6. That is, the second pixel electrode ELT2 may electrically connect the second end portion of the fourth light emitting element LD4 and the second connection electrode ALE6 to each other. Also, the second pixel electrode ELT2 may also be connected to the first electrode layer RMTL2 of the second alignment electrode ALE2.

As described with reference to FIG. 4, the fourth pixel electrode ELT4 may be disposed on a second end portion of the second light emitting element LD2 and a first end portion of a third light emitting element LD3, and electrically connect the second end portion of the second light emitting element LD2 and the first end portion of the third light emitting element LD3 to each other.

The third insulating layer INS3 (or third insulating pattern) may be disposed on the first pixel electrode ELT1 and the second pixel electrode ELT2 (and the fourth pixel electrode ELT4). The third insulating layer INS3 may cover the first pixel electrode ELT1 and the second pixel electrode ELT2 (and the fourth pixel electrode ELT4), and prevent the first pixel electrode ELT1 and the second pixel electrode ELT2 (and the fourth pixel electrode ELT4) from being directly connected to the third pixel electrode ELT3 and the fifth pixel electrode ELT5 (i.e., occurrence of a short circuit). That is, the first pixel electrode ELT1 and the second pixel electrode ELT2 (and the fourth pixel electrode ELT4) may be spaced and insulated from the third pixel electrode ELT3 and the fifth pixel electrode ELT5 through the third insulating layer INS3.

The third insulating layer INS3 may include at least one inorganic insulating material and/or at least one organic insulating material. For example, the third insulating layer INS3 may include various kinds (or types) of organic/inorganic insulating materials currently known in the art, including silicon nitride ($SiN_x$), and the material constituting the third insulating layer INS3 is not particularly limited.

In addition, the first, second, and third insulating layers INS1, INS2, and INS3 may include different insulating materials. Alternatively, at least some of the first, second, and third insulating layers INS1, INS2, and INS3 may include the same insulating material.

The third pixel electrode ELT3 may be disposed on a second end portion of the first light emitting element LD1, and may be in contact with the second end portion of the first light emitting element LD1. Also, as described with reference to FIG. 4, the third pixel electrode ELT3 may be disposed on a first end portion of the second light emitting element LD2, and may be in contact with the first end portion of the second light emitting element LD2. That is, the third pixel electrode ELT3 may electrically connect the second end portion of the first light emitting element LD1 and the first end portion of the second light emitting element LD2 to each other.

The third pixel electrode ELT3 may be spaced from the third alignment electrode ALE3 by the first insulating layer INS1, and may not be electrically connected to the third alignment electrode ALE3.

Although a case where the third pixel electrode ELT3 does not overlap with the third insulating layer INS3 on the light emitting element LD has been illustrated in FIG. 5A, the present disclosure is not limited thereto, and the third pixel electrode ELT3 may be disposed on any area of the third insulating layer INS3 on the light emitting element LD in one or more embodiments.

The fifth pixel electrode ELT5 may be disposed on a first end portion of the fourth light emitting element LD4, and may be in contact with the first end portion of the fourth light emitting element LD4. Also, as described with reference to FIG. 4, the fifth pixel electrode ELT5 may be disposed on a second end portion of the third light emitting element LD3, and may be in contact with the second end portion of the third light emitting element LD3. That is, the fifth pixel electrode ELT5 may electrically connect the second end portion of the third light emitting element LD3 and the first end portion of the fourth light emitting element LD4 to each other.

The fifth pixel electrode ELT5 may be spaced from the fourth alignment electrode ALE4 by the first insulating layer INS1, and may not be electrically connected to the fourth alignment electrode ALE4.

The first to fifth pixel electrodes ELT1 to ELT5 may be made of various transparent conductive materials. In one or more embodiments, the pixel electrodes ELT may include at least one of various transparent conductive materials (or substances) including indium tin oxide (ITO), indium zinc oxide (IZO), zinc oxide (ZnO), indium gallium zinc oxide (IGZO), indium tin zinc oxide (ITZO), and the like, and may be substantially transparent or translucent to satisfy desired transmittance (e.g., a predetermined transmittance). Accordingly, light emitted from both the end portions of the light emitting elements LD can be transmitted through the first to fifth pixel electrodes ELT1 to ELT5 and then emitted to the outside of the pixel PXL.

In one or more embodiments, at least one insulating layer and/or a light conversion layer may be provided over the pixel electrodes ELT.

For example, an insulating layer may be entirely formed on the display area DA to cover the top of the patterns BNP, the pixel electrodes ELT, the first to third insulating layers INS1, INS2, and INS3, the light emitting elements LD, the pixel electrodes ELT, and the bank BNK. In one or more embodiments, the insulating layer may include a single- or multi-layered encapsulation layer. In one or more embodiments, at least one overcoat layer, a filler, and/or an upper substrate may be further disposed on the top of the insulating layer.

In addition, a light conversion layer may be selectively provided in the emission area EA of each pixel PXL. The light conversion layer may include a color conversion layer (or wavelength conversion layer) and/or a color filter layer, corresponding to a desired color (e.g., a predetermined color). The light conversion layer may be formed immediately on pixel electrodes ELT of each pixel PXL or may be formed on an insulating layer covering the pixel electrodes ELT. The position, forming method, and the like of the light conversion layer are not particularly limited.

For example, in each pixel area PXA, a light conversion layer including light conversion particles (e.g., a quantum dot of a desired color (e.g., a predetermined color)) for converting a color (or wavelength) of light emitted from light emitting elements LD, light scattering particles for increasing the utilization of light emitted from the light emitting elements LD, and/or a color filter material of a desired color (e.g., a predetermined color) may be selectively further provided on the top of the display layer DPL.

As described above, each of the alignment electrodes ALE and the first and second connection electrodes ALE5 and ALE6 may have a multi-layered structure including a first electrode layer and a second electrode layer, which are sequentially stacked. The first electrode layer may have a relatively high reflectivity or include a material having a constant reflectivity, and the second electrode layer may have a relatively high electrical conductivity or include a low-resistance material. The fifth contact part CNT5 exposing the first electrode layer RMTL5 of the first connection electrode ALE5 may be formed in the second electrode layer CMTL5 of the first connection electrode ALE5, and the first pixel electrode ELT1 may be in contact with the first electrode layer RMTL5 of the first connection electrode ALE5 and the second electrode layer CMTL5 of the first connection electrode ALE5 through the fifth contact part CNT5. Thus, contact resistance between the first pixel electrode ELT1 and the first connection electrode ALE5 can be decreased, and a failure caused by the contact resistance can be reduced or prevented.

In addition, at the inclined surface of the alignment electrodes ALE opposing (or facing) the light emitting elements LD, only the first electrode layer may be disposed, and the second electrode layer may not be disposed. Thus, light emitted from the light emitting elements LD is reflected in the image display direction (e.g., the third direction DR3) by the first electrode layer of the alignment electrodes ALE, which has a relatively high reflectivity, and the light emission rate of the pixel can be maintained.

Further, the second electrode layer of the alignment electrodes ALE and the first insulating layer INS1 (and the second insulating layer INS2) are collectively patterned (or collectively etched) in the manufacturing process, and accordingly, the side surface of the second electrode layer of the alignment electrodes ALE and the side surface of the first insulating layer INS1 (and the second insulating layer INS2) can accord with each other or be aligned with each other. That is, the manufacturing process of the display device can be further simplified.

Figure 6A:
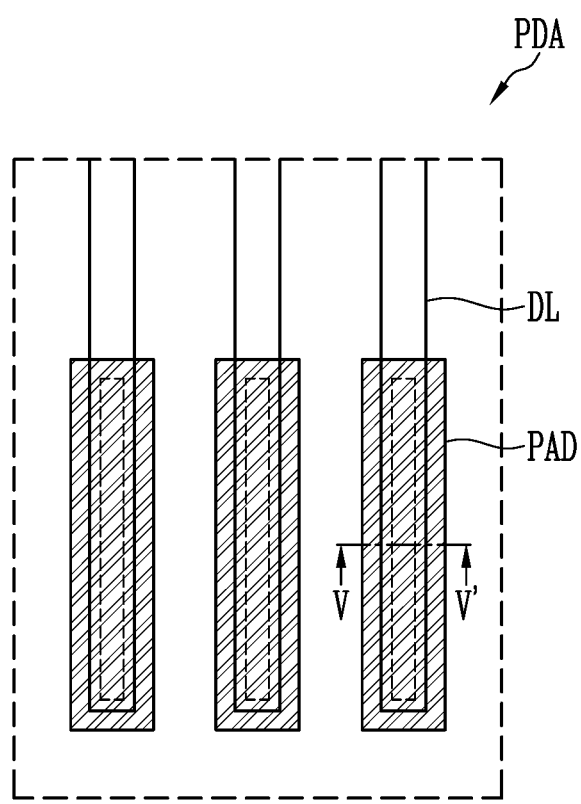
FIG. 6A is a plan view illustrating one or more embodiments of a pad included in the display device shown in FIG. 2.
Figure 6B:
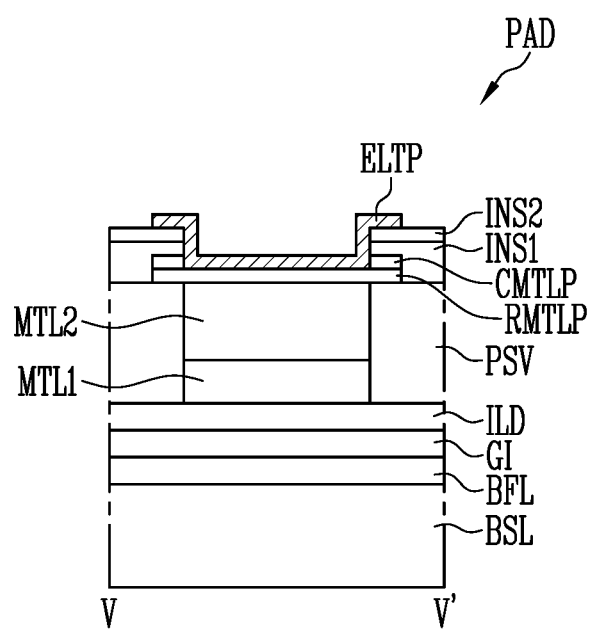
FIG. 6B is a sectional view illustrating one or more embodiments of the pad taken along the line V-V' shown in FIG. 6A.

FIG. 6A is a plan view illustrating one or more embodiments of the pad included in the display device shown in FIG. 2. In FIG. 6A, a pad PAD connected to a data line DL is illustrated as an example. FIG. 6B is a sectional view illustrating one or more embodiments of the pad taken along the line V-V' shown in FIG. 6A.

Referring to FIGS. 2, 5B, 6A, and 6B, the pad PAD may be disposed in the pad area PDA, and may be connected to the data line DL.

The base layer BSL, the buffer layer BFL, the gate insulating layer GI, the interlayer insulating layer ILD, the passivation layer PSV, the first insulating layer INS1, and the second insulating layer INS2 have been described with reference to FIGS. 5A to 5C, and therefore, overlapping descriptions will not be repeated.

The data line DL may include a first metal layer MTL1 and a second metal layer MTL2, which are sequentially stacked on the interlayer insulating layer ILD. In order to reduce line resistance, the data line DL may form a double- or multi-layered structure including the first metal layer MTL1 and the second metal layer MTL2, and each of the first metal layer MTL1 and the second metal layer MTL2 may include a material selected from copper (Cu), molybdenum (Mo), tungsten (W), aluminum neodymium (AlNd), titanium (Ti), aluminum (Al), silver (Ag), and alloys thereof. For example, the first metal layer MTL1 may include titanium (Ti), and the second metal layer MTL2 may include copper (Cu).

In one or more embodiments, the data line DL, i.e., the first and second metal layers MTL1 and MTL2 of the data line DL extending to the pad area PDA via the non-display area NA may be disposed at a lower portion of the passivation layer PSV.

The pad PAD may include a pad connection electrode ALEP and a pad electrode ELTP. The pad connection electrode ALEP may include a first electrode layer RMTLP and a second electrode layer CMTLP.

The first electrode layer RMTLP may be disposed on the passivation layer PSV and the second metal layer MTL2, the second electrode layer CMTLP may be disposed on the first electrode layer RMTLP, and the pad electrode ELTP may be disposed on the second insulating layer INS2 and the pad connection electrode ALEP.

The first electrode layer RMTLP, the second electrode layer CMTLP, and the pad electrode ELTP may be respectively substantially identical or similar to the first electrode layer RMTL5 of the first connection electrode ALE5, the second electrode layer CMTL5 of the first connection electrode ALE5, and the first pixel electrode ELT1, which are described with reference to FIGS. 5A-5C. Therefore, overlapping descriptions will not be repeated. The first electrode layer RMTLP may be formed through the same process as the first electrode layer RMTL5 of the first connection electrode ALE5. For example, the first electrode layer RMTLP may include aluminum (Al). The second electrode layer CMTLP may be formed through the same process as the second electrode layer CMTL5 of the first connection electrode ALE5. For example, the second electrode layer CMTLP may include molybdenum (Mo). The pad electrode ELTP may be formed through the same process as the first pixel electrode ELT1. For example, the pad electrode ELTP may include a transparent conductive material such as indium tin oxide (ITO).

Similarly to the fifth contact part CNT5 described with reference to FIG. 5B, an opening or a contact part, which exposes the first electrode layer RMTLP, may be formed in the second electrode layer CMTLP. As shown in FIG. 6B, the pad electrode ELTP may be in contact with a top surface of the first electrode layer RMTLP through the opening (or the contact part), and may be in contact with a side surface of the second electrode layer CMTLP. As described with reference to FIG. 5B, contact resistance (and resistance-capacitance delay) between the pad electrode ELTP and the first and second electrode layers RMTLP and CMTLP can be decreased, and a failure caused by the contact resistance can be reduced or prevented.

FIGS. 7A-7G are sectional views illustrating one or more embodiments of a method of manufacturing the display device shown in FIG. 2. A section corresponding to FIGS. 5A, 5B, 5C, and 6B is illustrated in each of FIGS. 7A-7G. In each of FIGS. 7A-7G, the display device DD (see FIG. 2) is briefly illustrated based on the display layer DPL (see FIG. 5A).

First, referring to FIGS. 2, 4, 5A, 5B, 5C, 6A, 6B, and 7A, first, second, and third patterns BNP1, BNP2, and BNP3 may be formed on a passivation layer PSV, and a first electrode layer and a second electrode layer may be sequentially formed or patterned on the first, second, and third patterns BNP1, BNP2, and BNP3 and the passivation layer PSV.

For example, the first and second electrode layers may be entirely formed on the passivation layer PSV, and first to fourth alignment electrodes ALE1 to ALE4, a first connection electrode ALE5, and first and second electrode layers RMTLP and CMTLP of a pad PAD, which are separated from each other through patterning, may be formed on the passivation layer PSV. The first electrode layer and the second electrode layer are collectively patterned, and therefore, the second electrode layer may completely overlap with the first electrode layer in the process of forming the first and second electrode layers.

The positions at which the first to fourth alignment electrodes ALE1 to ALE4, the first connection electrode ALE5, and the first and second electrode layers RMTLP and CMTLP of the pad PAD are disposed have been described with reference to FIGS. 4-6A, and therefore, overlapping descriptions will not be repeated.

Figure 7A:
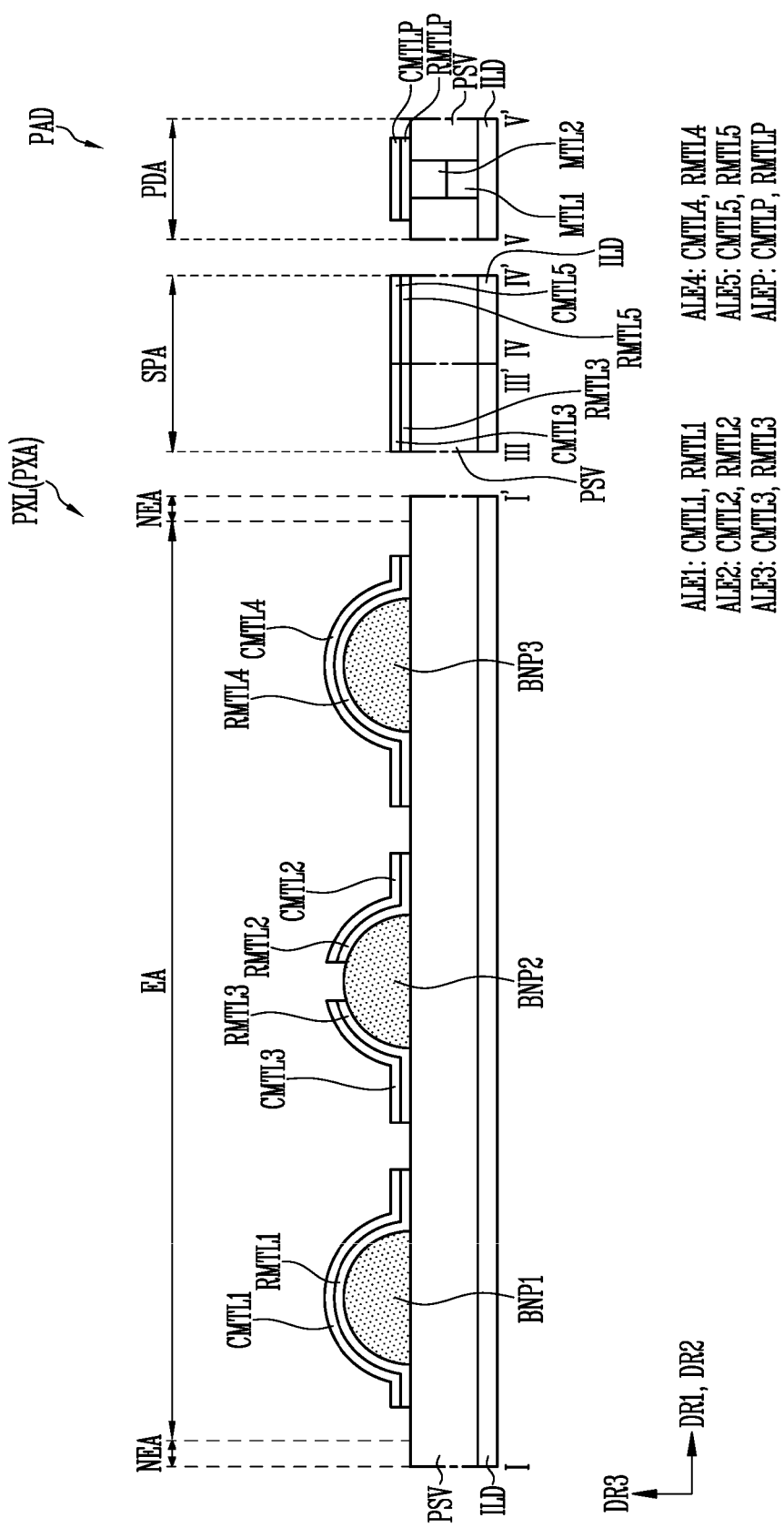
FIGS. 7A-7G are sectional views illustrating one or more embodiments of a method of manufacturing the display device shown in FIG. 2.
Figure 7B:
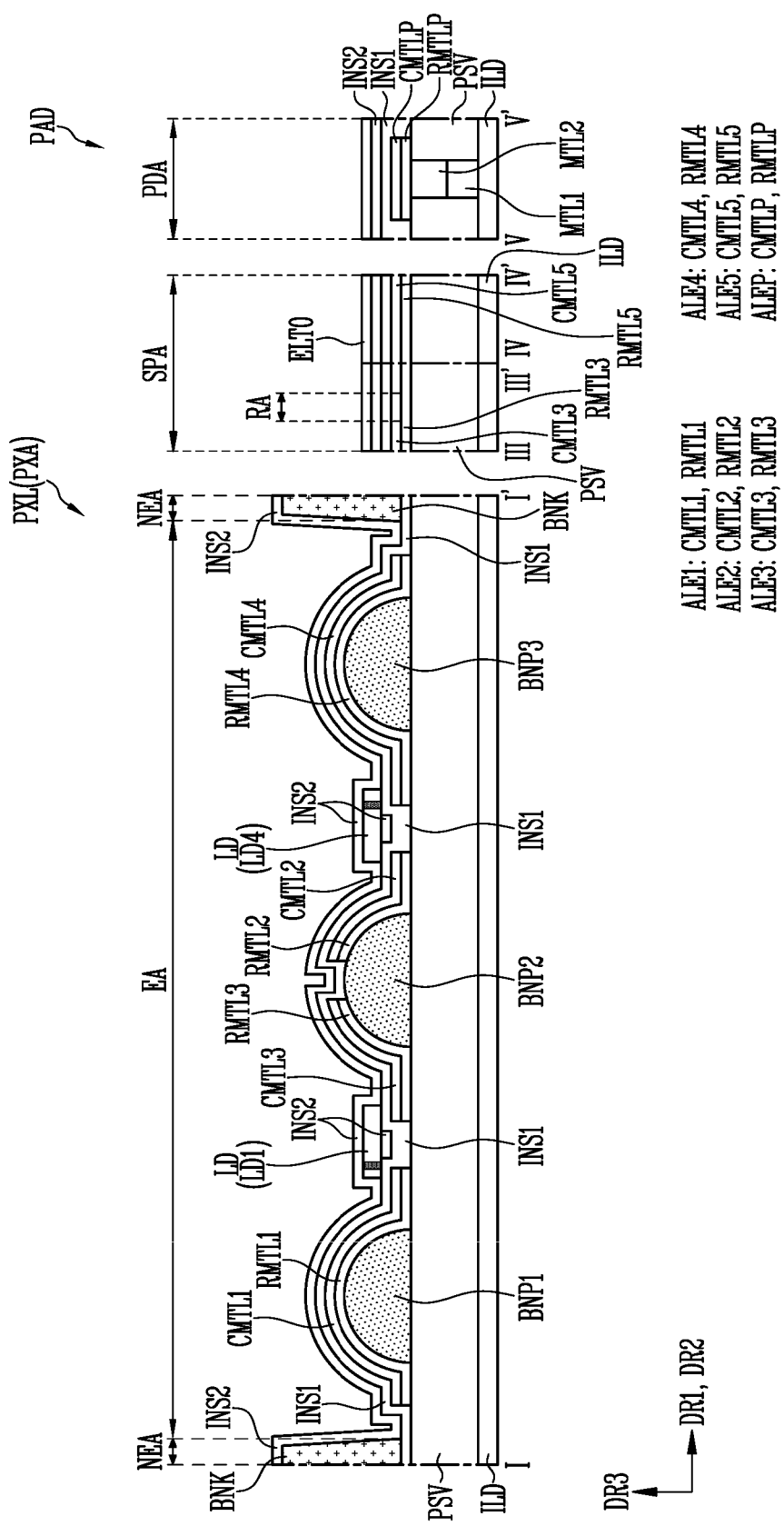

Subsequently, as shown in FIG. 7B, a first insulating layer INS1 may be entirely formed on the passivation layer PSV to cover the patterned first and second electrode layers, a bank BNK may be formed on the first insulating layer INS1, light emitting elements LD may be supplied and arranged on the first insulating layer INS1, and a second insulating layer INS2 may be entirely formed on the passivation layer PSV to cover the light emitting elements LD, the patterned first and second electrode layers, and the bank BNK.

The light emitting elements LD may be prepared in a form in which the light emitting elements LD are dispersed in a suitable solution (e.g., a predetermined solution), to be supplied to an emission area EA of a pixel area PXA through an inkjet printing process, a slit coating process, or the like. When a suitable voltage (e.g., a predetermined voltage) is applied between the first and third alignment electrodes ALE1 and ALE3, a first light emitting element LD1 (and a second light emitting element LD2 (see FIG. 4)) is self-aligned between the first and third alignment electrodes ALE1 and ALE3, while an electric field is formed between the first and third alignment electrodes ALE1 and ALE3. Similarly, when a suitable voltage (e.g., a predetermined voltage) is applied between the second and fourth alignment electrodes ALE2 and ALE4, a fourth light emitting element LD4 (and a third light emitting element LD3 (see FIG. 4)) is self-aligned between the second and fourth alignment electrodes ALE2 and ALE4, while an electric field is formed between the second and fourth alignment electrodes ALE2 and ALE4. After the light emitting elements LD are arranged, a solvent is volatilized or removed through another process, so that the light emitting elements LD can be stably arranged between the first and third alignment electrodes ALE1 and ALE3 and between the second and fourth alignment electrodes ALE2 and ALE4.

Figure 7C:
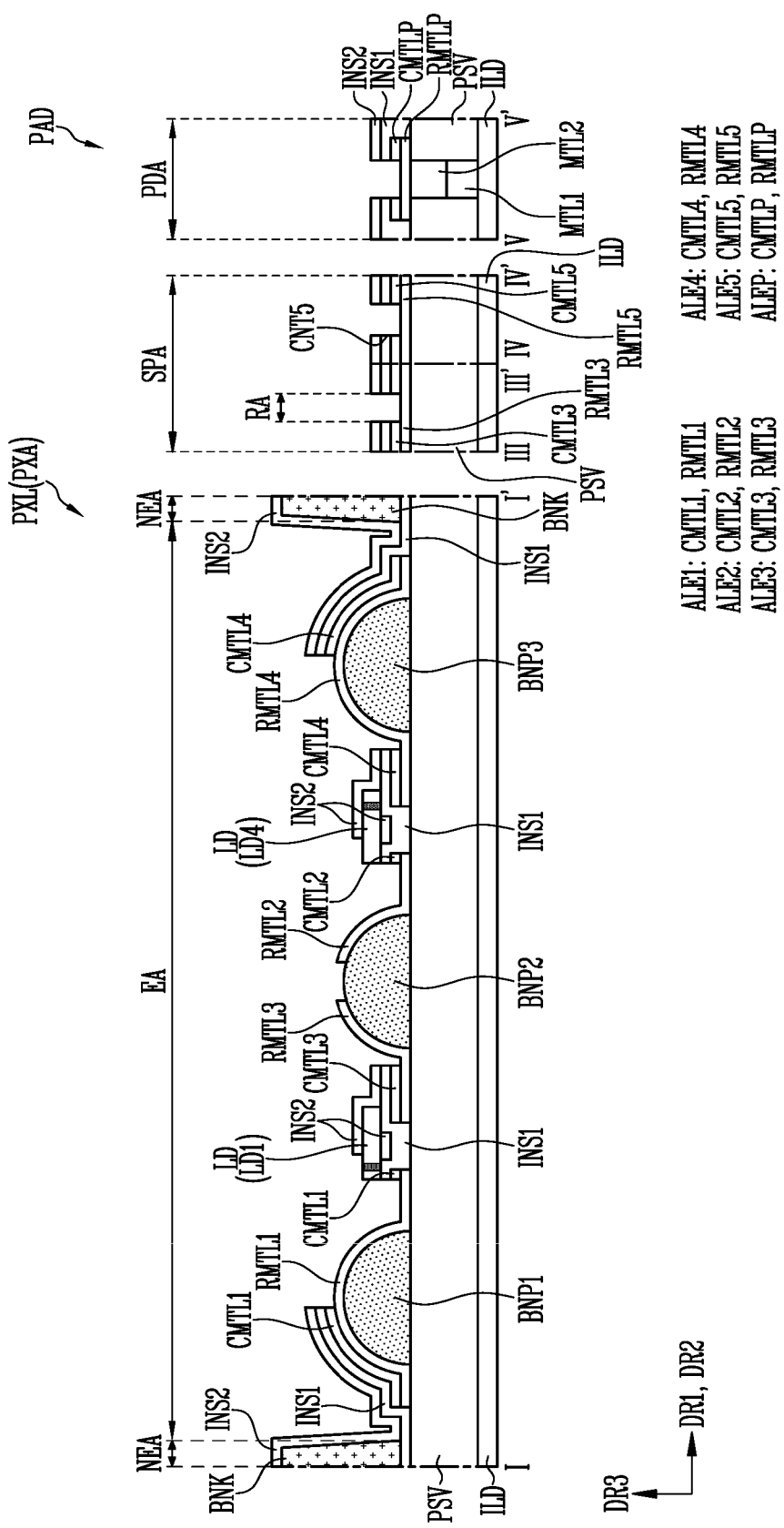

Subsequently, as shown in FIG. 7C, the first and second insulating layers INS1 and INS2 and the second electrode layer may be partially patterned.

For example, a mask (e.g. a photoresist) may be formed to overlap with the second insulating layer INS2 shown in FIG. 7C, and the second insulating layer INS2 and a lower component, which are exposed by the mask, may be etched. For example, when the first insulating layer INS1 and the second insulating layer INS2 include the same kind of organic/inorganic insulating material, the first insulating layer INS1 and the second insulating layer INS2 may be concurrently etched (e.g., simultaneously etched) through a one-time etching process. Therefore, the second insulating layer INS2 may substantially completely overlap with the first insulating layer INS1. When the first insulating layer INS1 and the second insulating layer INS2 includes an inorganic insulating material, and the second electrode layer (e.g., a second electrode layer CMTL2 of the first alignment electrode ALE1) includes molybdenum, the second electrode layer may be etched together with the first and second insulating layers INS1 and INS2 through a one-time etching process using fluorine-based gas. In one or more embodiments, the first and second insulating layers INS1 and INS2 and the second electrode layer may be etched through another etching process by using the same mask. Because the first and second insulating layers INS1 and INS2 and the second electrode layer are formed by using the same mask, side surfaces of the first and second insulating layers INS1 and INS2 and the second electrode layer may accord with each other or be aligned with each other. In one or more embodiments, one area of the first insulating layer INS1 located at the bottom of (or below) the light emitting elements LD may not be etched by the light emitting elements LD, and the side surface of the first insulating layer INS1 may not accord with that of the second insulating layer INS2 in only an area overlapping with the light emitting elements LD.

In the emission area EA, second electrode layers CMTL1 to CMTL4 corresponding to inclined surfaces of the first to fourth alignment electrodes ALE1 to ALE4, which oppose (or face) the light emitting elements LD, may be selectively etched. Similarly, a second electrode layer CMTL3 of the third alignment electrode ALE3 may be etched in a separation area SPA (or a removal area RA). Also, in the separation area SPA, a fifth contact part CNT5 may be formed by etching a second electrode layer CMTL5 of the first connection electrode ALE5. Similarly, in a pad area PDA, an opening (or contact hole) may be formed in a second electrode layer CMTLP of a pad connection electrode ALEP.

Figure 7D:
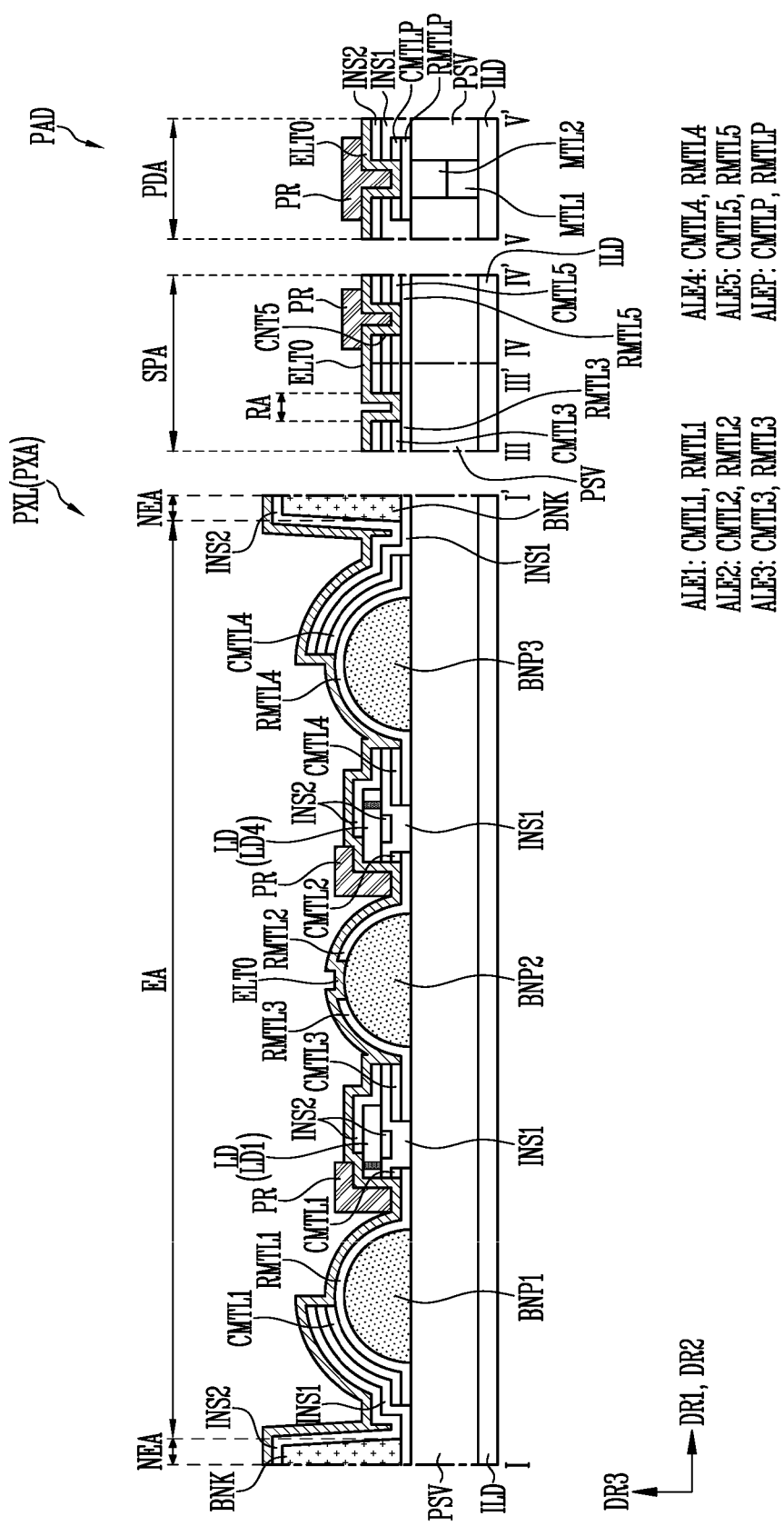
Figure 7E:
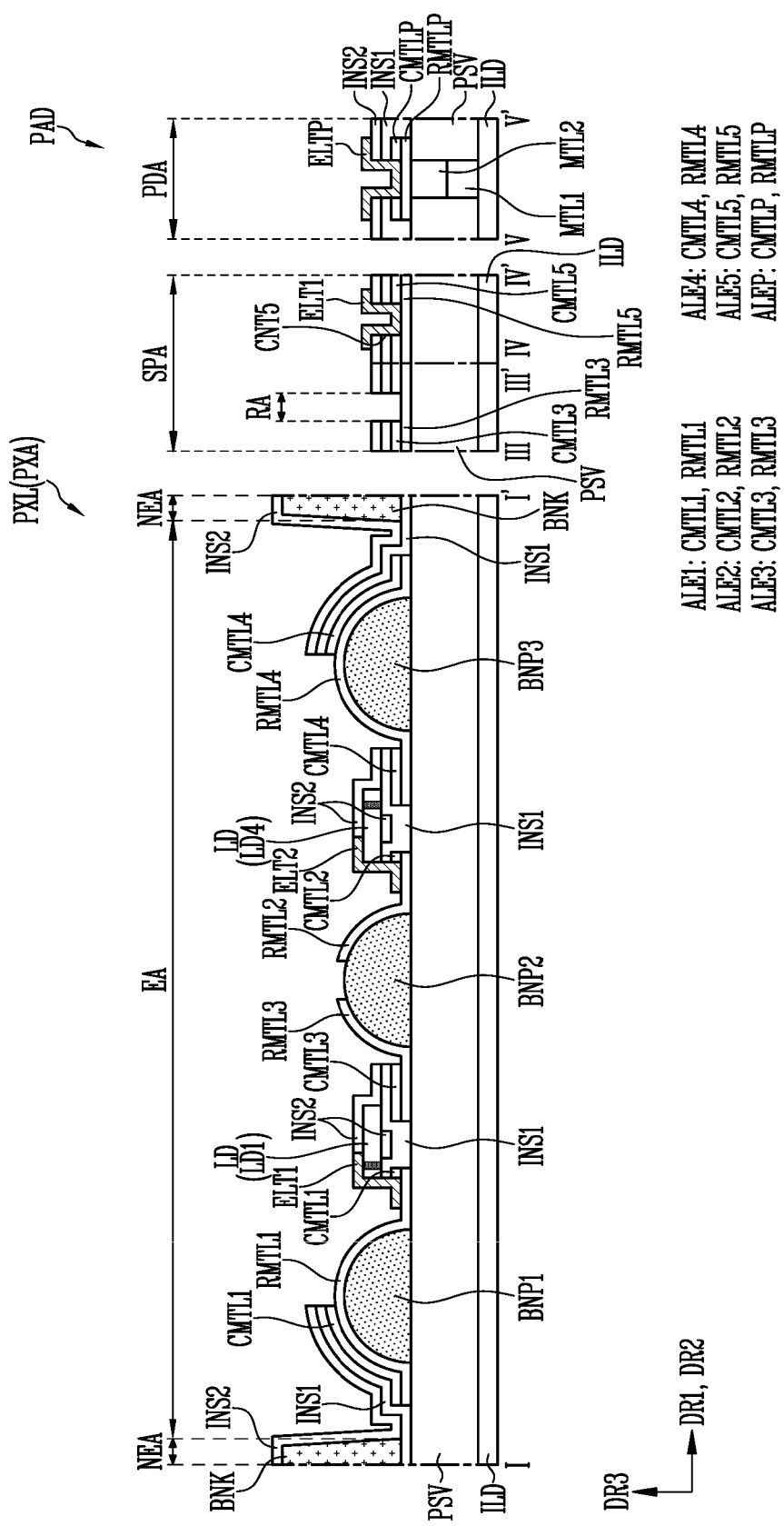

Subsequently, as shown in FIG. 7D, an electrode layer ELT0 may be entirely formed on the passivation layer PSV to cover the second insulating layer INS2, and a mask PR (or photoresist pattern) for forming a first pixel electrode ELT1, and a second pixel electrode ELT2 (and a fourth pixel electrode ELT4 (see FIG. 4)), which are shown in FIG. 7E, may be formed on the electrode layer ELT0. In addition, a mask PR for the first pixel electrode ELT1 (see FIG. 7E) may be formed in the separation area SPA), and a mask PR for a pad electrode ELTP (see FIG. 7E) may be formed in the pad area PDA.

Subsequently, the first pixel electrode ELT1, the second pixel electrode ELT2 (and the fourth pixel electrode ELT4 (see FIG. 4)), and the pad electrode ELTP may be formed as shown in FIG. 7E, by etching the electrode layer ELT0 with respect to the mask PR. As described above, the first pixel electrode ELT1 may be in contact with a top surface of the first electrode layer RMTL5 of the first connection electrode ALE5 and a side surface of the second electrode layer CMTL5, and the contact resistance of the first pixel electrode ELT1 may be decreased. Similarly, the pad electrode ELTP may be in contact with a top surface of the first electrode layer RMTLP of the pad connection electrode ALEP and a side surface of the second electrode layer CMTLP through an opening (or contact hole) penetrating the first and second insulating layers INS1 and INS2 and the second electrode layer CMTLP of the pad connection electrode ALEP, and the contact resistance of the pad electrode ELTP may be decreased.

Figure 7F:
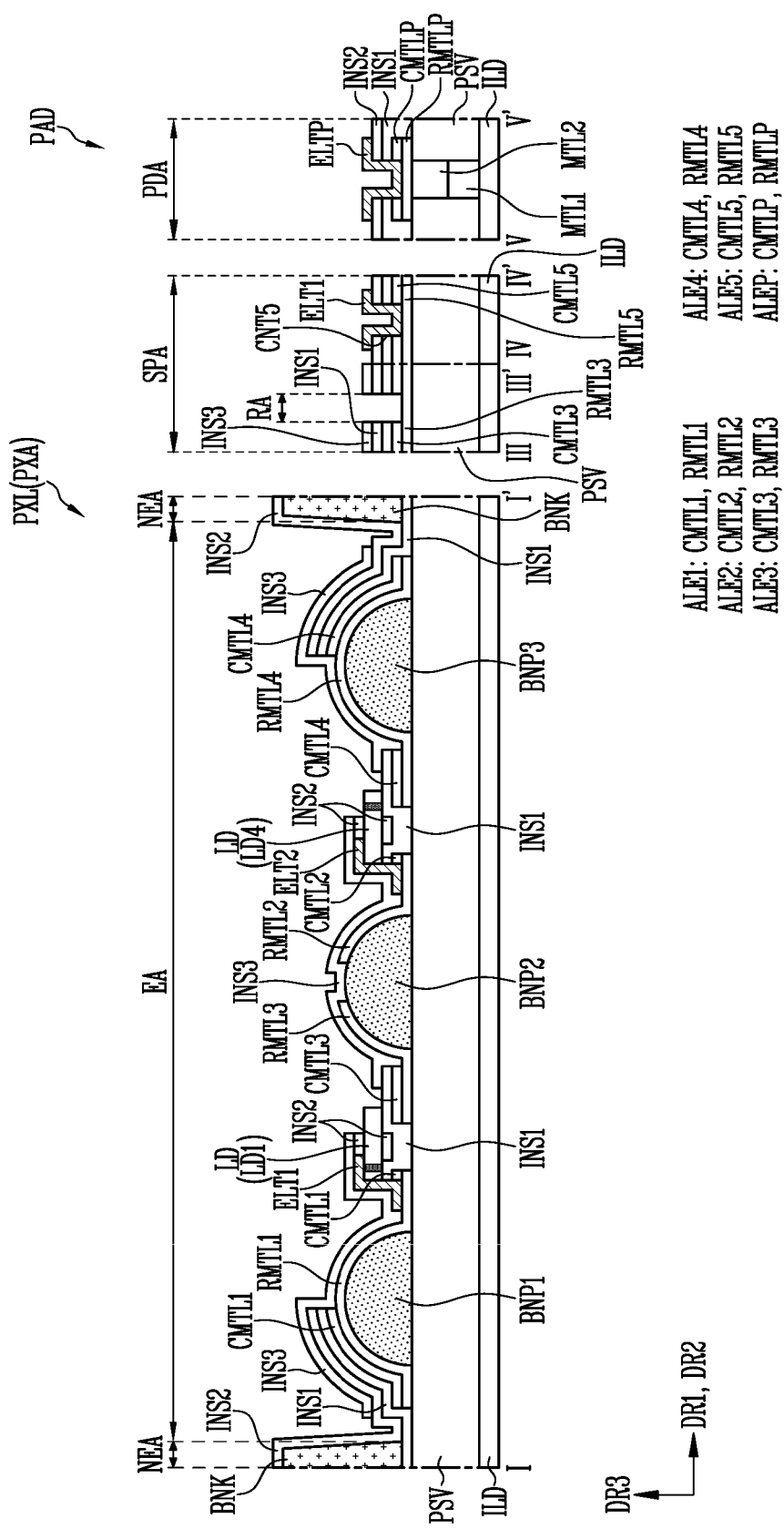

Subsequently, as shown in FIG. 7F, a third insulating layer INS3 may be formed to cover the first pixel electrode ELT1 and the second pixel electrode ELT2 (and the fourth pixel electrode ELT4 (see FIG. 4)). As described above, the third insulating layer INS3 may prevent the first pixel electrode ELT1 and the second pixel electrode ELT2 (and the fourth pixel electrode ELT4 (see FIG. 4)) from being directly connected to third and fifth pixel electrodes ELT3 and ELT5 (occurrence of a short circuit) in the emission area EA. The third insulating layer INS3 may cover the first pixel electrode ELT1 and the second pixel electrode ELT2 (and the fourth pixel electrode ELT4 (see FIG. 4)).

In the separation area SPA having no issue of a short circuit between different transparent conductive layers, the third insulating layer INS3 may not cover the first pixel electrode ELT1 or may not be disposed. Similarly, in the pad area PDA, the third insulating layer INS3 may not cover the pad connection electrode ELTP.

Figure 7G:
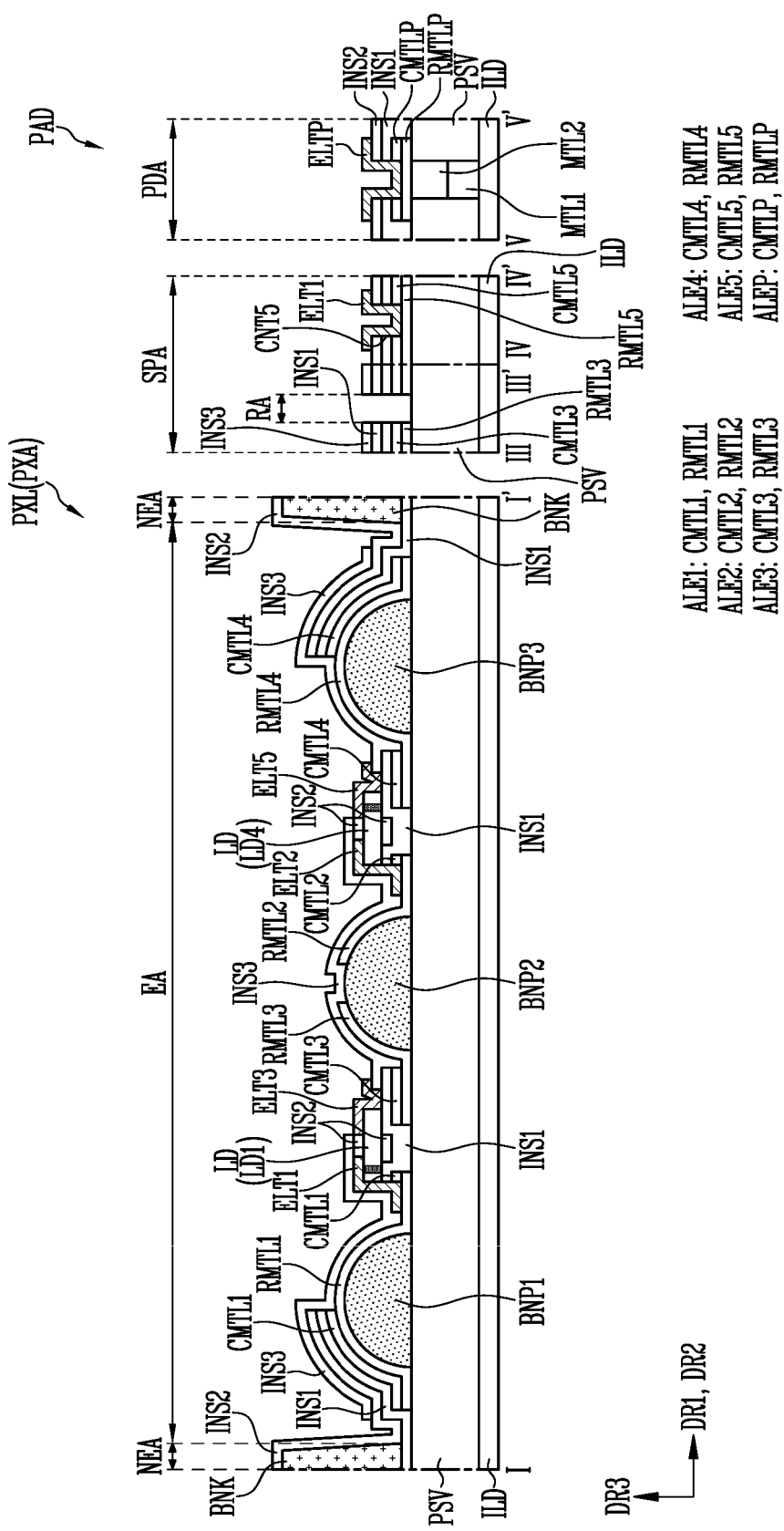

Subsequently, as shown in FIG. 7G, the third pixel electrode ELT3 and the fifth pixel electrode ELT5 may be formed. Similarly to the process described with reference to FIG. 7D, the third pixel electrode ELT3 and the fifth pixel electrode ELT5 may be formed by forming an electrode layer on the entire passivation layer PSV, forming a mask corresponding to the third pixel electrode ELT3 and the fifth pixel electrode ELT5, and etching the electrode layer, using the mask.

In one or more embodiments, in the process of etching the electrode layer to form the third pixel electrode ELT3, a first electrode layer RMTL3 of the third alignment electrode ALE3 in the removal area RA may be removed. As described with reference to FIG. 4, the third alignment electrode ALE3 may be completely separated from a third alignment electrode ALE3 of an adjacent pixel PXL in the second direction DR2 in the separation area SPA. That is, at the same time when the third pixel electrode ELT3 is formed, separation of the first to fourth alignment electrodes ALE1 to ALE4 may be performed.

Similarly to the third alignment electrode ALE3, in the process of etching the electrode layer, the first, second, and fourth alignment electrodes ALE1, ALE2, and ALE4 (see FIG. 4) may be completely separated from first, second, and fourth alignment electrodes ALE1, ALE2, and ALE4 of an adjacent pixel PXL in the second direction DR2.

As described above, the first and second insulating layers INS1 and INS2 and the second electrode layer are collectively etched by using one mask, so that the number of masks used in the manufacturing process of the display device can be decreased. Accordingly, the manufacturing process can be further simplified.

Figure 8A:
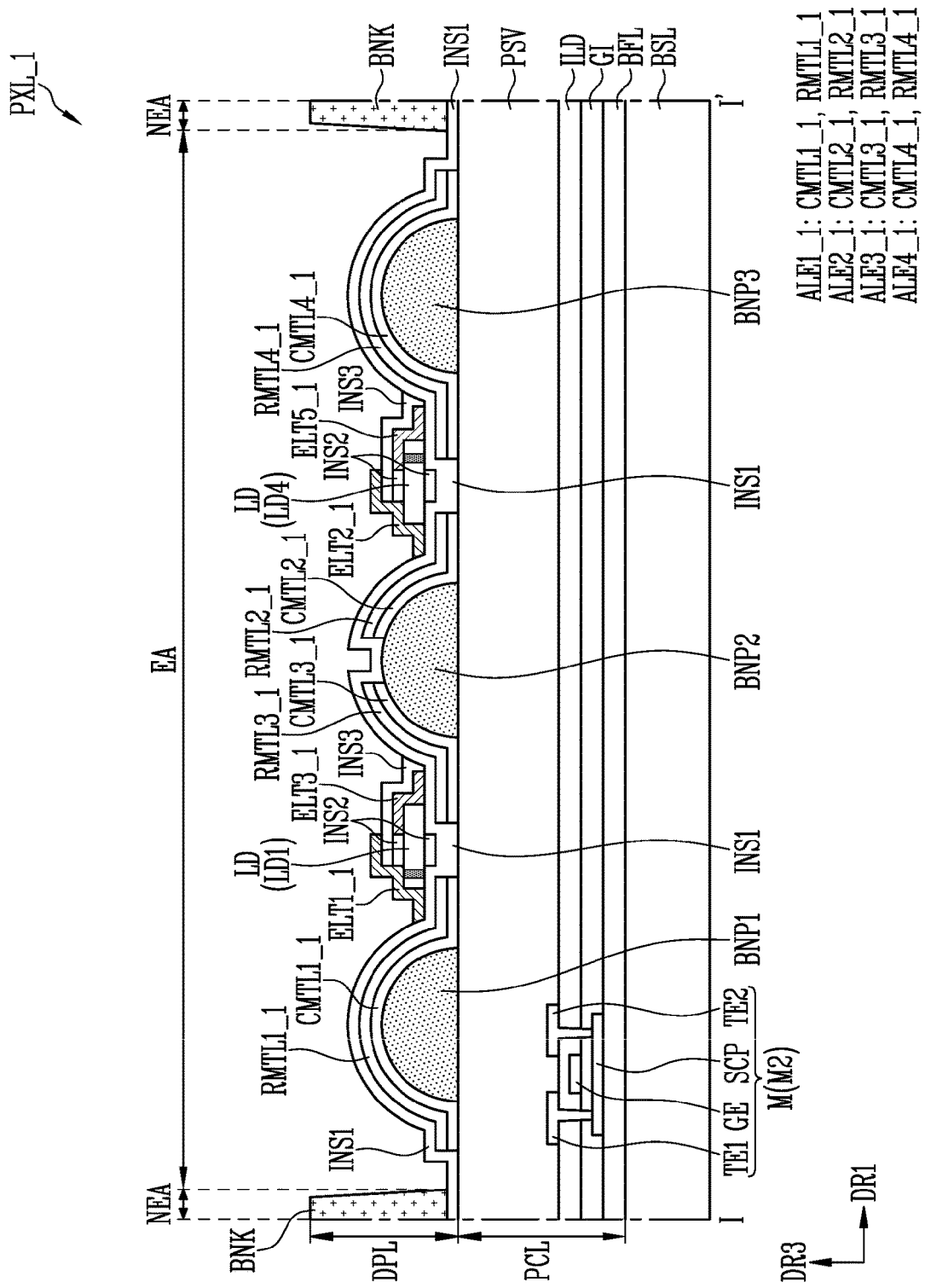
FIG. 8A is a sectional view illustrating one or more embodiments of the pixel taken along the line I-I' shown in FIG. 4.
Figure 8B:
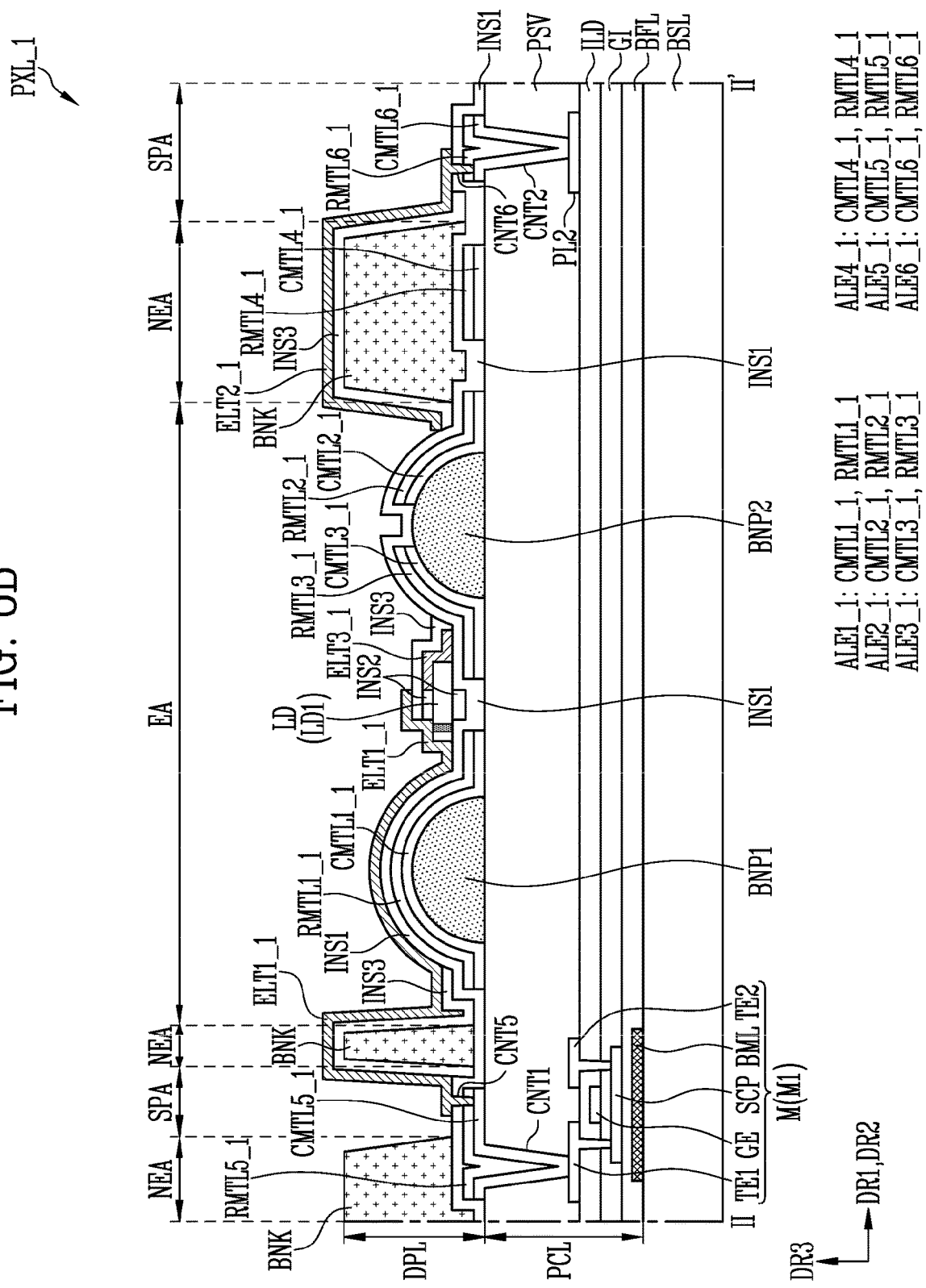
FIG. 8B is a sectional view illustrating one or more embodiments of the pixel taken along the line II-II' shown in FIG. 4.
Figure 8C:
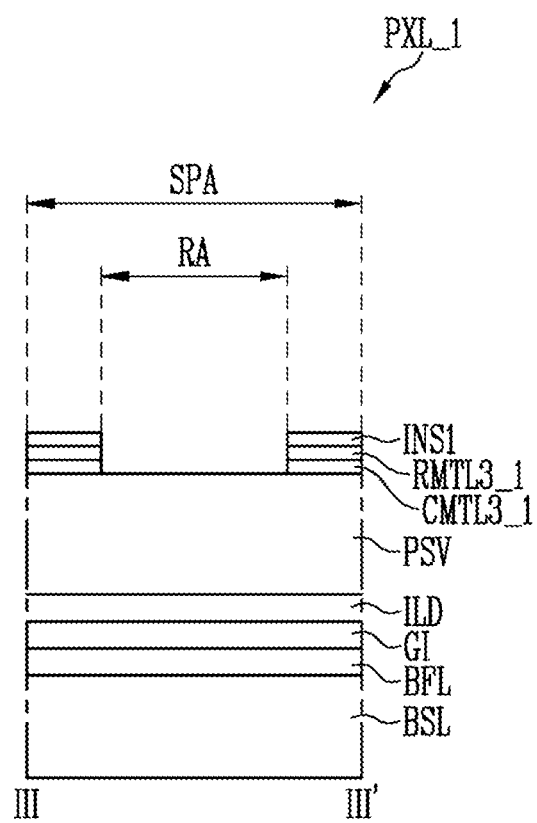
FIG. 8C is a sectional view illustrating one or more embodiments of the pixel taken along the line III-III' shown in FIG. 4.

FIG. 8A is a sectional view illustrating one or more embodiments of the pixel taken along the line I-I' shown in FIG. 4. In FIG. 8A, an arbitrary transistor M (e.g., the second transistor M2 shown in FIGS. 3A-3C) which does not include any bottom metal layer BML is illustrated as an example of circuit elements to be disposed in a pixel layer PCL. FIG. 8B is a sectional view illustrating one or more embodiments of the pixel taken along the line II-II' shown in FIG. 4. In FIG. 8B, a section of a pixel PXL_1 including a contact part is illustrated. Also, in FIG. 8B, a transistor M (e.g., the first transistor M1 shown in FIGS. 3A-3C) which is connected to a first connection electrode ALE5_1 through a first contact part CNT1 and includes a bottom metal layer BML is illustrated as an example of circuit elements disposed in the circuit layer PCL, and a second power line PL2 connected to a second alignment electrode ALE2 through a second contact part CNT2 is illustrated as an example, to be disposed in the circuit layer PCL. FIG. 8C is a sectional view illustrating one or more embodiments of the pixel taken along the line III-III' shown in FIG. 4.

First, referring to FIGS. 2, 3A-3C, 4, 5A-5C, and 8A-8C, except first to fourth alignment electrodes ALE1_1 to ALE4_1 and first and second connection electrodes ALE5_1 and ALE6_1, the pixel PXL_1 shown in FIGS. 8A-8C are substantially identical or similar to the pixel PXL shown in FIGS. 5A-5C, and therefore, overlapping descriptions will not be repeated.

The first to fourth alignment electrodes ALE1_1 to ALE4_1 may be disposed on the top of patterns BNP. The first to fourth alignment electrodes ALE1_1 to ALE4_1 may be disposed to be spaced from each other in each emission area EA. The first and second connection electrodes ALE5_1 and ALE6_1 may be formed through the same process as the first to fourth alignment electrodes ALE1_1 to ALE4_1.

In one or more embodiments, each of the first and second connection electrodes ALE5_1 and ALE6_1 and the first to fourth alignment electrodes ALE1_1 to ALE4_1 may have a multi-layered structure including a plurality of electrode layers. For example, each of the first and second connection electrodes ALE5_1 and ALE6_1 and the first to fourth alignment electrodes ALE1_1 to ALE4_1 may include a first electrode layer and a second electrode layer. One of the first electrode layer and the second electrode layer may have a relatively high reflectivity, and the other one of the first electrode layer and the second electrode layer may have a relatively high electrical conductivity (or conductivity). That is, one of the first electrode layer and the second electrode layer may be made of a material having a constant reflectivity to allow light emitted from the light emitting elements LD to advance in the third direction DR3 (or an image display direction of the display device), and the other one of the first electrode layer and the second electrode layer may include a low-resistance material to decrease resistance (or contact resistance).

In one or more embodiments, first electrode layers RMTL1_1 to RMTL6_1 may have a relatively high reflectivity, and second electrode layers CMTL1_1 to CMTL6_1 may have a relatively high electrical conductivity. In FIGS.

5A-5C, the second electrode layers CMTL1 to CMTL6 are disposed on the first electrode layers RMTL1 to RMTL6. However, in FIGS. 8A-8C, the first electrode layers RMTL1_1 to RMTL6_1 may be disposed on the second electrode layers CMTL1_1 to CMTL6_1. For example, the first electrode layers RMTL1_1 to RMTL6_1 may include aluminum (Al), and the second electrode layers CMTL1_1 to CMTL6_1 may include titanium (Ti) or molybdenum (Mo).

In one or more embodiments, a fifth contact part CNT5 exposing a second electrode layer CMTL5_1 of the first connection electrode ALE5_1 may be formed in a first electrode layer RMTL5_1 of the first connection electrode ALE5_1. As shown in FIG. 8B, a first pixel electrode ELT1_1 may be in contact with a top surface of the second electrode layer CMTL5_1 of the first connection electrode ALE5_1 through the fifth contact part CNT5, and may be in contact with a side surface of the first electrode layer RMTL5_1 of the first connection electrode ALE5_1. The contact resistance and resistance-capacitance between the first pixel electrode ELT1_1 and the first connection electrode ALE5_1 may decrease due to an increase in contact area between the first pixel electrode ELT1_1 and the first connection electrode ALE5_1 and a relatively high electrical conductivity of the second electrode layer CMTL5_1.

Similarly, a sixth contact part CNT6 exposing a second electrode layer CMTL6_1 of the second connection electrode ALE6_1 may be formed in a first electrode layer RMTL6_1 of the second connection electrode ALE6_1. As shown in FIG. 8B, a second pixel electrode ELT2_1 may be in contact with a top surface of the second electrode layer CMTL6_1 of the second connection electrode ALE6_1 through the sixth contact part CNT6, and may be in contact with a side surface of the first electrode layer RMTL6_1 of the second connection electrode ALE6_1.

In one or more embodiments, the first electrode layers RMTL1_1 to RMTL6_1 may substantially completely overlap with the second electrode layers CMTL1_1 to CMTL6_1. While some of the second electrode layers CMTL1 to CMTL6 described with reference to FIGS. 5A-5C are selectively etched to expose some of the first electrode layers RMTL1 to RMTL6, the first electrode layers RMTL1_1 to RMTL6_1 may overlap with the second electrode layers CMTL1_1 to CMTL6_1 except the fifth and sixth contact parts CNT5 and CNT6 in FIGS. 8A-8C. The first electrode layers RMTL1_1 to RMTL6_1 having a relatively high reflectivity are disposed on the second electrode layers CMTL1_1 to CMTL6_1, and therefore, selective etching on the first electrode layers RMTL1_1 to RMTL6_1 (or the second electrode layers CMTL1_1 to CMTL6_1) may not be required.

A first insulating layer INS1 may be disposed over the first and second connection electrodes ALE5_1 and ALE6_1 and the alignment electrodes ALE. The first insulating layer INS1 may be entirely disposed on a passivation layer PSV to cover the first and second connection electrodes ALE5_1 and ALE6_1 and the alignment electrodes ALE. A bank BNK may be disposed on the first insulating layer INS1.

Light emitting elements LD may be disposed on the first insulating layer INS1 in an area between first and second patterns BNP1 and BNP2 and an area between second and third patterns BNP2 and BNP3. A second insulating layer INS2 may be disposed on one area of each of the light emitting elements LD.

A third pixel electrode ELT3_1 may be disposed on a second end portion of a first light emitting element LD1, and may be in contact with the second end portion of the first light emitting element LD1. Also, as described with reference to FIG. 4, the third pixel electrode ELT3_1 may be disposed on a first end portion of a second light emitting element LD2, and may be in contact with the first end portion of the second light emitting element LD2. That is, the third pixel electrode ELT3_1 may electrically connect the second end portion of the first light emitting element LD1 and the first end portion of the second light emitting element LD2 to each other.

A fifth pixel electrode ELT5_1 may be disposed on a first end portion of a fourth light emitting element LD4, and may be in contact with the first end portion of the fourth light emitting element LD4. Also, as described with reference to FIG. 4, the fifth pixel electrode ELT5_1 may be disposed on a second end portion of a third light emitting element LD3, and may be in contact with the second end portion of the third light emitting element LD3. That is, the fifth pixel electrode ELT5_1 may electrically connect the second end portion of the third light emitting element LD3 and the first end portion of the fourth light emitting element LD4 to each other. The fifth pixel electrode ELT5_1 may not be electrically connected to the fourth alignment electrode ALE4_1, but the present disclosure is not limited thereto. For example, the fifth pixel electrode ELT5_1 may be in contact with the fourth alignment electrode ALE4_1 through a contact hole penetrating the first insulating layer INS1.

A third insulating layer INS3 may be disposed on the third pixel electrode ELT3_1 and the fifth pixel electrode ELT5_1. The third insulating layer INS3 may cover the third pixel electrode ELT3_1 and the fifth pixel electrode ELT5_1, and prevent the third pixel electrode ELT3_1 and the fifth pixel electrode ELT5_1 from being directly connected to the first pixel electrode ELT1_1 and the second pixel electrode ELT2_1 (and the fourth pixel electrode ELT4 (see FIG. 4)) (e.g., to prevent occurrence of a short circuit). That is, the third pixel electrode ELT3_1 and the fifth pixel electrode ELT5_1 may be spaced and insulated from the first pixel electrode ELT1_1 and the second pixel electrode ELT2_1 (and the fourth pixel electrode ELT4 (see FIG. 4)) through the third insulating layer INS3.

As shown in FIG. 8C, the third insulating layer INS3 (and the second insulating layer INS2) may not be disposed in a separation area SPA, but the present disclosure is not limited thereto. For example, as shown in FIG. 5C, the third insulating layer INS3 (and/or the second insulating layer INS2) may be disposed in the separation area SPA.

The first pixel electrode ELT1_1 and the second pixel electrode ELT2_1 (and the fourth pixel electrode ELT4 (see FIG. 4)) may be disposed on the third insulating layer INS3.

The first pixel electrode ELT1_1 may be disposed on a first end portion of the first light emitting element LD1 and the first connection electrode ALE5_1. The first pixel electrode ELT1_1 may electrically connect the first end portion of the first light emitting element LD1 and the first connection electrode ALE5_1 to each other. The first pixel electrode ELT1_1 may be spaced from the first alignment electrode ALE1_1 by the first insulating layer INS1 and the third insulating layer INS3, and may not be electrically connected to the first alignment electrode ALE1_1.

The second pixel electrode ELT2_1 may be disposed on a second end portion of the fourth light emitting element LD4 and the second connection electrode ALE6_1. The second pixel electrode ELT2_1 may electrically connect the second end portion of the fourth light emitting element LD4 and the second connection electrode ALE6_1 to each other. The second pixel electrode ELT2_1 may be spaced from the second alignment electrode ALE2_1 by the first insulating layer INS1 and the third insulating layer INS3, and may not be electrically connected to the second alignment electrode ALE2_1.

As described above, each of the first to fourth alignment electrodes ALE1_1 to ALE4_1 and the first and second connection electrodes ALE5_1 and ALE6_1 may have a multi-layered structure including a first electrode layer and a second electrode layer, which are sequentially stacked. The second electrode layer may have a relatively high electrical conductivity or include a low-resistance material, and the first electrode layer may have a relatively high reflectivity or include a material having a constant reflectivity. The fifth contact part CNT5 exposing the second electrode layer RMTL5_1 of the first connection electrode ALE5_1 may be formed in the first electrode layer CMTL5_1 of the first connection electrode ALE5_1, and the first pixel electrode ELT1_1 may be in contact with the second electrode layer CMTL5_1 of the first connection electrode ALE5_1 and a side surface of the first electrode layer RMTL5_1 of the first connection electrode ALE5_1 through the fifth contact part CNT5. Thus, contact resistance between the first pixel electrode ELT1_1 and the first connection electrode ALE5_1 can be decreased, and a failure caused by the contact resistance can be reduced or prevented.

Figure 8D:
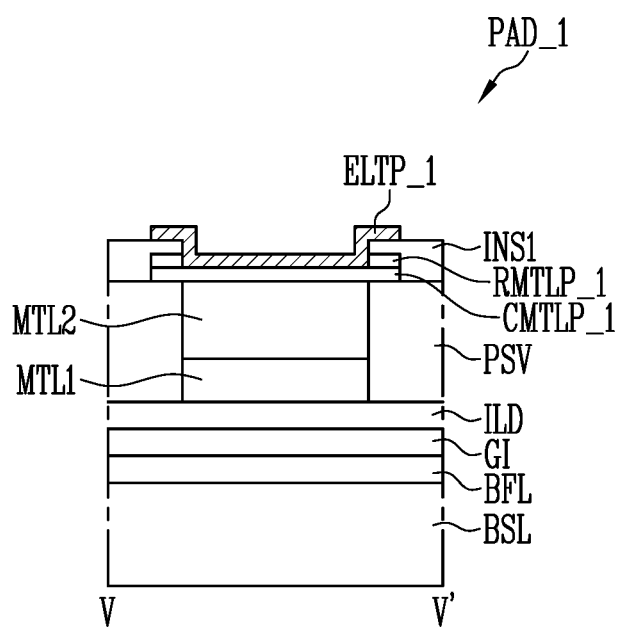
FIG. 8D is a sectional view illustrating one or more embodiments of the pad taken along the line V-V' shown in FIG. 6A.

FIG. 8D is a sectional view illustrating one or more embodiments of the pad taken along the line V-V' shown in FIG. 6A. A diagram corresponding to FIG. 6D is illustrated in FIG. 8D.

Referring to FIGS. 6A, 6B, and 8D, the pad PDA_1 shown in FIG. 8D is substantially identical or similar to the pad PAD shown in FIG. 6B except a pad connection electrode ALEP_1, and therefore, overlapping descriptions will not be repeated.

The pad PAD_1 may include the pad connection electrode ALEP_1 and a pad electrode ELTP_1. The pad connection electrode ALEP_1 may include a second electrode layer CMTLP_1 and a first electrode layer RMTLP_1.

The second electrode layer CMTLP_1 may be disposed on the passivation layer PSV and the second metal layer MTL2, the first electrode layer RMTLP_1 may be disposed on the second electrode layer CMTLP_1, and the pad electrode ELTP_1 may be disposed on the first insulating layer INS1 and the pad connection electrode ALEP_1.

The first electrode layer RMTLP_1 may be formed through the same process as the first electrode layer RMTL5_1 of the first connection electrode ALE5_1 (see FIG. 8B). For example, the first electrode layer RMTLP_1 may include aluminum (Al). The second electrode layer CMTLP_1 may be formed through the same process as the second electrode CMTL5_1 of the first connection electrode ALE5_1. For example, the second electrode layer CMTLP_1 may include titanium (Ti) or molybdenum (Mo). The pad electrode ELTP_1 may be formed through the same process as the first pixel electrode ELT1_1 (see FIG. 8B). For example, the pad electrode ELTP_1 may include a transparent conductive material such as indium tin oxide (ITO).

Similarly to the fifth contact part CNT5 described with reference to FIG. 8B, an opening or a contact part, which exposes the second electrode layer CMTLP_1, may be formed in the first electrode layer RMTLP_1. As shown in FIG. 8D, the pad electrode ELTP_1 may be in contact with a top surface of the second electrode layer CMTLP_1 through the opening (or the contact part), and may be in contact with a side surface of the first electrode RMTLP_1. As described with reference to FIG. 8B, contact resistance (and resistance-capacitance delay) between the pad electrode ELTP_1 and the pad connection electrode ALEP_1 can be decreased, and a failure cause by the contact resistance can be reduced or prevented.

Although a case where only the first insulating layer INS1 is disposed between the pad electrode layer ELTP_1 and the pad connection electrode ALEP_1 has been illustrated in FIG. 8D, the present disclosure is not limited thereto, and at least one insulating layer (e.g., the second insulating layer INS2 shown in FIG. 6B) in addition to the first insulating layer INS1 may be further disposed between the pad electrode ELTP_1 and the pad connection electrode ALEP_1.

Figure 8E:
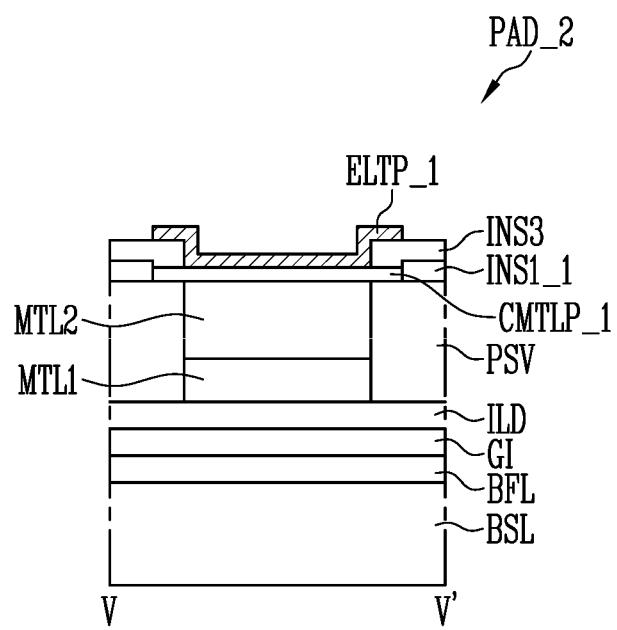
FIG. 8E is a sectional view illustrating one or more embodiments of the pad taken along the line V-V' shown in FIG. 6A.

FIG. 8E is a sectional view illustrating one or more embodiments of the pad taken along the line V-V' shown in FIG. 6A. A drawing corresponding to FIG. 8D is illustrated in FIG. 8E.

Referring to FIGS. 8D and 8E, the pad PDA_2 shown in FIG. 8E is substantially identical or similar to the pad PAD_1 shown in FIG. 8D except that a pad connection electrode ALEP_2 includes only a second electrode layer CMTLP_1, and therefore, overlapping descriptions will not be repeated.

The second electrode layer CMTLP_1 may be disposed on the second metal layer MTL2 (and the passivation layer PSV), and the pad electrode ELTP_1 may be disposed on the second electrode layer CMTLP_1. The second electrode layer CMTLP_1 may be formed through the same process as the second electrode CMTL5_1 of the first connection electrode ALE5_1 (see FIG. 8B). For example, the second electrode layer CMTLP_1 may include molybdenum (Mo). The pad electrode ELTP_1 may be formed through the same process as the first pixel electrode ELT1_1 (see FIG. 8B). For example, the pad electrode ELTP_1 may include a transparent conductive material such as indium tin oxide (ITO).

In FIG. 8D, the first electrode layer RMTLP_1 may exist, which overlaps with the first insulating layer INS1 while the first insulating layer INS1 partially covers the pad connection electrode ALEP_1. Alternatively, as shown in FIG. 8E, when a first insulating layer INS1_1 does not cover the pad connection electrode ALEP_2, the first electrode layer exposed by the first insulating layer INS1_1 may be removed in a process of forming the pixel electrode (see FIGS. 9D and 9E), and the pad connection electrode ALEP_2 may include only the second electrode layer CMTLP_1.

In one or more embodiments, a third insulating layer INS3 may be disposed on the second electrode layer CMTLP_1, and an opening or a contact part, which exposes the second electrode layer CMTLP_1, may be formed in the third insulating layer INS3. The pad electrode ELTP_1 may be in contact with the second electrode layer CMTLP_1 through the opening of the third insulating layer INS3. Because the pad electrode ELTP_1 is in contact with the second electrode CMTLP_1, contact resistance (and resistance-capacitance delay) between the pad electrode ELTP_1 and the pad connection electrode ALEP_2 can be decreased, and a failure caused by the contact resistance can be reduced or prevented.

FIGS. 9A-9G are sectional views illustrating one or more embodiments of the method of manufacturing the display device shown in FIG. 2. A section corresponding to FIGS. 8A, 8C, and 8D is illustrated in each of FIGS. 9A-9G. In each of FIGS. 9A-9G, the display device DD (see FIG. 2) is briefly illustrated based on the display layer DPL (see FIG. 8A).

First, FIGS. 2, 4, 6A, 8A, 8B, 8C, 8D, and 9A, first, second, and third patterns BNP1, BNP2, and BNP3 may be formed on a passivation layer PSV, and a first electrode layer and a second electrode layer may be sequentially formed or patterned on the first, second, and third patterns BNP1, BNP2, and BNP3 and the passivation layer PSV.

The positions at which first to fourth alignment electrodes ALE1_1 to ALE4_1, a first connection electrode ALE5_1, and first and second electrode layers RMTLP_1 and CMTLP_1 of a pad PAD_1 are disposed have been described with reference to FIGS. 4 and 8A, and therefore, overlapping descriptions will not be repeated.

Figure 9A:
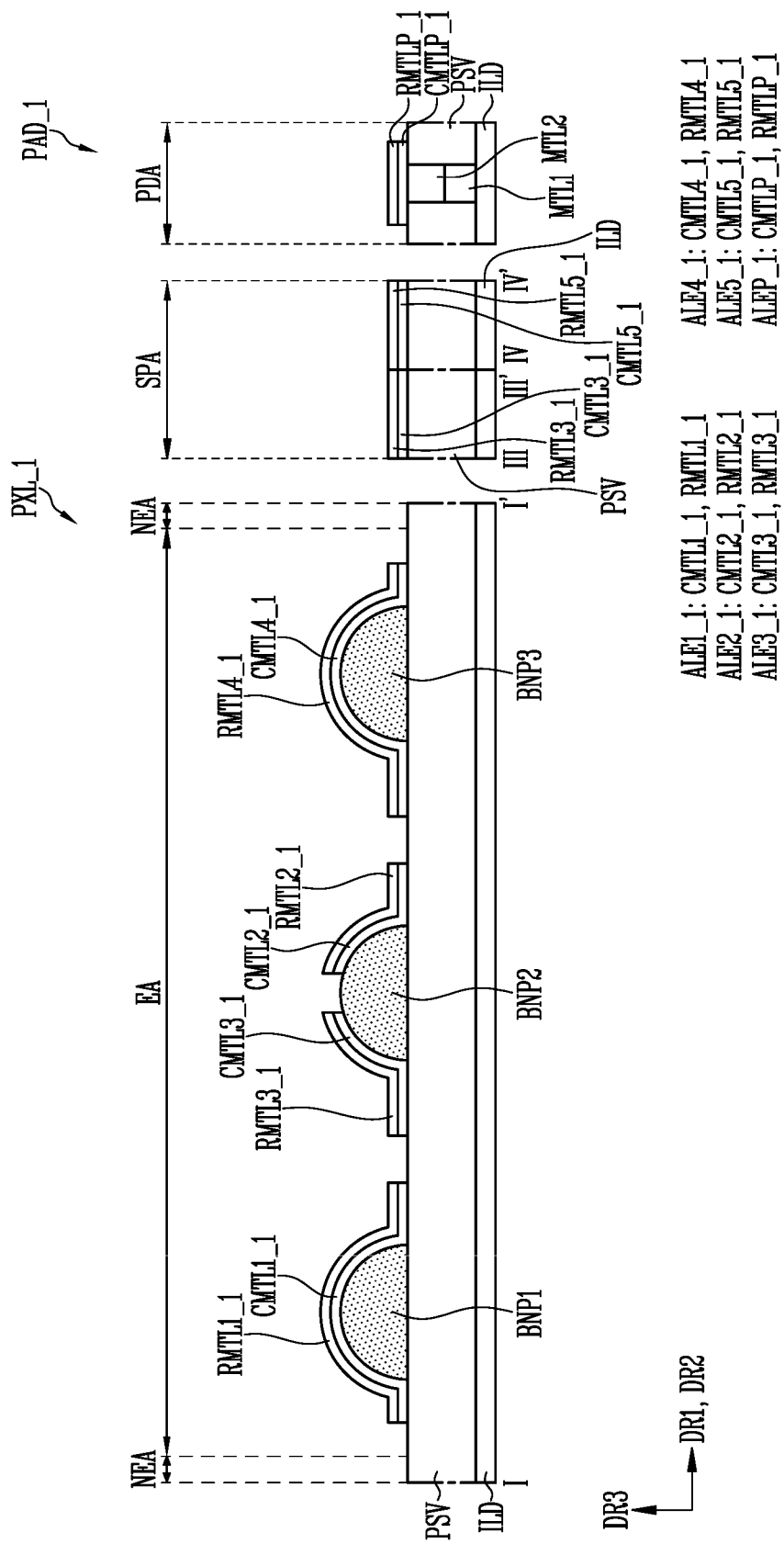
FIGS. 9A-9G are sectional views illustrating one or more embodiments of the method of manufacturing the display device shown in FIG. 2.
Figure 9B:
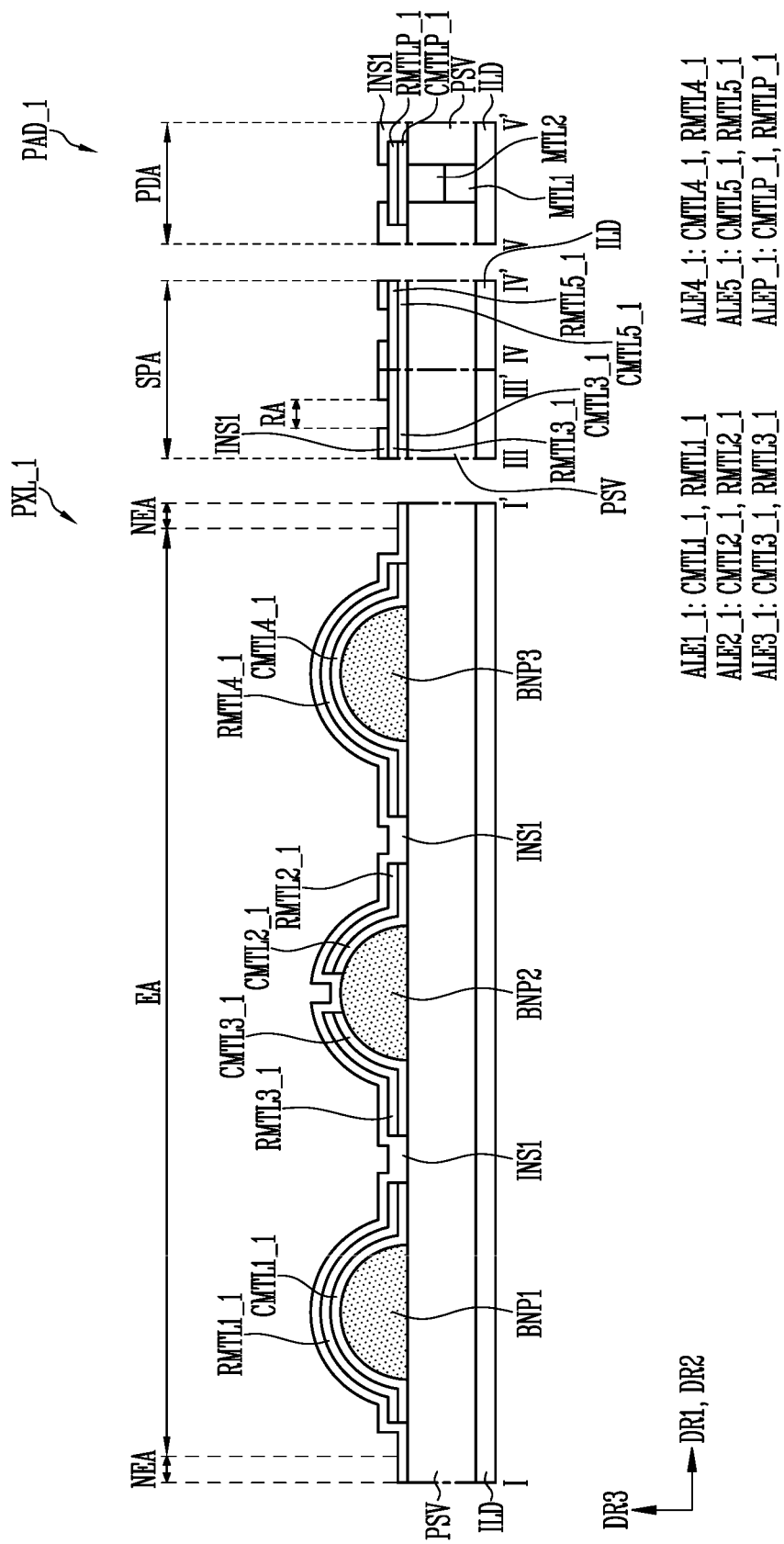

Subsequently, as shown in FIG. 9B, a first insulating layer INS1 may be formed or patterned between the first to third patterns BNP1 to BNP3 to cover the passivation layer PSV. The first insulating layer INS1 may be formed to entirely cover an emission area EA. In a separation area SPA, portions of the first insulating layer INS1, which correspond to a removal area RA and a contact part, may be removed. In a pad area PDA, a portion of the first insulating layer INS1, which corresponds to the contact part, may be removed.

Figure 9C:
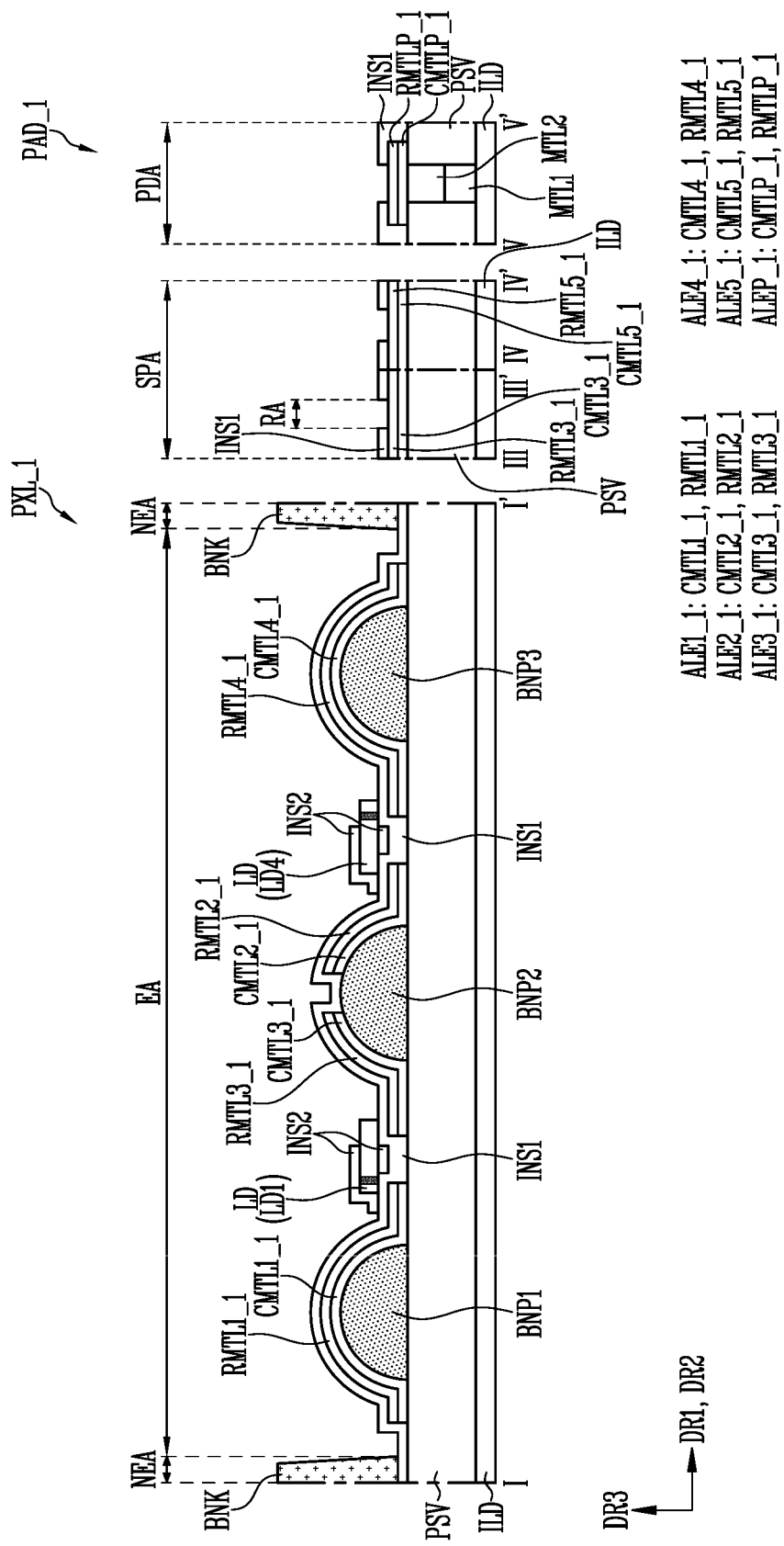

As shown in FIG. 9C, a bank BNK may be formed on the first insulating layer INS1 (or the passivation layer PSV), light emitting elements LD may be supplied and arranged on the first insulating layer INS1, and a second insulating layer INS2 may be formed or patterned on the light emitting elements LD.

The light emitting elements LD (e.g., first and fourth light emitting elements LD1 and LD4) may be arranged between the first and third alignment electrodes ALE1_1 and ALE3_1 and between the second and fourth alignment electrodes ALE2_1 and ALE4_1.

Figure 9D:
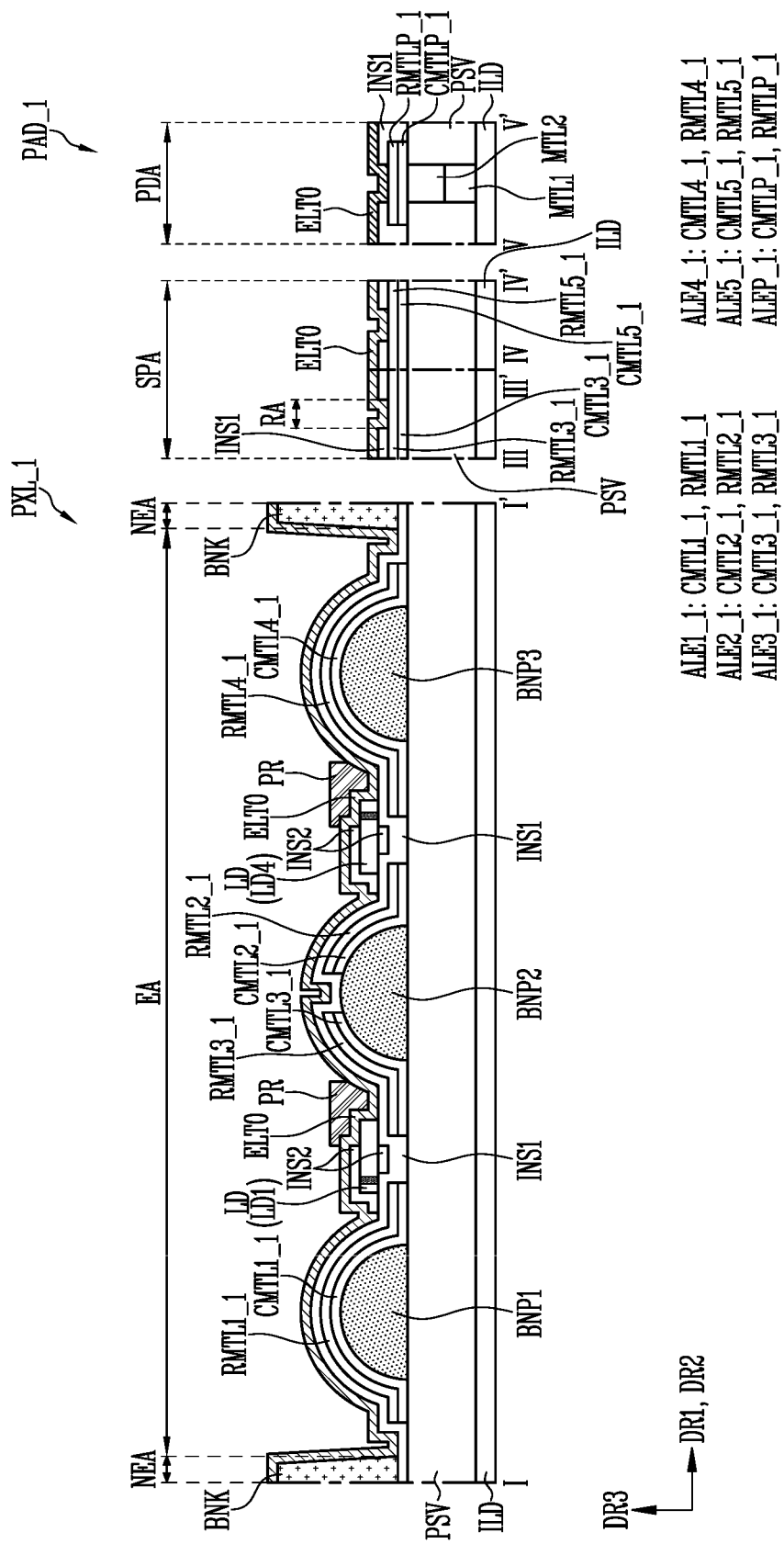
Figure 9E:
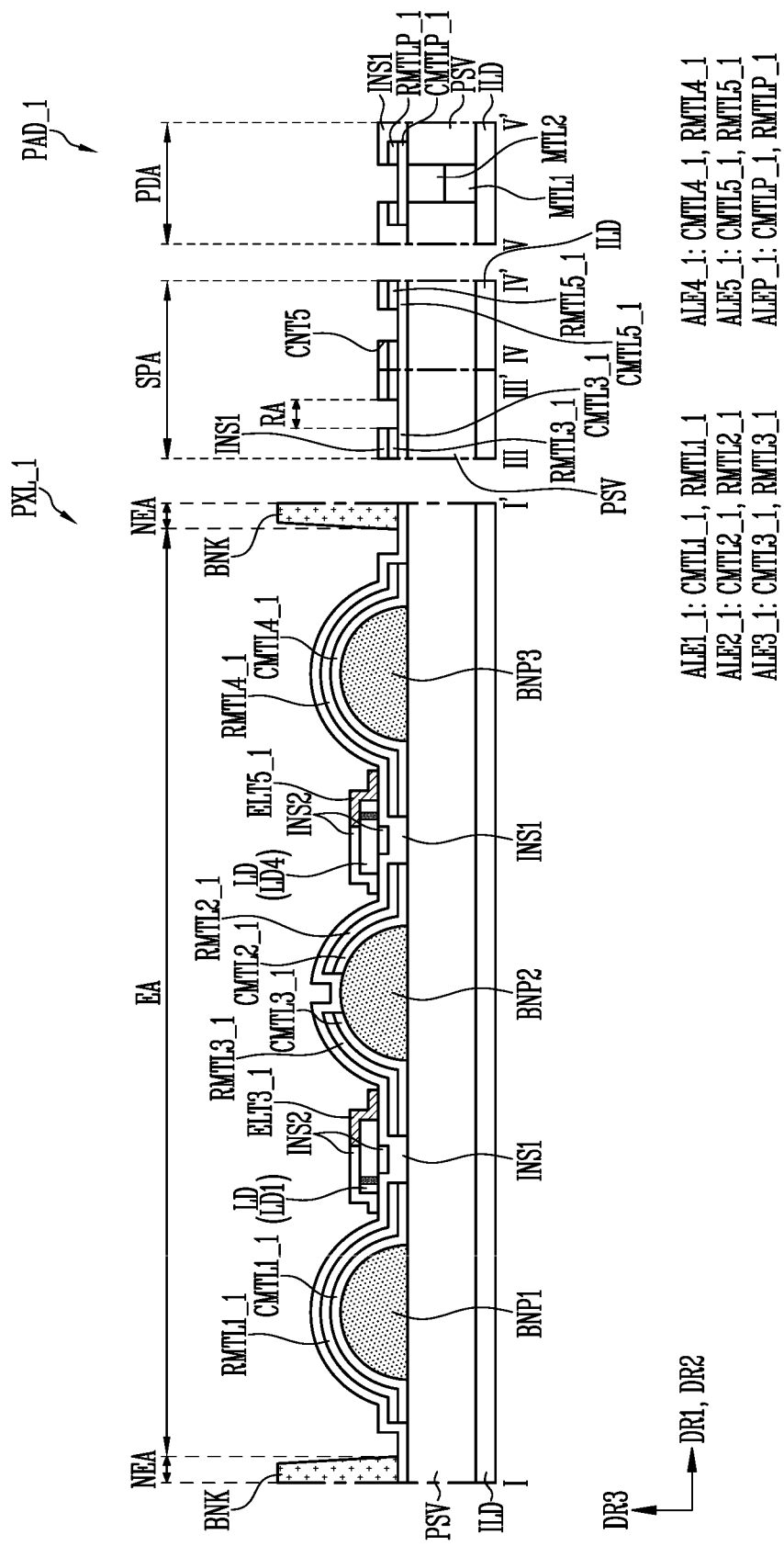

Subsequently, as shown in FIG. 9D, an electrode layer ELT0 may be entirely formed on the passivation layer PSV to cover the second insulating layer INS2, and a mask PR (or photoresist pattern) for forming a third pixel electrode ELT3_1 and a fifth pixel electrode ELT5_1, which are shown in FIG. 9E, may be formed on the electrode layer ELT0. In the separation area SPA and the pad area PDA, any separate mask may not be formed.

Subsequently, as shown in FIG. 9E, the third pixel electrode ELT3_1 and the fifth pixel electrode ELT5_1 may be formed by etching the electrode layer ELT0 with respect to the mask PR. In one or more embodiments, when a contact hole exposing the third alignment electrode ALE3_1 is formed in the first insulating layer INS1, the third pixel electrode ELT3_1 may be in contact with the third alignment electrode ALE3_1 through the contact hole. Similarly, the fifth pixel electrode ELT5_1 may be in contact with the fourth alignment electrode ALE4_1 through a contact hole.

In one or more embodiments, in the process of etching the electrode layer ELT0, a first electrode layer RMTL3_1 of the third alignment electrode ALE3_1 may be partially etched in the separation area SPA. Similarly, a fifth contact part CNT5 may be formed in a first electrode layer RMTL5_1 of the first connection electrode ALE5_1 by partially etching the first electrode layer RMTL5_1 of the first connection electrode ALE5_1. However, the present disclosure is not limited thereto.

In one or more embodiments, the electrode layer exposed to the outside may be stepwisely etched while undergoing development and cleansing processes for forming the first insulating layer INS1, the bank BNK, and the second insulating layer INS2. For example, in the separation area SPA, a portion of the first electrode layer RMTL3_1 of the third alignment electrode ALE3_1 (i.e., a portion corresponding to the removal area RA) may be stepwisely etched while undergoing the development and cleansing processes.

Similarly, the first electrode layer RMTL5_1 of the first connection electrode ALE5_1 (i.e., a portion corresponding to the fifth contact part CNT5) may be stepwisely etched while undergoing the development and cleansing processes. As shown in FIG. 9B, the first insulating layer INS1 may be substantially entirely disposed in the emission area EA such that the other electrode layers except the first electrode layer RMTL3_1 of the third alignment electrode ALE3_1 and the first electrode RMTL51 of the first connection electrode ALE5_1 are not etched.

Figure 9F:
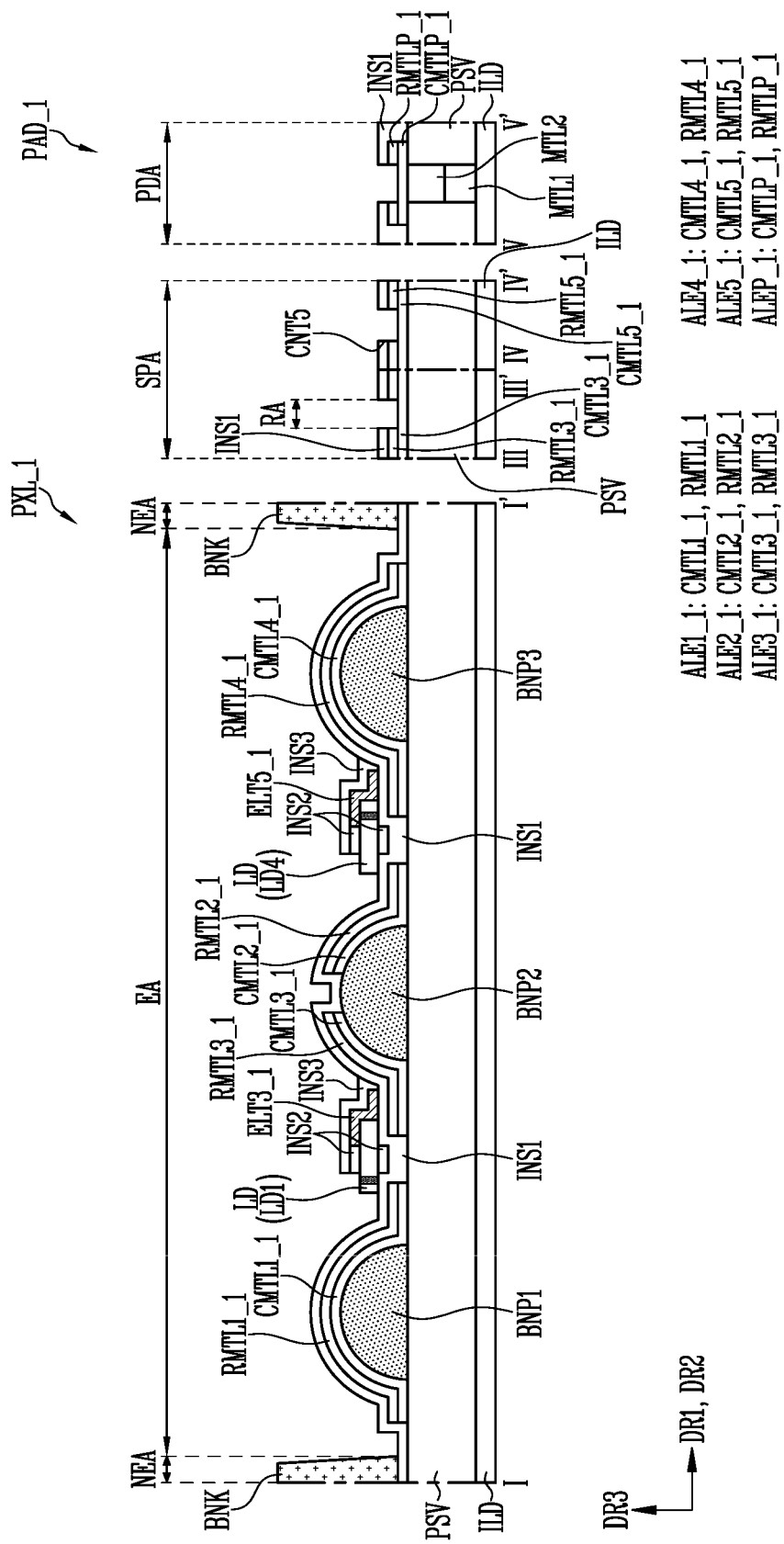

Subsequently, as shown in FIG. 9F, a third insulating layer INS3 may be formed to cover the third pixel electrode ELT3_1 and the fifth pixel electrode ELT5_1.

Figure 9G:
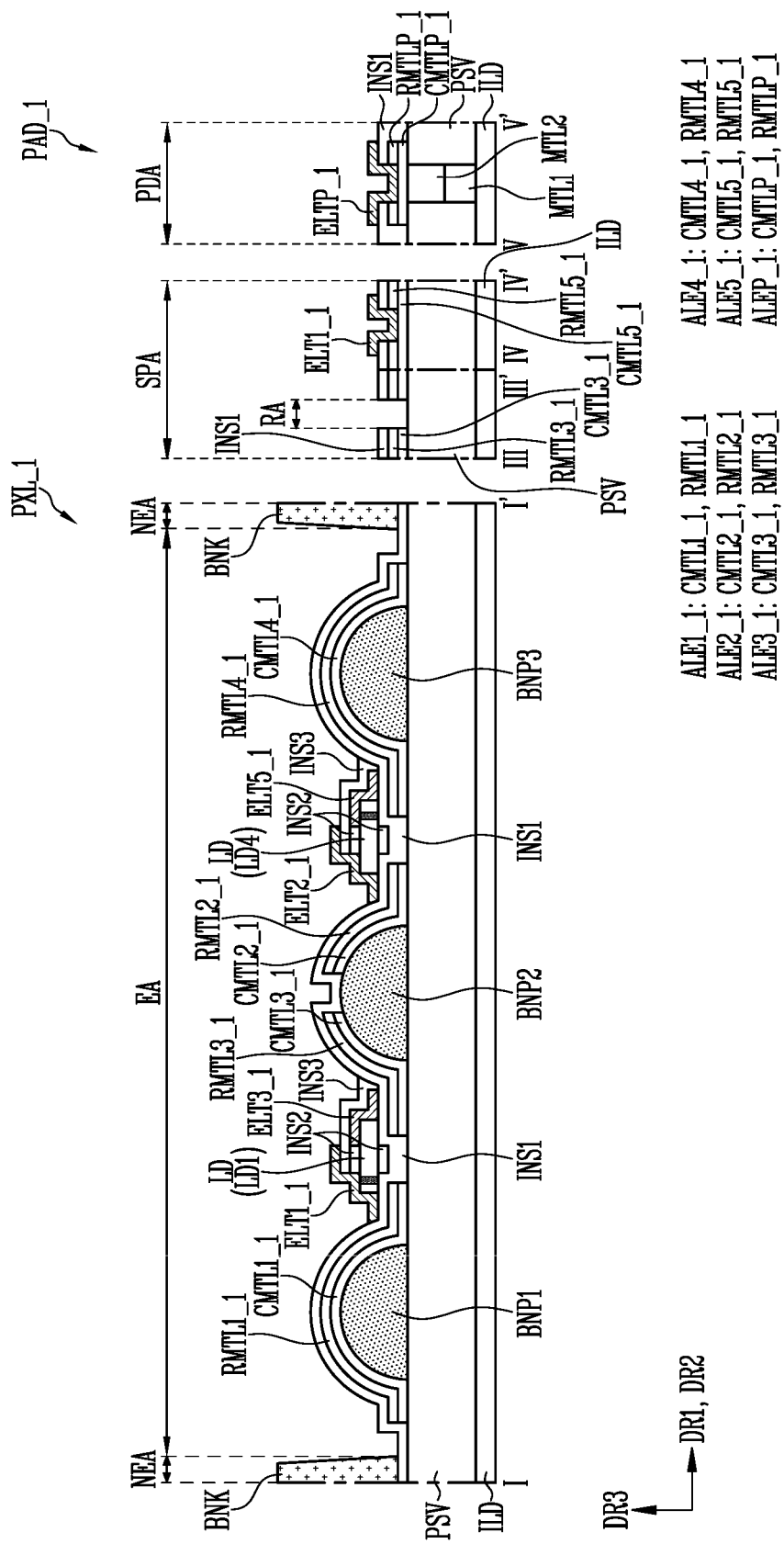

Subsequently, as shown in FIG. 9G, a first pixel electrode ELT1_1, a second pixel electrode ELT2_1 (and the fourth pixel electrode ELT4 (see FIG. 4), and a pad electrode ELTP_1 may be formed. Like the process described with reference to FIG. 9D, an electrode layer may be entirely formed on the passivation layer PSV, a mask corresponding to the first pixel electrode ELT1_1, the second pixel electrode ELT2_1, and the pad electrode ELTP_1 may be formed, and the first pixel electrode ELT1_1, the second pixel electrode ELT2_1, and the pad electrode ELTP_1 may be formed by etching the electrode layer, using the mask. As described above, the first pixel electrode ELT1_1 may be in contact with a top surface of a CMTL5_1 of the first connection electrode ALE5_1 and a side surface of the first electrode RMTL5_1 of the first connection electrode ALE5_1 through the fifth contact part CNT5, and contact resistance of the first pixel electrode ELT1_1 may be decreased. Similarly, the pad electrode ELTP_1 may be in contact with a top surface of a second electrode layer CMTLP_1 of the pad connection electrode ALEP_1 and a side surface of the first electrode layer RMTLP_1 of the pad connection electrode ALEP_1 through an opening (or contact hole) penetrating the first insulating layer INS1 and the first electrode layer RMTLP_1 of the pad connection electrode ALEP_1, and contact resistance of the pad electrode ELTP_1 may be decreased.

In one or more embodiments, in the process of etching the electrode layer to form the first pixel electrode ELT1_1, a second electrode layer CMTL3_1 of the third alignment electrode ALE3_1 in the removal area RA may be removed. As described with reference to FIG. 8C, the third alignment electrode ALE3_1 may be completely separated from a third alignment electrode ALE3_1 of an adjacent pixel PXL in the separation area SPA. That is, at the same time when the first pixel electrode ELT1_1 is formed, separation of the first to fourth alignment electrodes ALE1_1 to ALE4_1 may be made.

Figure 10A:
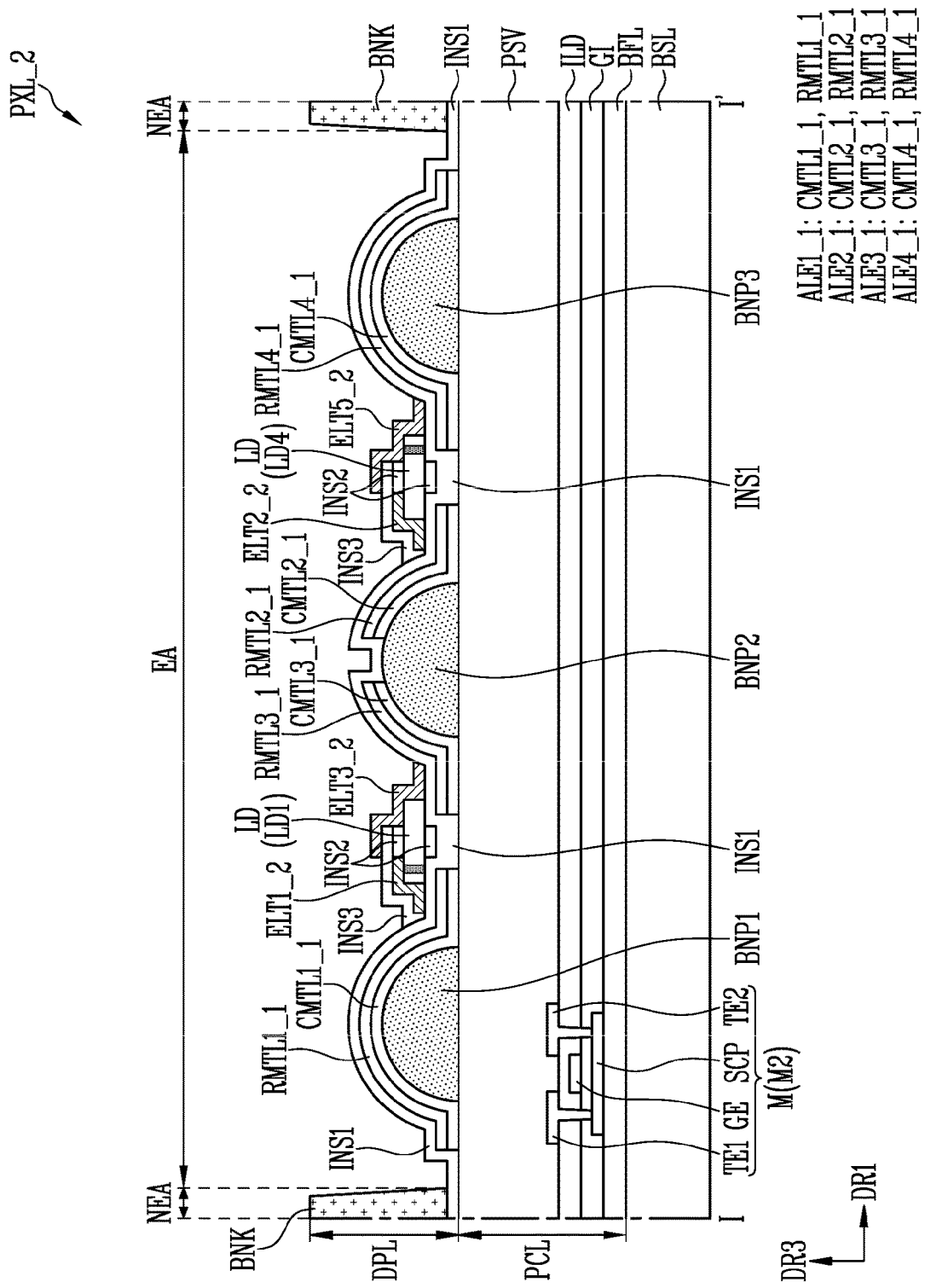
FIG. 10A is a sectional view illustrating one or more embodiments of the pixel taken along the line I-I' shown in FIG. 4.
Figure 10B:
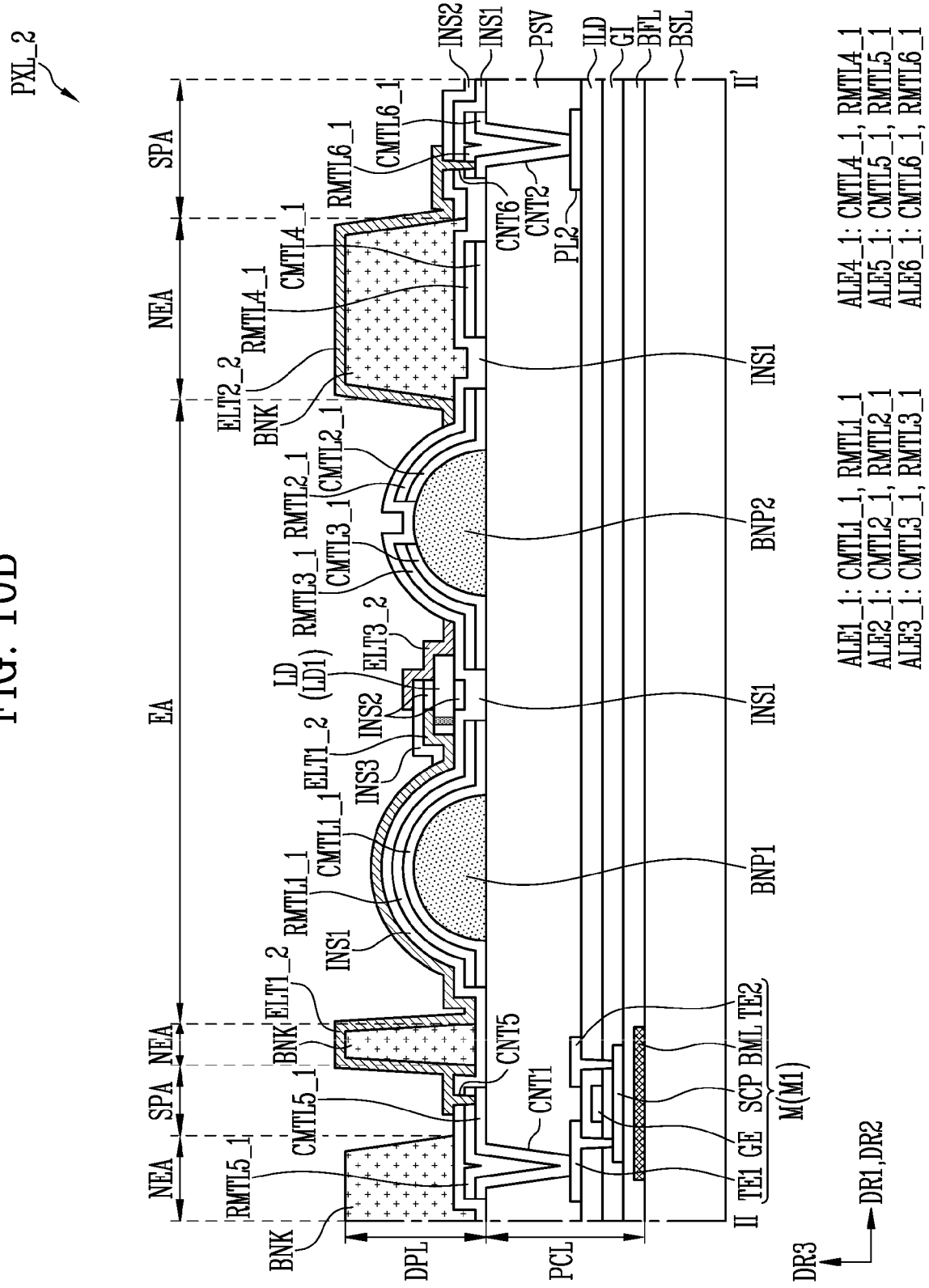
FIG. 10B is a sectional view illustrating one or more embodiments of the pixel taken along the line II-II' shown in FIG. 4.
Figure 10C:
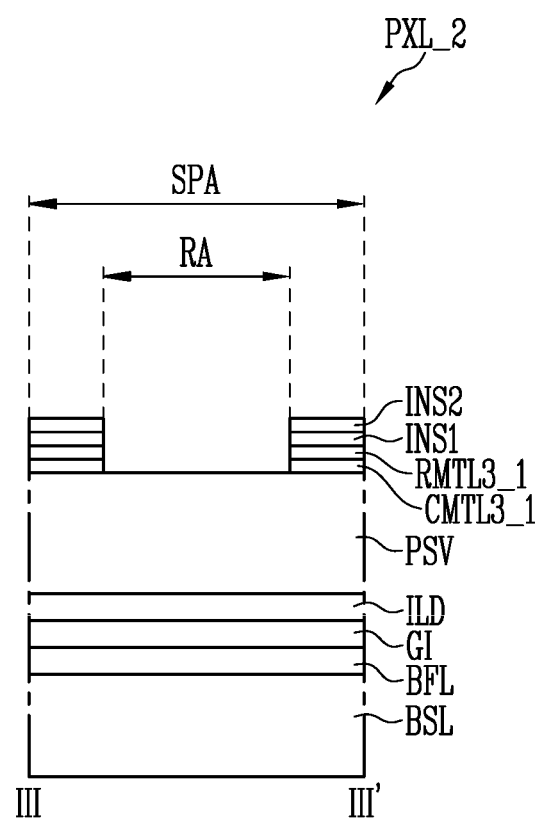
FIG. 10C is a sectional view illustrating one or more embodiments of the pixel taken along the line III-III' shown in FIG. 4.

FIG. 10A is a sectional view illustrating one or more embodiments of the pixel taken along the line I-I' shown in FIG. 4. A diagram corresponding to FIG. 8A is illustrated in FIG. 10A. FIG. 10B is a sectional view illustrating one or more embodiments of the pixel taken along the line II-II' shown in FIG. 4. A diagram corresponding to FIG. 8B is illustrated in FIG. 10B. FIG. 10C is a sectional view illustrating one or more embodiments of the pixel taken along the line III-III' shown in FIG. 4.

First, referring to FIGS. 2, 3A-3C, 4, 8A-8C, and 10A-10C, the pixel PXL_2 shown in FIGS. 10A-10C is substantially identical or similar to the pixel PXL_1 shown in FIGS. 8A-8C except first, second, third, fourth, and fifth pixel electrodes ELT1_2 to ELT5_2, and therefore, overlapping descriptions will not be repeated.

The first to fourth alignment electrodes ALE1_1 to ALE4_1 may be disposed on the top of the first to third patterns BNP1 to BNP3. The first and second connection electrodes ALE5_1 and ALE6_1 may be formed through the same process as the first to fourth alignment electrodes ALE1_1 to ALE4_1.

The first and second connection electrodes ALE5_1 and ALE6_1 and the first to fourth alignment electrodes ALE1_1 to ALE4_1 may include second electrode layers CMTL1_1 to CMTL6_1 and first electrode layers RMTL1_1 to RMTL6_1, which are sequentially stacked. The first electrode layers RMTL1_1 to RMTL6_1 may have a relatively high reflectivity, and the second electrode layers CMTL1_1 to CMTL6_1 may have a relatively high electrical conductivity. For example, the first electrode layers RMTL1_1 to RMTL6_1 may include aluminum (Al), and the second electrode layers CMTL1_1 to CMTL6_1 may include molybdenum (Mo).

A fifth contact part CNT5 exposing a second electrode layer CMTL5_1 of the first connection electrode ALE5_1 may be formed in a first electrode layer RMTL5_1 of the first connection electrode ALE5_1. As shown in FIG. 10B, the first pixel electrode ELT1_2 may be in contact with a top surface of the second electrode layer CMTL5_1 of the first connection electrode ALE5_1 through the fifth contact part CNT5, and may be in contact with a side surface of the first electrode layer RMTL5_1 of the first connection electrode ALE5_1.

Similarly, a sixth contact part CNT6 exposing a second electrode layer CMTL6_1 of the second connection electrode ALE6_1 may be formed in a first electrode layer RMTL6_1 of the second connection electrode ALE6_1. As shown in FIG. 10B, the second pixel electrode ELT2_2 may be in contact with a top surface of the second electrode layer CMTL6_1 of the second connection electrode ALE6_1 through the sixth contact part CNT6, and may be in contact with a side surface of the first electrode layer RMTL6_1 of the second connection electrode ALE6_1.

A first insulating layer INS1 may be disposed over the first and second connection electrodes ALE5_1 and ALE6_1 and the alignment electrodes ALE. A bank BNK may be disposed on the first insulating layer INS1.

Light emitting elements LD on the first insulating layer INS1 may be disposed in an area between the first and second patterns BNP1 and BNP2 and an area between the second and third patterns BNP2 and BNP3. A second insulating layer INS2 may be disposed on one area of each of the light emitting elements LD.

The first pixel electrode ELT1_2 may be disposed on a first end portion of a first light emitting element LD1 and the first connection electrode ALE5_1. The first pixel electrode ELT1_2 may electrically connect the first end portion of the first light emitting element LD1 and the first connection electrode ALE5_1 to each other.

The second pixel electrode ELT2_2 may be disposed on a second end portion of a fourth light emitting element LD4 and the second connection electrode ALE6_1. The second pixel electrode ELT2_2 may electrically connect the second end portion of the fourth light emitting element LD4 and the second connection electrode ALE6_1 to each other.

A third insulating layer INS3 may be disposed on the first pixel electrode ELT1_2 and the second pixel electrode ELT2_2 (and the fourth electrode ELT4 (see FIG. 4)). The third insulating layer INS3 may cover the first pixel electrode ELT1_2 and the second pixel electrode ELT2_2, and prevent the first pixel electrode ELT1_2 and the second pixel electrode ELT2_2 from being directly connected to the third pixel electrode ELT3_2 and the fifth pixel electrode ELT5_2 (i.e., may prevent occurrence of a short circuit).

As shown in FIG. 10C, the third insulating layer INS3 may not be disposed in the separation area SPA, but the present disclosure is not limited thereto. For example, as shown in FIG. 5C, the third insulating layer INS3 may be disposed in the separation area SPA.

The third pixel electrode ELT3_2 and the fifth pixel electrode ELT5_2 may be disposed on the third insulating layer INS3.

The third pixel electrode ELT3_2 may be disposed on a second end portion of the first light emitting element LD1, and may be in contact with the second end portion of the first light emitting element LD1. Also, as described with reference to FIG. 4, the third pixel electrode ELT3_2 may be disposed on a first end portion of a second light emitting element LD2, and may be in contact with the first end portion of the second light emitting element LD2. That is, the third pixel electrode ELT3_2 may electrically connect the second end portion of the first light emitting element LD1 and the first end portion of the second light emitting element LD2 to each other.

The fifth pixel electrode ELT5_2 may be disposed on a first end portion of the fourth light emitting element LD4, and may be in contact with the first end portion of the fourth light emitting element LD4. Also, as described with reference to FIG. 4, the fifth pixel electrode ELT5_2 may be disposed on a second end portion of a third light emitting element LD3, and may be in contact with the second end portion of the third light emitting element LD3. That is, the fifth pixel electrode ELT5_2 may electrically connect the second end portion of the third light emitting element LD3 and the first end portion of the fourth light emitting element LD4 to each other.

In FIGS. 8A-8C, the first pixel electrode ELT1_1 and the second pixel electrode ELT2_1, which are disposed on the third insulating layer INS3, may be in contact with the first connection electrode ALE5_1 and the second connection electrode ALE6_1 through the fifth contact part CNT5 and the sixth contact part CNT6. In FIGS. 10A-10C, the first pixel electrode ELT1_2 and the second pixel electrode ELT2_2, which are disposed on the bottom of the third insulating layer INS3, may be in contact with the first connection electrode ALE5_1 and the second connection electrode ALE6_1 through the fifth contact part CNT5 and the sixth contact part CNT6.

Figure 10D:
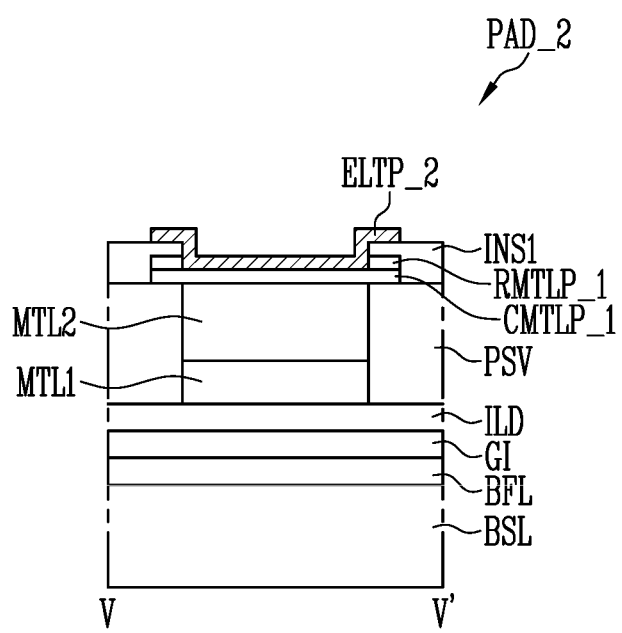
FIG. 10D is a sectional view illustrating one or more embodiments of the pad taken along the line V-V' shown in FIG. 6A.

FIG. 10D is a sectional view illustrating one or more embodiments of the pad taken along the line V-V' shown in FIG. 6A. A diagram corresponding to FIG. 8D is illustrated in FIG. 10D.

Referring to FIGS. 8D and 10D, the pad PAD_2 shown in FIG. 10D is substantially identical or similar to the pad PAD_1 shown in FIG. 8D except a pad electrode ELTP_2, and therefore, overlapping descriptions will not be repeated.

The pad PAD_2 may include a pad connection electrode ALEP_1 and the pad electrode ELTP_2. The pad connection electrode ALEP_1 may include a second electrode layer CMTLP_1 and a first electrode layer RMTLP_1, which are sequentially stacked.

The second electrode layer CMTLP_1 may be disposed on the passivation layer PSV and the second metal layer MTL2, the first electrode layer RMTLP_1 may be disposed on the second electrode layer CMTLP_1, and the pad electrode ELTP_2 may be disposed on the first insulating layer INS1 and the pad connection electrode ALEP_1.

The first electrode layer RMTLP_1 may be formed through the same process as the first electrode layer RMTL5_1 of the first connection electrode ALE5_1 (see FIG. 10B). For example, the first electrode layer RMTLP_1 may include aluminum (Al). The second electrode layer CMTLP_1 may be formed through the same process as the second electrode layer CMTL5_1 of the first connection electrode ALE5_1. For example, the second electrode CMTLP_1 may include molybdenum (Mo).

The pad electrode ELTP_2 may be formed through the same process as the first pixel ELT1_2 (see FIG. 10B). For example, the pad electrode ELTP_2 may include a transparent conductive material such as indium tin oxide (ITO).

Similarly to the fifth contact part CNT5 described with reference to FIG. 10B, an opening or a contact part, which exposes the second electrode layer CMTLP_1, may be formed in the first electrode layer RMTLP_1. As shown in FIG. 10D, the pad electrode ELTP_2 may be in contact with a top surface of the second electrode layer CMTLP_1 through the opening (or the contact part), and may be in contact with a side surface of the first electrode layer RMTLP_1.

FIGS. 11A-11E are sectional views illustrating one or more embodiments of the method of manufacturing the display device shown in FIG. 2. A section corresponding to FIGS. 10A-10D is illustrated in each of FIGS. 11A-11E. In each of FIGS. 11A-11E, the display device DD (see FIG. 2) is briefly illustrated based on the display layer DPL (see FIG. 10A).

First, referring to FIGS. 2, 4, 6A, 9A, 9B, 10A-10D, and 11A, first, second, and third patterns BNP1, BNP2, and BNP3 may be formed on a passivation layer PSV, and a first electrode layer and a second electrode layer may be sequentially formed or patterned on the first, second, and third patterns BNP1, BNP2, and BNP3 and the passivation layer PSV. The positions at which first to fourth alignment electrodes ALE1_1 to ALE4_1, a first connection electrode ALE5_1, and first and second electrode layers RMTLP_1 and CMTLP_1 of a pad PAD_2 are disposed have been described with reference to FIGS. 4 and 10A, and therefore, overlapping descriptions will not be repeated.

A first insulating layer INS1 may be formed or patterned between the first to third patterns BNP1 to BNP3 to cover the passivation layer PSV. The first insulating layer INS1 may be formed to entirely cover an emission area EA. In a separation area SPA, portions of the first insulating layer INS1, which correspond to a removal area RA and a contact part, may be removed. In a pad area PDA, a portion of the first insulating layer INS1, which corresponds to the contact part, may be removed.

In one or more embodiments, in the process of removing the portion of the first insulating layer INS1, first electrode layers RMTL3_1, RMTL5_1, and RMTLP_1 exposed by the first insulating layer INS1 (i.e., the removal area RA and the contact part in the separation area SPA, and a portion corresponding to the contact part in the pad area PDA) may be partially removed. For example, the first electrode layers RMTL3_1, RMTL5_1, and RMTLP_1 exposed by a chemical solution or gas, used for etching of the first insulating layer INS1, may be partially removed. Also, the first electrode layers RMTL3_1, RMTL5_1, and RMTLP_1 exposed by the first insulating layer INS1 in a cleansing process after etching (e.g., by an organic cleansing liquid) may be partially removed.

Figure 11A:
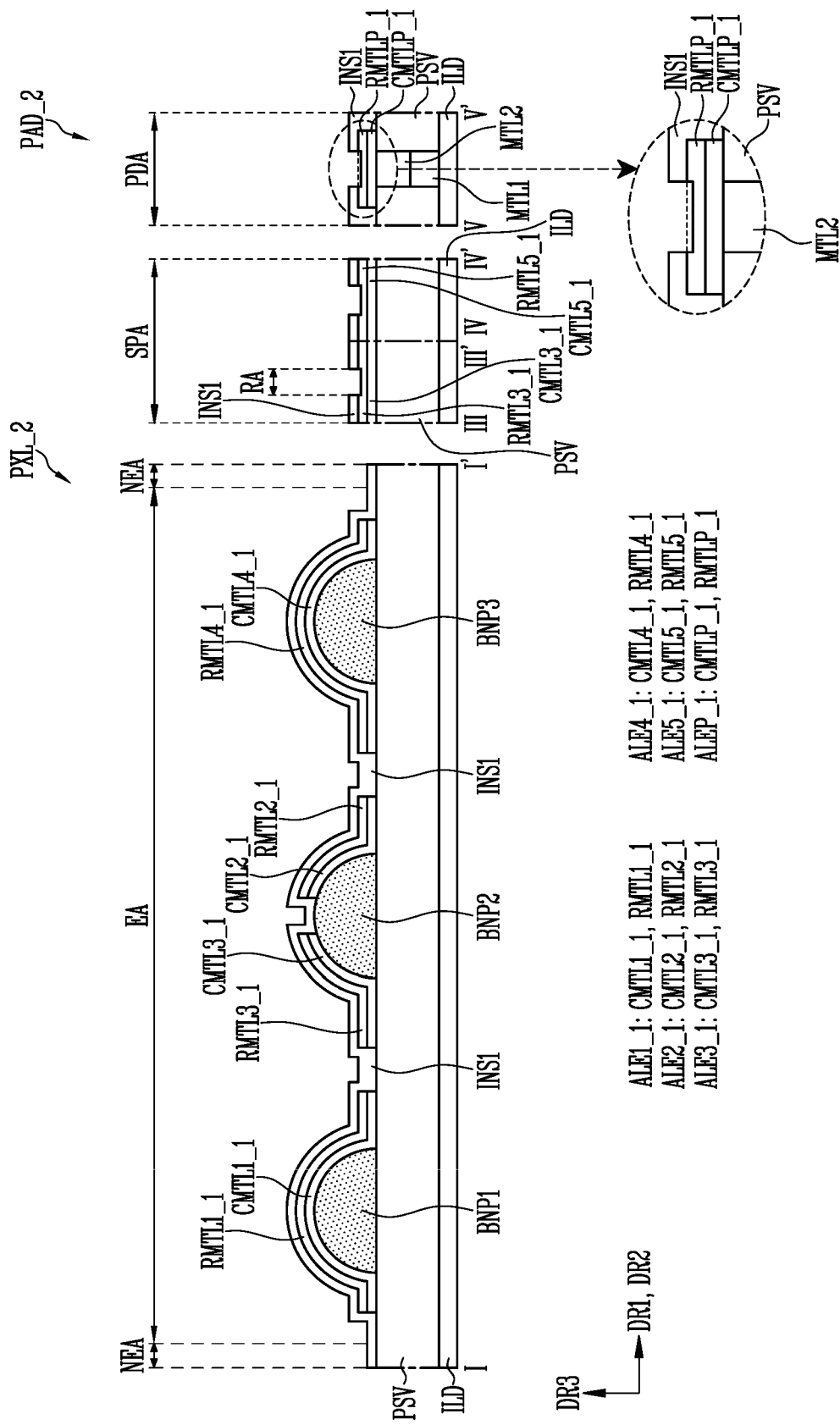
FIGS. 11A-11E are sectional views illustrating one or more embodiments of the method of manufacturing the display device shown in FIG. 2.
Figure 11B:
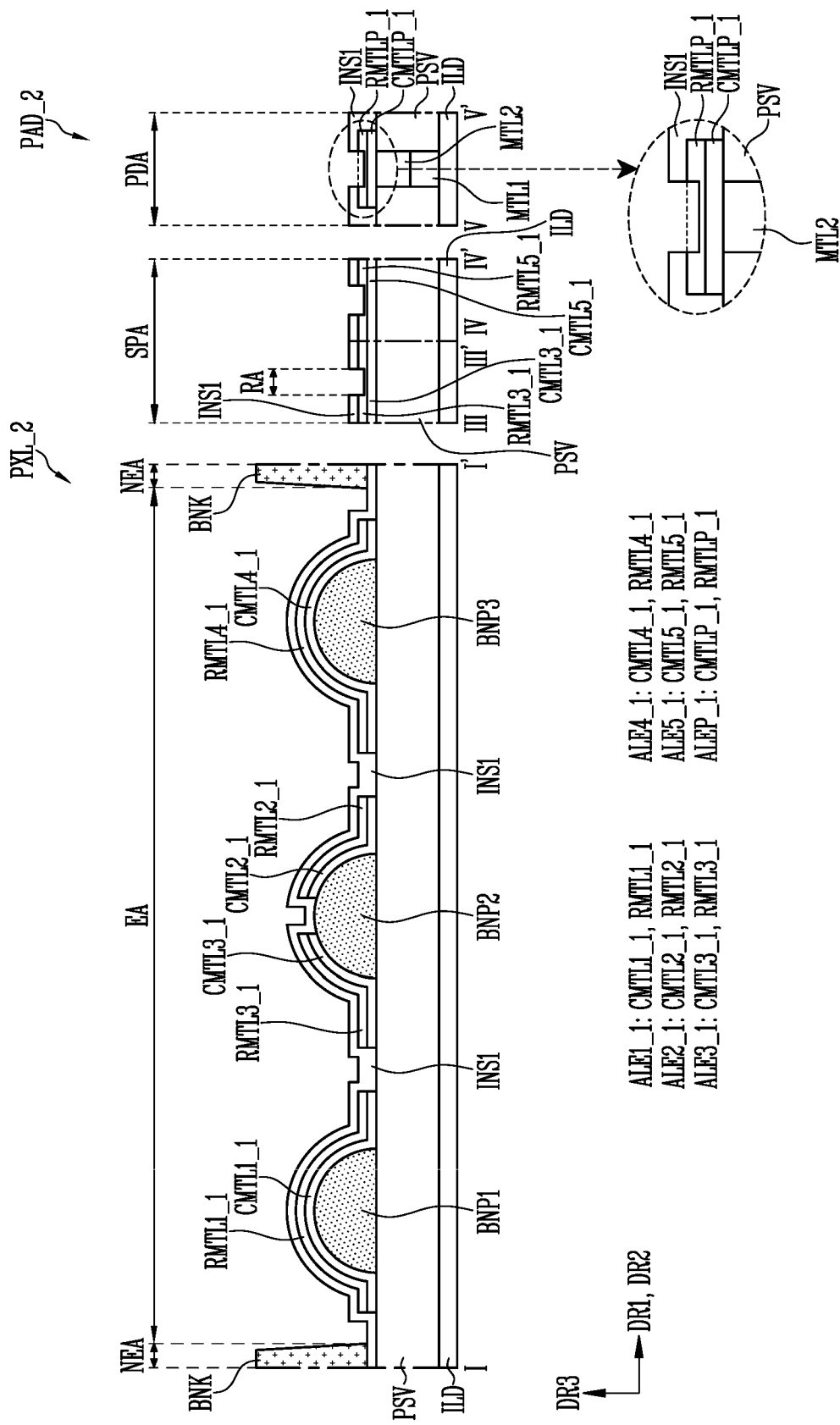

Subsequently, as shown in FIG. 11B, a bank BNK may be formed on the first insulating layer INS1 (or the passivation layer PSV).

In one or more embodiments, similarly to the process of removing the portion of the first insulating layer INS1, the first electrode layers RMTL3_1, RMTL5_1, and RMTLP_1 exposed by the first insulating layer INS1 may be partially exposed in the process of forming the bank BNK.

Figure 11C:
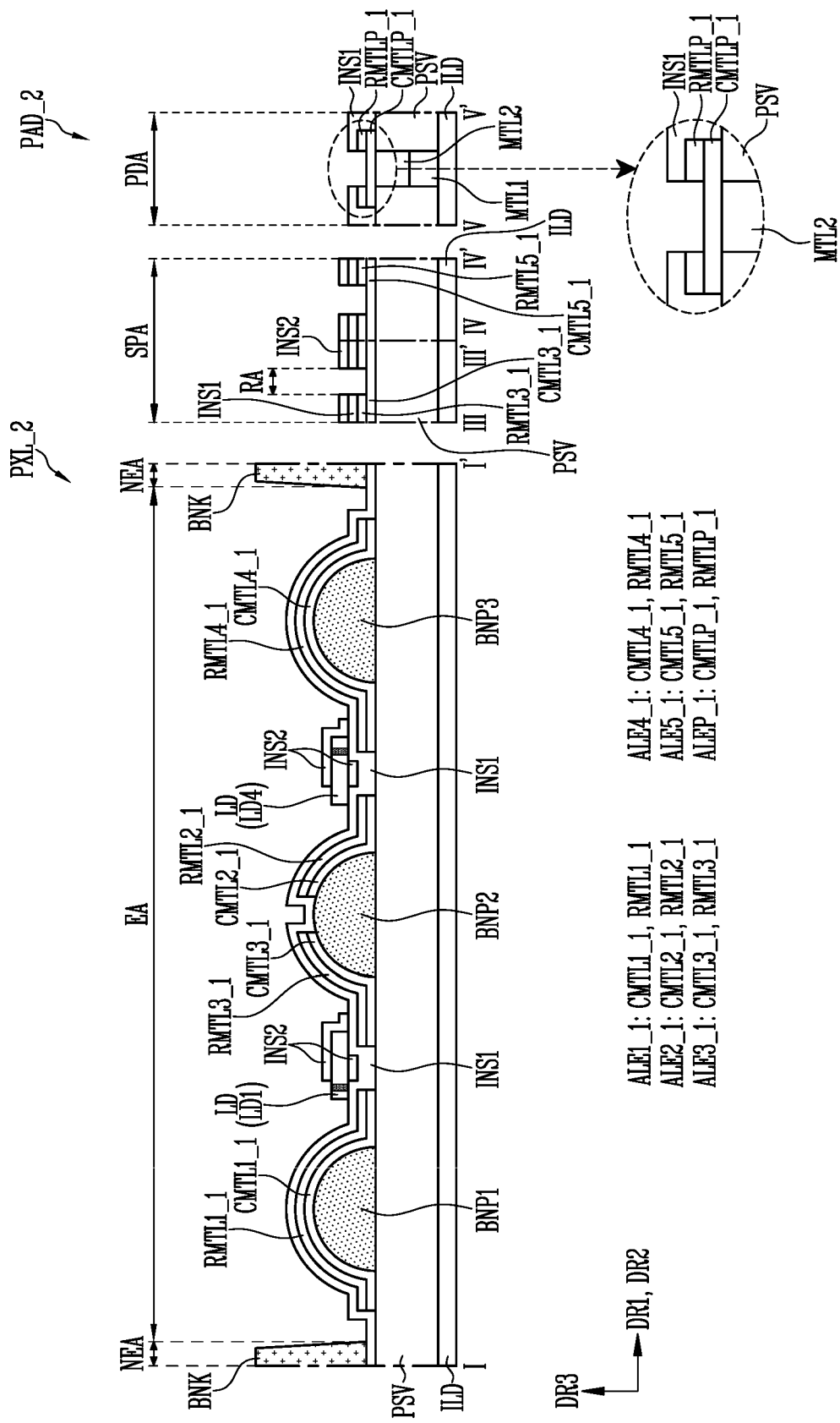

Subsequently, as shown in FIG. 11C, light emitting elements LD may be supplied and arranged on the first insulating layer INS1, and a second insulating layer INS2 may be formed or patterned on the light emitting elements LD.

In one or more embodiments, similarly to the process of removing the portion of the first insulating layer INS1, the first electrode layers RMTL3_1, RMTL5_1, and RMTLP_1 exposed by the second insulating layer INS2 (and the first insulating layer INS1) may be partially removed in the process of patterning the second insulating layer INS2.

In one or more embodiments, the first electrode layers RMTL3_1, RMTL5_1, and RMTLP_1 exposed by the first insulating layer INS1 (and the second insulating layer INS2) may be stepwisely removed while undergoing development and cleansing processes for forming the first insulating layer INS1, the bank BNK, and the second insulating layer INS2, and a contact part or an opening, which exposes second electrode layers CMTL3_1, CMTL5_1, and CMTLP_1, may be formed in the first electrode layers RMTL3_1, RMTL5_1, and RMTLP_1. For example, in the separation area SPA, a portion of the first electrode layer RMTL3_1 of the third alignment electrode ALE3_1 (i.e., a portion corresponding to the removal area RA) may be stepwisely etched while undergoing the development and cleansing processes. Similarly, the first electrode layer RMTL5_1 of the first connection electrode ALE5_1 (i.e., a portion corresponding to the fifth contact part CNT5) may be stepwisely etched while undergoing the development and cleansing processes.

Figure 11D:
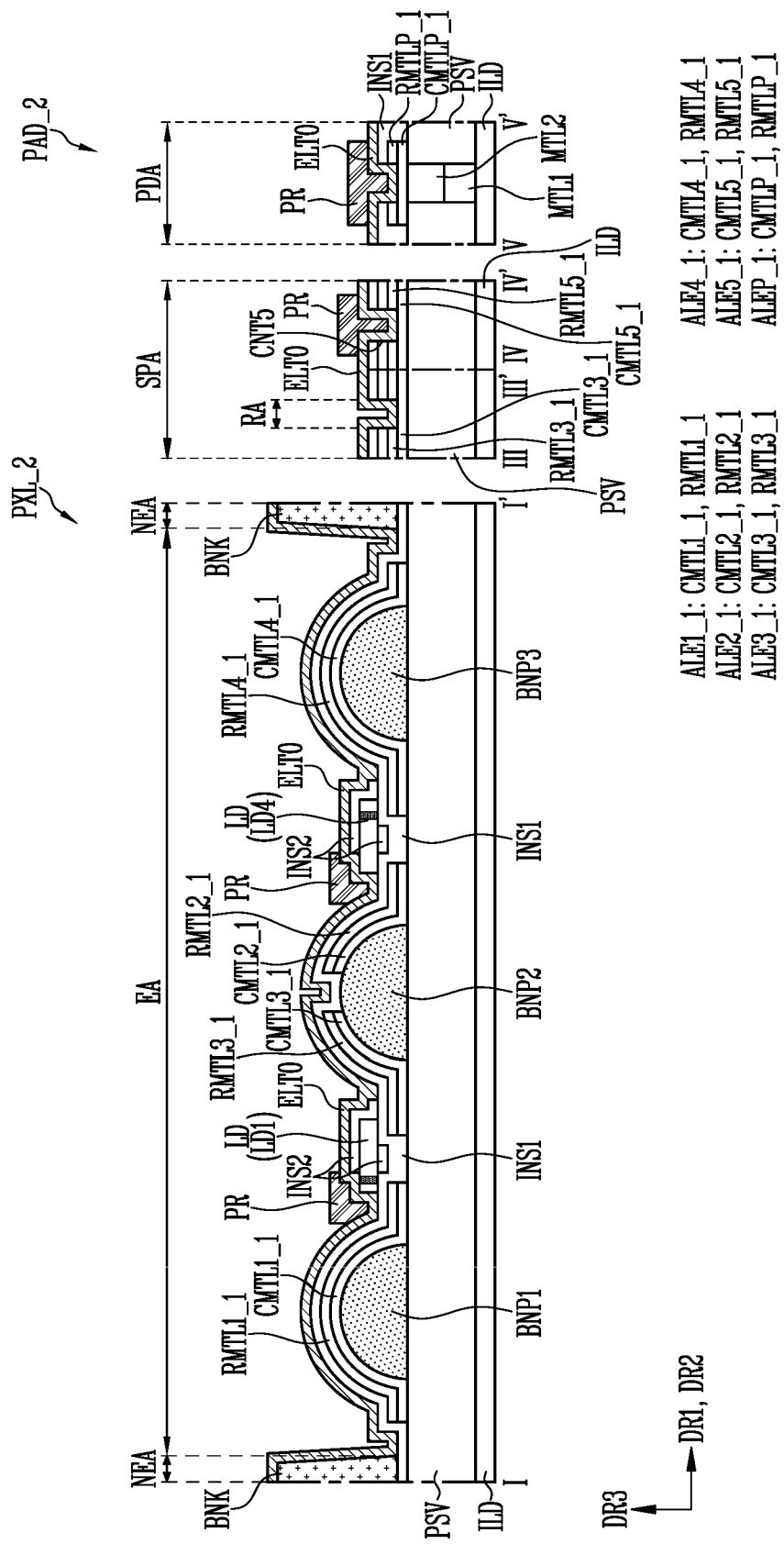

Subsequently, as shown in FIG. 11D, an electrode layer ELT0 may be entirely formed on the passivation layer PSV to cover the second insulating layer INS2, and a mask PR (or photoresist pattern) for forming a first pixel electrode ELT1_2 and a second pixel electrode ELT2_2 (and the fourth pixel electrode ELT4 (see FIG. 4)), which are shown in FIG. 10E, may be formed on the electrode layer ELT0. In the separation area SPA, any separate mask may not be formed.

Figure 11E:
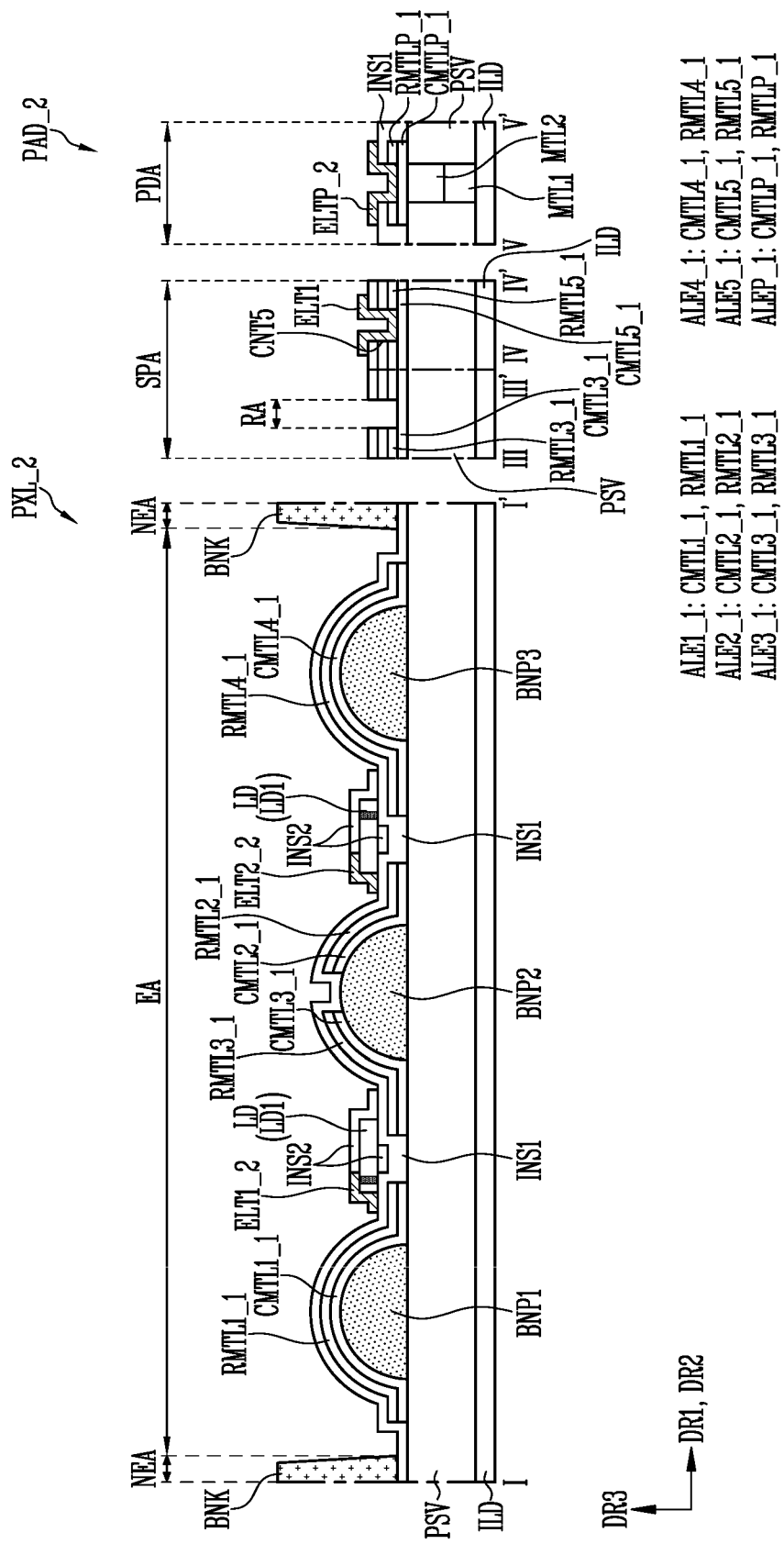

Subsequently, as shown in FIG. 11E, the first pixel electrode ELT1_2 and the second pixel electrode ELT2_2 may be formed by etching the electrode layer ELT0 with respect to the mask PR.

Subsequently, as described with reference to FIG. 7F, a third insulating layer INS3 may be formed to cover the first pixel electrode ELT1_2 and the second pixel electrode ELT2_2. Subsequently, as described with reference to FIG. 7G, a third pixel electrode ELT3_2 and a fifth pixel electrode ELT5_2 may be formed on the third insulating layer INS3, and accordingly, the pixel PXL_2 shown in FIGS. 10A-10C and the pad PAD_2 shown in FIG. 10D may be formed.

As described above, the first electrode layers RMTL3_1, RMTL5_1, and RMTLP_1 exposed by the first insulating layer INS1 (and the second insulating layer INS2) are removed through the development and cleansing processes for forming the first insulating layer INS1, the bank BNK, and the second insulating layer INS2. Thus, as shown in FIG. 10B, the first pixel electrode ELT1_2 and the second pixel electrode ELT2_2, which are disposed on the bottom of the third insulating layer INS3, can be in contact with the first connection electrode ALE5_1 and the second connection electrode ALE6_1 through the fifth contact part CNT5 and the sixth contact part CNT6. In addition, as shown in FIG. 10D, the pad electrode ELTP_2 formed through the same process as the first pixel electrode ELT1_2 can be in contact with the top surface of the second electrode layer CMTLP_1 and the side surface of the first electrode layer RMTLP_1.

In accordance with the present disclosure, each of alignment electrodes and a connection electrode has a multi-layered structure including a first electrode layer and a second electrode layer, which are sequentially stacked, and a pixel electrode is connected to a transistor (or power line) through the connection electrode. The pixel electrode is in contact with a first electrode layer and a second electrode layer (i.e., a side surface of the second electrode layer) of the connection electrode through a contact part (or contact hole) formed in the second electrode layer. One of the first electrode layer and the second electrode layer has a relatively high electrical conductivity (or conductivity), and the first and second electrode layers is in direct contact with the pixel electrode through the contact part. Thus, contact resistance and resistance-capacitance between the pixel electrode and the connection electrode can be decreased.

In addition, the other one of the first electrode layer and the second electrode layer has a relatively high reflectivity, and light emitted from a light emitting element is reflected toward the front of the display device by the other one of the first electrode layer and the second electrode layer. Thus, the ratio of light which is emitted from the light emitting element and then advances toward the front of the display device, i.e., the light emission rate of a pixel can be maintained as a desired ratio (e.g., a predetermined ratio).

One or more embodiments have been disclosed herein, and although specific terms are employed, they are used and are to be interpreted in a generic and descriptive sense only and not for purpose of limitation. In one or more instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A display device comprising:
   an emission area and a non-emission area around the emission area;
   a first pattern and a second pattern spaced from each other in the emission area;
   a first light emitting element located between the first pattern and the second pattern;
   a first alignment electrode located on the first pattern, the first alignment electrode having a first inclined surface opposing a first end portion of the first light emitting element;
   a first connection electrode at a same layer as the first alignment electrode;
   a first electrode electrically connected to the first end portion of the first light emitting element;
   a second electrode electrically connected to a second end portion of the first light emitting element; and
   a bank located at the non-emission area, the bank defining the emission area,
   wherein each of the first alignment electrode and the first connection electrode comprises a first electrode layer and a second electrode layer disposed directly on the first electrode layer,
   wherein a contact hole exposing the first electrode layer is in the second electrode layer of the first connection electrode, and
   wherein the first electrode is in contact with the first electrode layer of the first connection electrode and a side surface of the second electrode layer of the first connection electrode through the contact hole.

2. The display device of claim 1, wherein the first electrode is electrically connected to a transistor or a power line through the first connection electrode.

3. The display device of claim 1, wherein a reflectivity of the first electrode layer is higher than a reflectivity of the second electrode layer, and
   wherein an electrical conductivity of the second electrode layer is higher than an electrical conductivity of the first electrode layer.

4. The display device of claim 3, wherein the first electrode layer comprises aluminum, and the second electrode layer comprises molybdenum.

5. The display device of claim 3, wherein, at the first inclined surface of the first alignment electrode, the first electrode layer is exposed by the second electrode layer.

6. The display device of claim 5, further comprising a first insulating layer between the first alignment electrode and the first electrode at a location overlapping with the first light emitting element in a thickness direction of the display device,
   wherein, on the first pattern, a side surface of the first insulating layer is located at a same plane as a side surface of the second electrode layer of the first alignment electrode.

7. The display device of claim 3, further comprising a second alignment electrode located on the second pattern, the second alignment electrode having a second inclined surface opposing the second end portion of the first light emitting element.

8. The display device of claim 1, further comprising a separation area spaced from the emission area with the non-emission area interposed therebetween,
   wherein the separation area is defined by the bank, and
   wherein the first connection electrode is located in the separation area.

9. The display device of claim 1, wherein the second electrode is disposed at a layer different from that of the first electrode with an insulating layer interposed therebetween.

10. The display device of claim 1, further comprising:
    a second light emitting element located between the first pattern and the second pattern;
    a third electrode located between the first electrode and the second electrode, the third electrode being electrically connected between the first and second electrodes through the first and second light emitting elements; and
    a third alignment electrode overlapping with one area of the second pattern.

11. The display device of claim 10, further comprising:
    a third pattern opposing the first pattern with the second pattern interposed therebetween;
    a fourth alignment electrode located on the third pattern;
    a third light emitting element and a fourth light emitting element, each of the third light emitting element and the fourth light emitting element being located between the second pattern and the third pattern;
    a fourth electrode electrically connected between the second and third electrodes; and
    a fifth electrode electrically connected between the second and fourth electrodes.

12. The display device of claim 1, further comprising:
a display area and a non-display area around the display area; and
a pad located in the non-display area,
wherein the display area includes the emission area and the non-emission area,
wherein the pad comprises a third connection electrode formed through a same process as the first alignment electrode and a pad electrode formed through a same process as the first electrode,
wherein an opening exposing a first electrode layer of the third connection electrode is located at a second electrode layer of the third connection electrode, and
wherein the pad electrode is in contact with the first electrode layer of the third connection electrode and a side surface of the second electrode layer of the third connection electrode through the opening.

13. The display device of claim 1, wherein a reflectivity of the second electrode layer is higher than a reflectivity of the first electrode layer, and
wherein an electrical conductivity of the first electrode layer is higher than an electrical conductivity of the second electrode layer.

14. The display device of claim 13, wherein the second electrode layer comprises aluminum, and the first electrode layer comprises molybdenum.

15. A method of manufacturing a display device, the method comprising:
forming a first pattern and a second pattern on a base layer;
forming a first alignment electrode overlapping with the first pattern, a second alignment electrode overlapping with the second pattern, and a first connection electrode, wherein each of the first alignment electrode, the second alignment electrode, and the first connection electrode comprises a first electrode layer and a second electrode layer formed directly on the first electrode layer;
forming a first insulating layer over the first alignment electrode, the second alignment electrode, and the first connection electrode;
aligning a first light emitting element on the first insulating layer between the first pattern and the second pattern;
forming a second insulating pattern partially overlapping with the first light emitting element;
forming a first electrode electrically connected to a first end portion of the first light emitting element; and
forming a second electrode electrically connected to a second end portion of the first light emitting element,
wherein the forming of the second insulating pattern comprises:
forming a second insulating layer; and
forming the second insulating pattern and a contact hole of the second electrode layer by partially etching the second insulating layer and the second electrode layer of the first connection electrode, and
wherein the first electrode is in contact with the first electrode layer of the first connection electrode and a side surface of the second electrode layer of the first connection electrode through the contact hole.

16. The method of claim 15, wherein a reflectivity of the first electrode layer is higher than a reflectivity of the second electrode layer, and
wherein an electrical conductivity of the second electrode layer is higher than an electrical conductivity of the first electrode layer.

17. The method of claim 16, wherein the first electrode layer comprises aluminum, and the second electrode layer comprises molybdenum.

18. The method of claim 16, wherein the forming of the second insulating pattern comprises:
forming the second insulating layer covering the first light emitting element; and
collectively etching the first insulating layer, the second insulating layer, and the second electrode layer of the first alignment electrode.

19. The method of claim 18, wherein, at a first inclined surface of the first alignment electrode opposing the first end portion of the first light emitting element, the first electrode layer is exposed by the second electrode layer.

20. A method of manufacturing a display device, the method comprising:
forming a first pattern and a second pattern on a base layer;
forming a first alignment electrode overlapping with the first pattern, a second alignment electrode overlapping with the second pattern, and a first connection electrode, wherein each of the first alignment electrode, the second alignment electrode, and the first connection electrode comprises a first electrode layer and a second electrode layer directly on the first electrode layer;
forming a first insulating pattern between the first alignment electrode and the second alignment electrode;
aligning a first light emitting element on the first insulating pattern between the first pattern and the second pattern;
forming a second insulating pattern partially overlapping with the first light emitting element;
forming a second electrode electrically connected to a second end portion of the first light emitting element; and
forming a first electrode electrically connected to a first end portion of the first light emitting element,
wherein the forming of the second electrode comprises:
forming an electrode layer; and
forming a contact hole of the second electrode layer of the first connection electrode by partially etching the electrode layer and the second electrode layer of the first connection electrode, and
wherein the first electrode is in contact with the first electrode layer of the first connection electrode and a side surface of the second electrode layer of the first connection electrode through the contact hole.

\* \* \* \* \*